(12) United States Patent
Myer et al.

(10) Patent No.: US 8,588,830 B2
(45) Date of Patent: Nov. 19, 2013

(54) WIRELESS AUTONOMOUS SOLAR-POWERED OUTDOOR LIGHTING AND ENERGY AND INFORMATION MANAGEMENT NETWORK

(75) Inventors: Seth Jamison Myer, Meridan, ID (US); Paul H. Cooperrider, Garden City, ID (US); David Gonzalez, Boise, ID (US)

(73) Assignee: Inovus Solar, Inc, Boise, ID (US)

( * ) Notice: Subject to any disclaimer, the term of this patent is extended or adjusted under 35 U.S.C. 154(b) by 1054 days.

(21) Appl. No.: 12/533,701

(22) Filed: Jul. 31, 2009

(65) Prior Publication Data
US 2010/0029268 A1 Feb. 4, 2010

Related U.S. Application Data

(63) Continuation-in-part of application No. 12/025,737, filed on Feb. 4, 2008, now Pat. No. 7,731,383.

(60) Provisional application No. 61/190,192, filed on Aug. 27, 2008, provisional application No. 61/137,437, filed on Jul. 31, 2008, provisional application No. 61/137,434, filed on Jul. 31, 2008, provisional application No. 61/137,433, filed on Jul. 31, 2008, provisional application No. 60/888,002, filed on Feb. 2, 2007.

(51) Int. Cl.
*H04B 7/00* (2006.01)

(52) U.S. Cl.
USPC .......................................................... 455/507

(58) Field of Classification Search
USPC .......................................................... 455/507
See application file for complete search history.

(56) References Cited

U.S. PATENT DOCUMENTS

| 4,043,834 A | 8/1977 | Rusch |
| 4,062,371 A | 12/1977 | Bolen |

(Continued)

FOREIGN PATENT DOCUMENTS

| EP | 2131630 A2 | 12/2009 |
| KR | 100852505 B1 | 8/2008 |

(Continued)

OTHER PUBLICATIONS

PCT International Search Report and the Written Opinion, PCT/US2011/060073, Jul. 31, 2012, Applicant: Inovus Solar, Inc. et al.

(Continued)

*Primary Examiner* — Yuwen Pan
*Assistant Examiner* — Ankur Jain
(74) *Attorney, Agent, or Firm* — Pedersen and Company, PLLC; Ken J. Pedersen; Barbara S. Pedersen

(57) ABSTRACT

An array of outdoor lighting operates mainly in independent mode wherein sensing, communication, and control processes take place between the various lights of the array. Additional communication and control may occur between the array and a control station by means of a master/coordinating node that transmits and receives signals to the control station via call phone and/or satellite. The system may be tied to the internet for dissemination of data and/or data analysis gathered by means of the multiple poles/devices of the array. The independent-array and/or the master-to-station network and communications may be adapted for energy-saving processes; power-receiving from or power-providing to the grid, renewable power production and storage by means of solar panels and/or wind turbines and associated batteries or other storage equipment; and/or to Wi-Fi hot-spots, public safety alarms, information, or advertising to the public or information/data-analysis to customers. Preferred members of the array have solar-panel-powered lights, which may charge batteries and optionally supply energy to an electrical grid. In arrays cooperating with the grid, the grid may optionally charge the batteries of the array during off-peak hours. The preferred lights include LED modules that may be aimed to establish desired light patterns.

14 Claims, 34 Drawing Sheets

(56) References Cited

U.S. PATENT DOCUMENTS

| | | | |
|---|---|---|---|
| 4,200,904 A * | 4/1980 | Doan | 362/183 |
| 4,224,082 A | 9/1980 | Jacobson | |
| 4,281,369 A | 7/1981 | Batte | |
| 4,384,317 A | 5/1983 | Stackpole | |
| 4,404,472 A | 9/1983 | Steigerwald | |
| 4,486,820 A | 12/1984 | Baba et al. | |
| 4,718,185 A | 1/1988 | Conlin | |
| 4,827,645 A | 5/1989 | Stamps, Jr. | |
| 4,841,416 A | 6/1989 | Doss | |
| 4,945,280 A | 7/1990 | Beghelli | |
| D309,789 S | 8/1990 | Luce | |
| 5,121,307 A | 6/1992 | Moore | |
| 5,149,188 A | 9/1992 | Robbins | |
| 5,217,296 A | 6/1993 | Tanner et al. | |
| 5,471,201 A | 11/1995 | Cerami et al. | |
| 5,637,964 A | 6/1997 | Hakkarainen et al. | |
| 5,660,643 A | 8/1997 | Toggweiler | |
| 6,037,758 A | 3/2000 | Perez | |
| 6,060,658 A | 5/2000 | Yoshida et al. | |
| 6,211,627 B1 | 4/2001 | Callahan | |
| 6,305,602 B1 | 10/2001 | Grabowski et al. | |
| 6,437,692 B1 | 8/2002 | Petite et al. | |
| 6,502,044 B1 | 12/2002 | Lane et al. | |
| 6,784,357 B1 | 8/2004 | Wang | |
| 6,930,237 B2 | 8/2005 | Mattiuzzo | |
| 6,988,809 B2 | 1/2006 | Rabinowitz | |
| 6,990,394 B2 | 1/2006 | Pasternak | |
| D517,233 S | 3/2006 | Doppelt | |
| 7,052,924 B2 | 5/2006 | Daniels et al. | |
| D529,655 S | 10/2006 | Allsop et al. | |
| 7,202,613 B2 | 4/2007 | Morgan et al. | |
| 7,301,457 B2 | 11/2007 | Houston | |
| 7,529,594 B2 | 5/2009 | Walters et al. | |
| 7,546,167 B2 | 6/2009 | Walters et al. | |
| 7,546,168 B2 | 6/2009 | Walters et al. | |
| 7,576,545 B2 | 8/2009 | Singh et al. | |
| 7,731,383 B2 | 6/2010 | Myer et al. | |
| 7,911,359 B2 | 3/2011 | Walters et al. | |
| 8,010,319 B2 * | 8/2011 | Walters et al. | 702/183 |
| 8,029,154 B2 | 10/2011 | Myer | |
| 2005/0001564 A1 | 1/2005 | Pan | |
| 2005/0039787 A1 | 2/2005 | Bing | |
| 2006/0002110 A1 | 1/2006 | Dowling et al. | |
| 2006/0137736 A1 | 6/2006 | Nishitani et al. | |
| 2006/0221826 A1 * | 10/2006 | Bedingfield et al. | 370/229 |
| 2007/0032990 A1 | 2/2007 | Williams et al. | |
| 2007/0085702 A1 | 4/2007 | Walters et al. | |
| 2007/0117017 A1 | 5/2007 | Sugiyama et al. | |
| 2007/0145915 A1 | 6/2007 | Roberge et al. | |
| 2007/0159836 A1 | 7/2007 | Huang et al. | |
| 2007/0253208 A1 | 11/2007 | Howard et al. | |
| 2008/0080174 A1 | 4/2008 | Xu | |
| 2008/0137327 A1 | 6/2008 | Hodulik | |
| 2008/0143554 A1 | 6/2008 | Green et al. | |
| 2008/0247155 A1 | 10/2008 | Allsop et al. | |
| 2010/0198420 A1 | 8/2010 | Rettger et al. | |
| 2010/0201267 A1 | 8/2010 | Bourquin et al. | |
| 2010/0263660 A1 | 10/2010 | Thorne | |
| 2010/0292815 A1 | 11/2010 | Pan | |
| 2010/0293045 A1 | 11/2010 | Burns et al. | |
| 2011/0068624 A1 | 3/2011 | Dibachi et al. | |
| 2012/0080944 A1 * | 4/2012 | Recker et al. | 307/25 |

FOREIGN PATENT DOCUMENTS

| | | |
|---|---|---|
| KR | 100956173 B1 | 5/2010 |
| WO | WO2004023849 A1 | 3/2004 |
| WO | WO2010014925 | 2/2010 |
| WO | WO2010050993 A1 | 5/2010 |
| WO | WO2010057138 A2 | 5/2010 |

OTHER PUBLICATIONS

Schmid, Small Power Photovoltaic Systems, Photovoltaic Solar Energy Conference, Oct. 27-31, 1986, pp. 113-220.

PCT International Search Report and the Written Opinion, PCT/US08/82301, Dec. 24, 2008. Applicant: Meyer.

Lighting Technology and Trends, and Transcription of text along with slide 16 and 17, Source Cooper Lighting Center, 2006, 19 pages.

PCT Search Report and the Written Opinion, PCT/US2009/064659, Jul. 5, 2010, Applicant: Inovus Solar, Inc. et al.

PCT Search Report and the Written Opinion, PCT/US2009/052443, Mar. 26, 2010, Applicant: Ming Solar, Inc. et al.

* cited by examiner

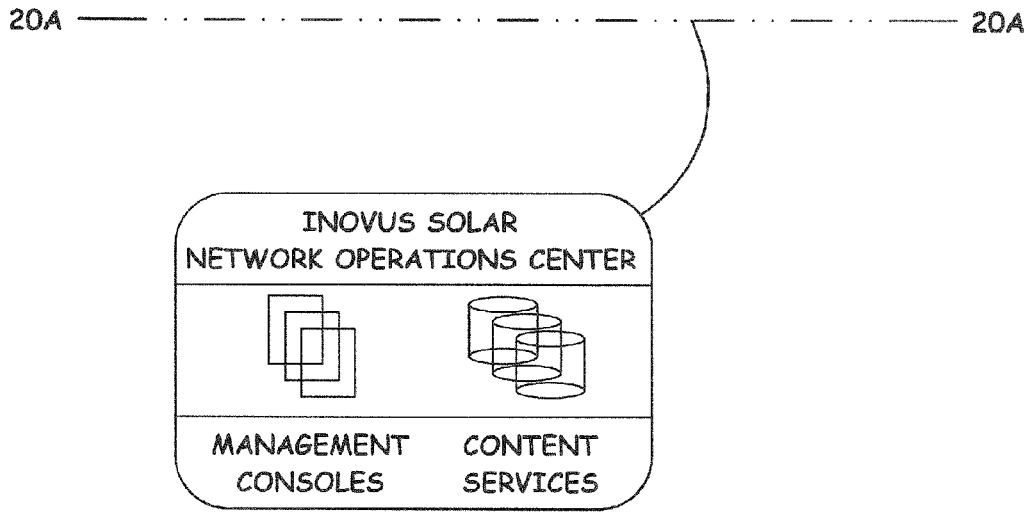

STEP 1: THE MESH COORDINATOR, POLE "C", INDICATES A CHANNEL ENERGY SCAN.

STEP 2: ENERGY LEVELS ARE DETECTED ON ALL 16 CHANNELS; CHANNELS WITH EXCESSIVE ENERGY/NOISE ARE REMOVED FROM CONSIDERATION.

STEP 3: ON EACH REMAINING CHANNEL, A COORDINATOR SCAN IS PERFORMED LOOKING FOR OTHER ACTIVE MESH COORDINATORS.

STEP 4: NO OTHER MESH COORDINATORS ARE FOUND, SO POLE "C" FORMS A NEW MESH, SENDS BEACONS TO ALL NODES WITHIN RANGE CAUSING ROUTING TABLES TO BE FORMED, THEN OPTIMIZED OVER TIME.

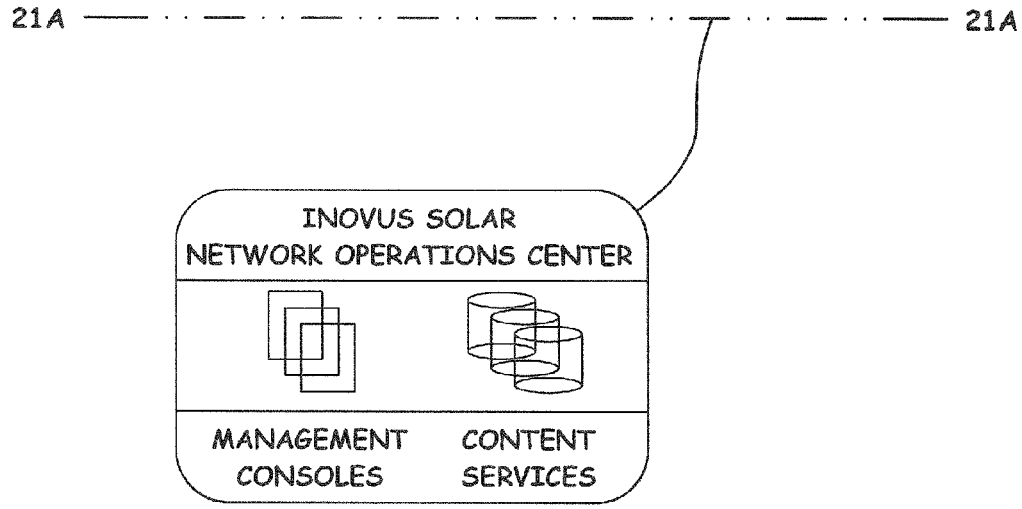

STEP 1: POLE "C" INITIATES THE SEQUENCE TO CREATE THE MESH, THEN BEHAVES LIKE ANY OTHER END NODE.

STEP 2: POLE "A" RAISES AN EVENT FOR THE NOC.

STEP 3: POLE "B" MAINTAINS THE BEST CONNECTION WITH POLE "A" BUT IT FAILS, SO POLE "A" TRIES A NEW ROUTE.

STEP 4: POLE "E" IS REACHABLE AND KNOWS HOW TO REACH THE NOC COORDINATOR THROUGH POLE "G" SO THE ROUTE GETS ADJUSTED AND A NEW OPTIMAL ROUTE DEFINED.

STEP 5: NOC COORDINATOR USES ITS ZIGBEE-TO-CELLULAR GATEWAY TO FORWARD THE EVENT TO THE NOC.

*Fig. 21B*

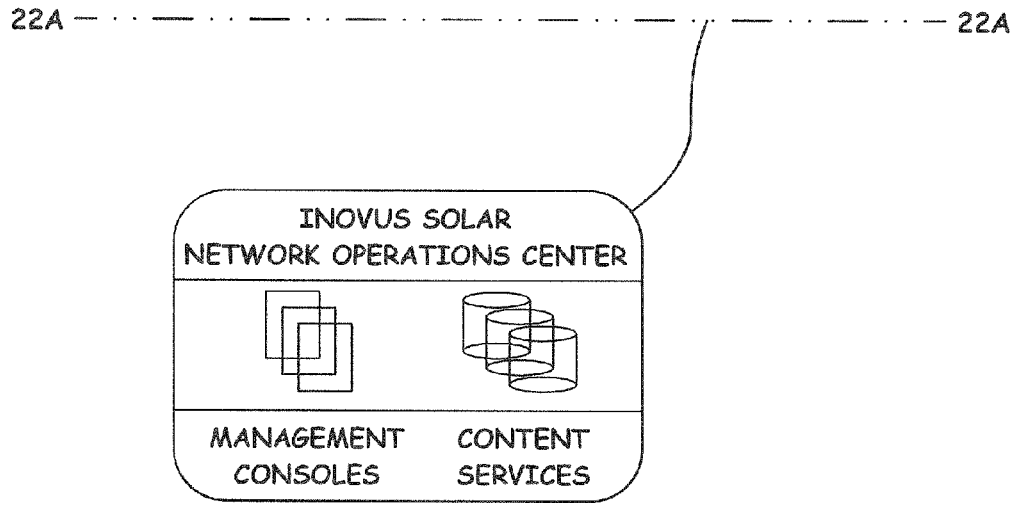

STEP 1: POLE "D" NEEDS TO RAISE A SENSITIVE EVENT TO THE NOC USING A FULLY SECURED CHANNEL.

STEP 2: ONLY POLES "D", "F" AND "I" HAVE SECURE CHANNEL CAPABILITIES ACCORDING TO RECOURSE TABLES

STEP 3: POLE "D" DETERMINES THE BEST ROUTE TO BE THROUGH POLE "I" TO THE NOC COORDINATOR.

STEP 4: AN IPSec VPN TUNNEL CHANNEL IS CREATED THROUGHOUT THE ROUTE TO THE NOC.

STEP 5: THE EVENT GETS DELIVERED TO THE NOC COMPLETELY SECURELY.

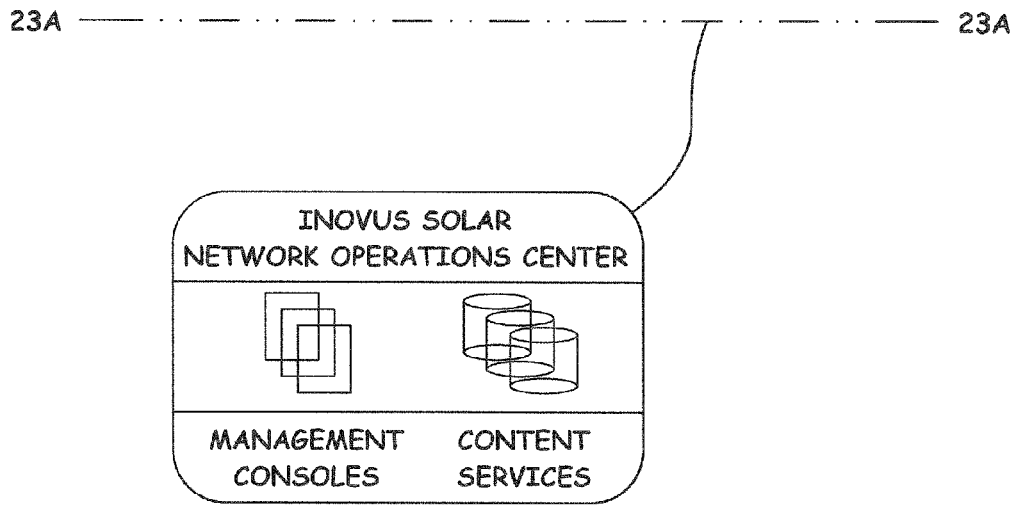

STEP 1: POLE "C" INITIATES THE SEQUENCE TO CREATE THE MESH, THEN BEHAVES LIKE ANY OTHER END NODE.

STEP 2: POLE "A" RAISES AN EVENT FOR THE NOC.

STEP 3: POLE "B" MAINTAINS THE BEST CONNECTION WITH POLE "A" SO IT FORWARDS THE EVENT.

STEP 4: POLE "G" MAINTAINS THE BEST ROUTE TO THE NOC COORDINATOR SO IT FORWARDS THE EVENT.

STEP 5: NOC COORDINATOR USES ITS ZIGBEE-TO-CELLULAR GATEWAY TO FORWARD THE EVENT TO THE NOC.

*Fig. 23B*

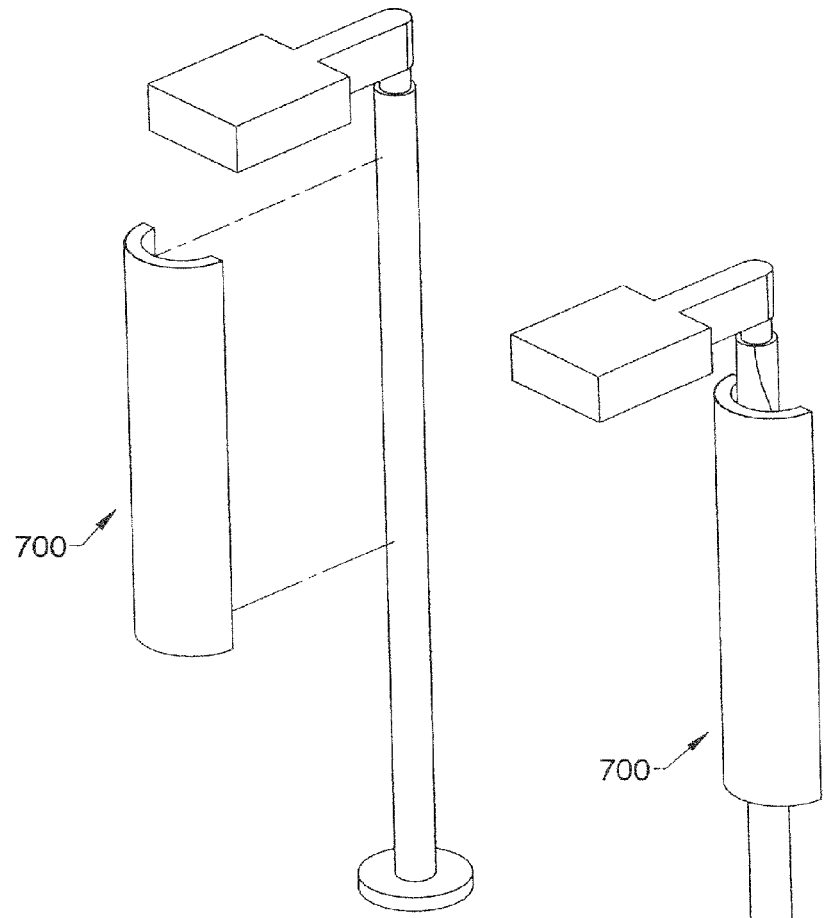
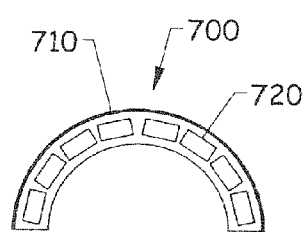
Fig. 32  Fig. 33  Fig. 34

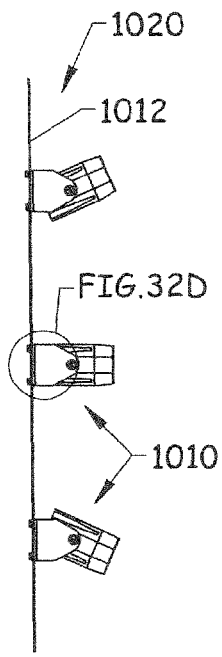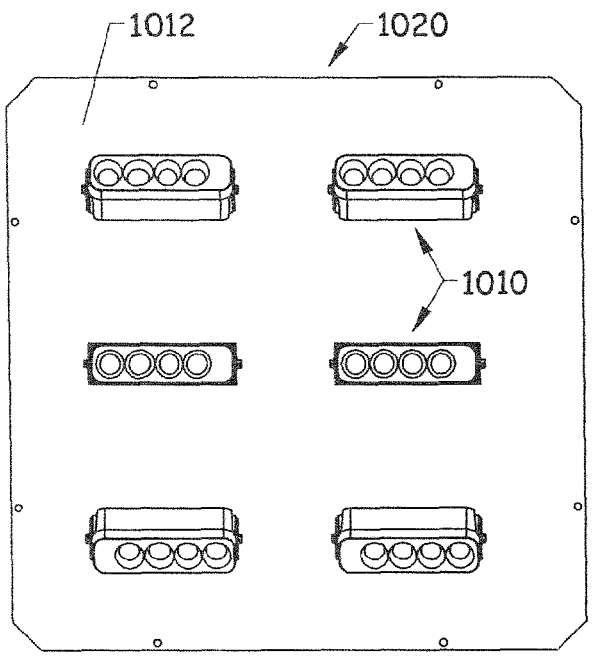
Fig. 40                Fig. 41
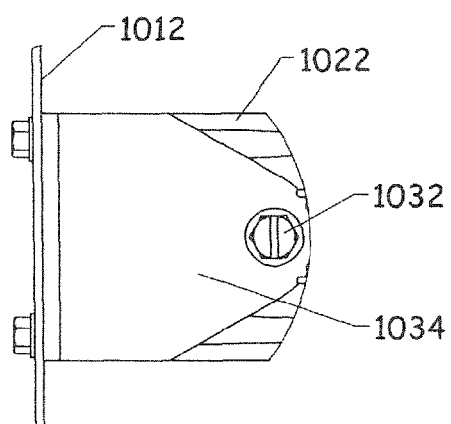
Fig. 42

WIRELESS AUTONOMOUS SOLAR-POWERED OUTDOOR LIGHTING AND ENERGY AND INFORMATION MANAGEMENT NETWORK

This application claims benefit of Provisional Applications Ser. No. 61/137,437, "Wireless Autonomous and Intelligent Network for Remote Monitoring and Controlling of Outdoor Lighting", filed Jul. 31, 2008; Ser. No. 61/137,434, "Peak Load Delay Energy Conservation System", filed Jul. 31, 2008; Ser. No. 61/137,433, "retrofit Solar-Powered Outdoor Lighting System", filed Jul. 31, 2008; and Ser. No. 61/190,192, "Modular LED Outdoor Lighting System", filed Aug. 27, 2008; and this application is a continuation-in-part of Non-Provisional application Ser. No. 12/025,737, "Solar-Powered Light Pole and LED Light Fixture", filed Feb. 4, 2008, which claims benefit of Provisional Application Ser. No. 60/888,002, filed Feb. 2, 2007, the entire disclosures of said provisional and non-provisional applications are incorporated herein by this reference.

BACKGROUND OF THE INVENTION

The field of the invention is an array of outdoor lighting or other electric-powered devices, and network apparatus, hardware, and software for monitoring and managing said array, and, optionally, for analyzing information gathered from said array for dissemination to customers.

SUMMARY OF THE INVENTION

The invention is a system comprising an array of outdoor lighting or other electrical devices, and network apparatus, including software, firmware, and/or software, for monitoring and managing said array. In preferred embodiments, the array comprises multiple outdoor lights that may operate mainly in an independent mode wherein sensing, communication, and control processes take place between the various lights of the array. Further communication and control may be provided between the array and a control station (or "headquarters") by means of a master or "coordinating" node that transmits and receives signals to the control station via call phone and/or satellite. The system may be tied to the internet for dissemination of data and/or data analysis gathered by means of the multiple poles/devices of the array. The independent-array and/or the master-to-station network and communications may be adapted for energy-saving processes; power-receiving from or power-providing to the grid, renewable power production and storage by means of solar panels and/or wind turbines and associated batteries or other storage equipment; and/or to Wi-Fi hot-spots, public safety alarms, information, or advertising to the public or information/analysis to customers.

An objective of the invention is to provide for the wireless and intelligent monitoring and control of outdoor lights and outdoor lighting systems. The preferred embodiments of the "wireless intelligent outdoor lighting systems" (WIOLS) are adapted to operate in areas where there are no data communication lines available (i.e. no "hard-wired" system or "landline"). The preferred embodiments accept a virtually unlimited number of "nodes" or connection points of the components to be controlled, wherein the nodes may be connection points for lights or other electrical devices. The preferred embodiments are adapted to generate the power to operate the outdoor lighting system in remote areas either from nearby power sources such as the utility grid or from a renewable energy source. Such renewable energy sources, including associated batteries, may be mounted on, or adjacent to, the outdoor lighting poles of the preferred embodiments.

The outdoor lighting system shall allow for nodes (connection points of components) to be added in the future, that is, after the initial system has been installed, and for these nodes to be automatically integrated to the network via "self-discovery" in which they are each assigned a unique location identification (ID). The self-discovery system, and assignment of location ID, may be accomplished via a global positioning system (GPS) system tool that identifies the latitude and longitude of the node location.

The system may have intelligence built-in to the array of lights or other components, for example, intelligence for energy-saving processes, energy storage management, and grid-array cooperation, WI-FI and public-safety alarms, and advertising or information dissemination. Said intelligence built-in to the array allows and/or supplements the operation of the array in independent mode, wherein the intelligent processes take place between the nodes of the array (that is, between the multiple components of the array) rather than between each node and a control station.

In addition to, or in place of portions of, the independent-mode intelligence of the array, intelligence may be provided and controlled through an intelligent remote control station to execute intelligent activities in response to or in anticipation of events. Said intelligent remote control station may communicate to and control said array through preferably a single component/node of the array that is the single "master" or single "coordinating" node of the array. Thus, the control station may communicate with the coordinating component/node, and the coordinating component/node communicates to the multiple slave components/nodes of the array, rather than each component/node being controlled individually by the control station. Thus, the multiple slave components/nodes of the array are preferably connected to, and engage in two-way communication with, only the coordinating component/node, rather than each slave component/node being connected directly to, and communicating directly with, a control station (headquarters).

Embodiments of the invention may comprise lighting equipment, light poles, solar panels and/other renewable power production, energy storage equipment, and/or the WIOLS equipment, hardware, firmware, and/or software. Preferred embodiments are described in the following Detailed Description, but it is to be understood that the invention may be embodied in many different ways within the broad scope of the claims, and the invention is not necessarily limited to these details, materials, designs, appearances, and/or specific interrelationships of the components.

BRIEF DESCRIPTION OF THE DRAWINGS

FIG. 32 is one embodiment of a collar that may be used to retrofit a pole with a solar-panel and energy storage. It may be noted that the solar panel is preferably flexible and may be installed on/incorporated into a flexible, semi-rigid, or even a rigid structure as desired for attachment to the pole.

FIGS. 33 and 34 illustrate connection of the half-cylindrical retrofit collar onto an existing pole, wherein the solar PV panel is on the outside surface of the collar, the collar is mounted to the pole with the PV panel typically facing south in the northern hemisphere, and with wiring from the solar collar to the light fixture.

FIGS. 39-42 are views of multiple of the LED modules of FIGS. 36-38 arranged on a plate/baffle for direction in one or multiple different directions (here, shown pointing in three directions) and for installation in a lighting fixture.

DETAILED DESCRIPTION OF THE PREFERRED EMBODIMENTS

Figure 1:
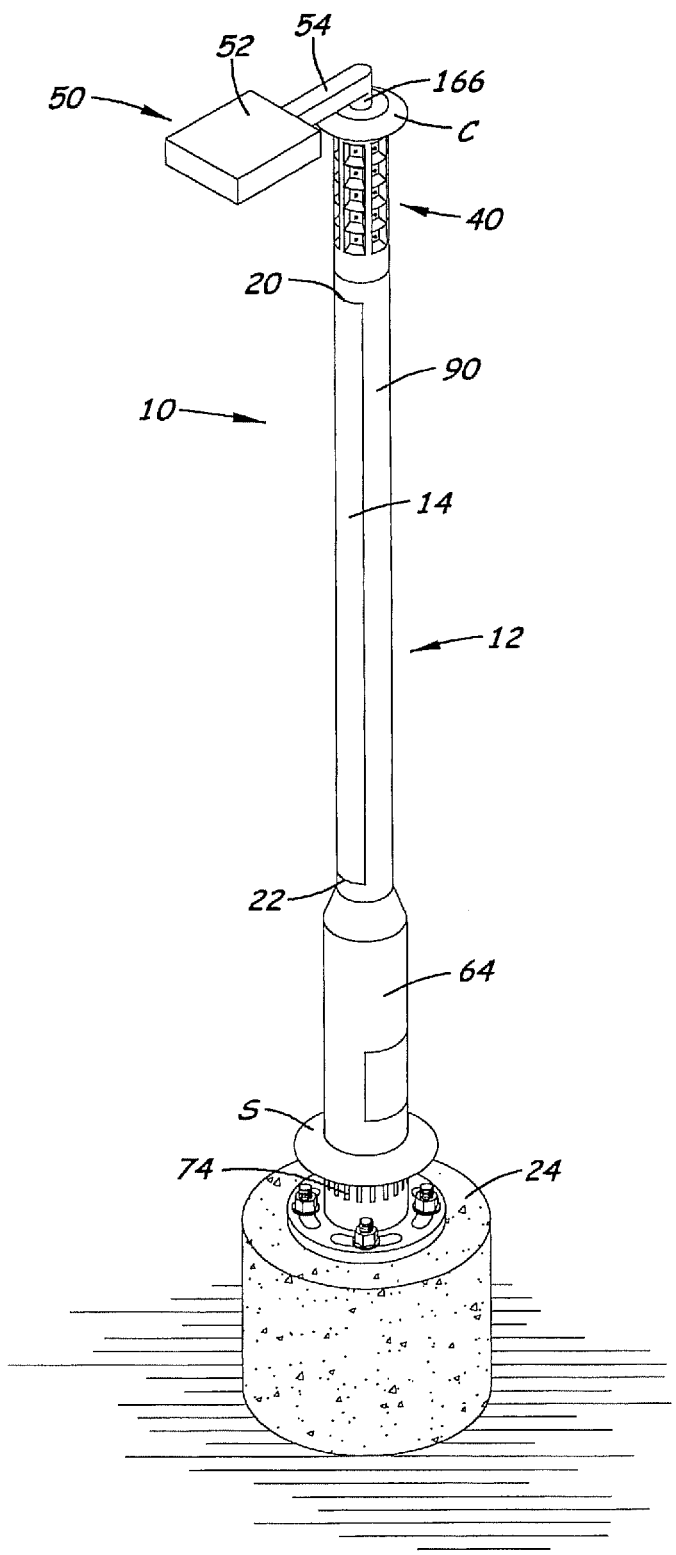
FIG. 1 is a front perspective view of one embodiment of a light pole system according to the invention, the light pole being anchored to a concrete base.

Referring to the Figures, there may be seen some but not the only embodiments of the invention. FIGS. 1-18 portray some, but not the only, embodiments of solar-powered light poles and lights that may form the "population" of poles for arrays and networks of the invention. FIGS. 19-47 schematically portray some, but not the only, embodiments of arrays of outdoor lighting and other powered devices that are preferably managed as embodiments of the invented wireless intelligent outdoor lighting system (WIOLS) and that are preferably autonomous in that they may be operated at least part of the time by power other than the electrical grid. Included in FIGS. 19-47 are portrayals of management and monitoring processes, layering of capabilities and apparatus that make the preferred network possible, light-capture schemes, and LED module and light fixture options.

Solar-Powered Light Pole Apparatus:

In many embodiments of the preferred invented wireless intelligent outdoor lighting system (WIOLS), there is a need for an outdoor lighting system that is highly efficient in collecting and storing energy from the suns rays, and in using said energy over several nights to light a surrounding area even through inclement, overcast periods of time. Preferred embodiments utilize a cooling system that may greatly increase battery life and efficiency of the entire system. Preferred embodiments also utilize efficient, versatile LED light fixtures that may be used for all or nearly all street light styles without the need to separately engineer LED fixtures for each lamp/fixture style desired by the public, government, or neighborhood. Preferred embodiments have a visually-integrated appearance, preferably without flat panels of solar cells, and preferably with minimal or no unaesthetic protuberances and exposed equipment.

The preferred solar-powered outdoor lighting utilizes a photovoltaic panel(s), for example amorphous photovoltaic laminate (PVL), and light-emitting diodes (LEDs) to produce light, over a several-night period even during inclement, cloudy, or overcast weather conditions. In one embodiment, the invention comprises a light pole having a vertical portion covered by a flexible photovoltaic panel for being contacted by sunlight, and an LED light fixture powered by said photovoltaic panel via a battery or other energy storage device. The preferred flexible panel is a sheet of amorphous thin-film photovoltaic material(s) surrounding a significant portion of the circumference of the pole at least in one region along the length of the pole, and, preferably along the majority of the length of the pole. The light pole is specially-adapted for cooling of the photovoltaic panel, the batteries contained within the pole, if any, and the preferred LED light fixture. Said cooling is important for achieving the high efficiencies of power production and storage, over long equipment lives, as exhibiting by the preferred embodiments The preferred light pole may be similar in exterior appearance to conventional light poles, in that the pole profile is generally smooth and of generally the same or similar diameter all the way along the length of the pole. The photovoltaic panel fits snugly against the pole outer surface and requires no brackets, racks or other protruding structure. The preferred LED fixture is at or near the top of the pole, is generally a vertical cylinder of the same or similar diameter as the pole, and may be convectively cooled by air flow up through the pole. The preferred LED fixture eliminates the need for the difficult engineering task of adapting the many common styles of outdoor light fixtures to use LEDs. Further, because the preferred battery system is concealed either inside the pole, inside a base holding the pole, or buried below the grade level of the ground or street, there is no need for a large box or protruding battery structure on or near the pole.

In the event that the purchaser or public wish the lighting system to match or be reminiscent of previously-installed or other conventional street lights, a conventional-looking lighting fixture may be provided in addition to the preferred LED fixture. Said conventional-looking lighting fixture may extend horizontally or from atop the pole, and may be purely decorative, or may have a minimal or token light-emitting device therein. Such a decorative light fixture may more easily meet with approval from the public and/or may blend in with traditional street lights that remain in an area. By using a combination of the LED fixture and a decorative fixture, the single LED light-producing section may be engineered and installed, while preserving various aesthetic options for the city, county, or neighborhood and/or while allowing the new solar-powered lights to "blend in" with the street lights already in place. Further, the decorative light fixtures may be light-weight and designed to break-away in high winds or storms, thus minimizing the damage to the pole, surrounding property, and/or people.

Various LED light fixtures may be provided on the preferred light pole. One example of an invented light fixture comprises arrays of LED's that emit light from at least three and preferably four generally vertical sides of the fixture, as illustrated in FIGS. 7, 8 10-12 13 and 18. The LED light fixture may emit light out in patterns extending 180 degrees-360 degrees around the fixture, for example. The LED fixture comprises heat exchange or other cooling means in order to lower the temperature of the LEDs and the associated equipment. Other examples of invented light fixtures are described later in this document and are shown in FIGS. 25, and 32-47, which fixtures do not have LEDs and lenses on three or four sides and do not necessarily have vertical LED groupings, but instead have adjustable-direction LED modules that may be directed to emit light in various directions for fine-tuning to desired light patterns.

In another embodiment, an outdoor light pole, having the features described above, is provided on, and hinged to, a portable base. In such an embodiment, the battery system may be located in, and provide additional weight for, the base.

In some embodiments, the solar-powered outdoor lighting system is connected to the utility grid, so that the photovoltaic panel may provide energy to the grid during peak-demand daylight hours, and so that, if needed or desired, low cost night-time electricity may be provided by the grid to the outdoor lighting system, to power the light and/or charge batteries. Preferably, even in such embodiments tied to the grid, batteries or other storage devices are provided that may also be charged during the daylight hours, for providing power to the lighting system during the night hours, and/or providing power to the lighting system in the event of a grid failure or natural catastrophe that interrupts grid power supply.

In the preferred embodiments, venting and/or air channels are provided in the pole to allow cooling by natural convection air flow through the pole and the light fixture. Optionally, heating equipment may be provided in one or areas of the pole to protect equipment and/or enhance operation during extreme cold.

Referring to FIGS. 1-18, there are shown several, but not the only, embodiments of the apparatus that may be used in invented lighting systems. FIG. 1 portrays one embodiment of a solar-powered street light 10, comprising a pole 12 with a panel 14 of thin-film photovoltaic material attached thereto. The panel 14 is preferably selected from commercially-available amorphous silicon (non-crystalline) photovoltaic materials that produce electrical energy when exposed to sunlight. One source of material for the panel 14 is Uni-Solar (United Solar Ovonic), which flexible, non-framed laminates that may be used in embodiments of the invention, under the name of UNI-SOLAR® "solar laminates" or "photovoltaic laminates."

While currently-available flexible photovoltaic laminates, such as the UNI-SOLAR solar laminates are preferred, it is envisioned that thin-film light-active materials being developed, or to be developed in the future, may be used in embodiments of the invention, wherein said materials being developed or to be developed may be used in the place of the panel 14 described herein. For example, it is envisioned that photovoltaic material may be applied directly to the pole 12 in the form of a liquid having components that later polymerize or "set up" on the pole and retain the photovoltaic material on said pole. Thus, the flexible photovoltaic panels described herein may be provided as a flexible sheet attached to the pole, or as other thin-film materials applied to the pole and taking the form of the pole, that is, preferably curving at least 225 degrees around the pole.

The panel 14 preferably is a thin, flexible sheet that is preferably adhered to the pole by adhesive. The panel 14 may be a single, continuous sheet with "self-stick" adhesive on a rear surface, and that, upon peeling off of a protective backing, may be directly applied to the pole. The integral adhesive makes attachment of the panel 14 simple and inexpensive. No bracket, rack, covering, casing, or guard is needed over or around the preferred panel, and this simplicity of attachment preserves the aesthetics of the preferred slim and smooth profile of the pole. Less-preferably, multiple, separate panels may be adhesively applied to the post 12 and operatively connected.

The preferred panel 14 extends continuously around the pole along a significant amount of the circumference (preferably at least 225 degrees and more preferably about 270 degrees) of the pole in order to be directly exposed to sunlight all through the daylight hours. As illustrated in FIGS. 13-16, this coverage of the pole will expose the panel 14 to the suns rays generally from sunrise to sunset, in order to maximize solar-power generation. The panel 14 preferably covers ½-¾ of the length of the pole, extending from its upper edge 20 at a location near the top of the pole to its lower edge 22 several feet above the base 24 supporting the pole. It is preferred that the lower edge 22 be high enough from the ground or street level that passers-by or vandals cannot easily reach the panel 14 to cut, pry off, or otherwise damage the panel.

Connection of the pole 12 to the base 24 may be done in various ways, each typically being adjustable so that, at the time of installation, the pole may be turned to orient the panel 14 optimally to catch sunlight through the day. The adjustable connection, shown in FIGS. 1 and 3 to best advantage, includes a pole base flange 26 having multiple, curved slots 28 through which bolts extend, so that the bolts may be tightened to secure the pole to the base 24 after the pole is rotated to the desired orientation. The connection of the decorative light fixture (50, discussed below), may also be adjustable, so that, given any orientation of the pole, the decorative light fixture may be secured/tightened to point in the desired direction, for example, over a street or sidewalk.

The main, or only, light-producing unit of the preferred street light 10 is a light-emitting diode (LED) fixture at or near the top of the pole 12. The preferred LED fixture 40 has a cylindrical outer surface and is coaxial with, and of generally the same diameter as, the upper end of the pole 12. This LED fixture, as will be discussed further below, may emit light out in a 360 degree pattern, or, may be adapted by LED and/or reflector placement and shape to emit various patterns of light as needed for a particular setting.

Figure 12:
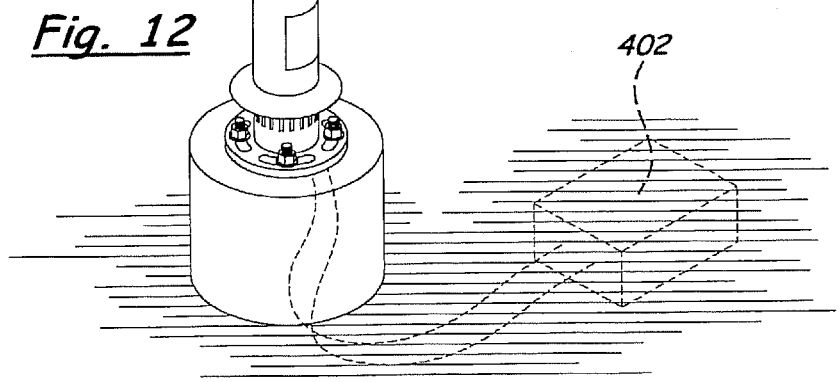
FIG. 12 is a side, perspective view of another embodiment of the invented light pole system for use by a highway, wherein the battery system is buried in the ground instead of being contained inside the pole or inside the base, and wherein the pole may be a break-away pole, both features being for improved safety in the event of a vehicle hitting the pole.
Figure 13:
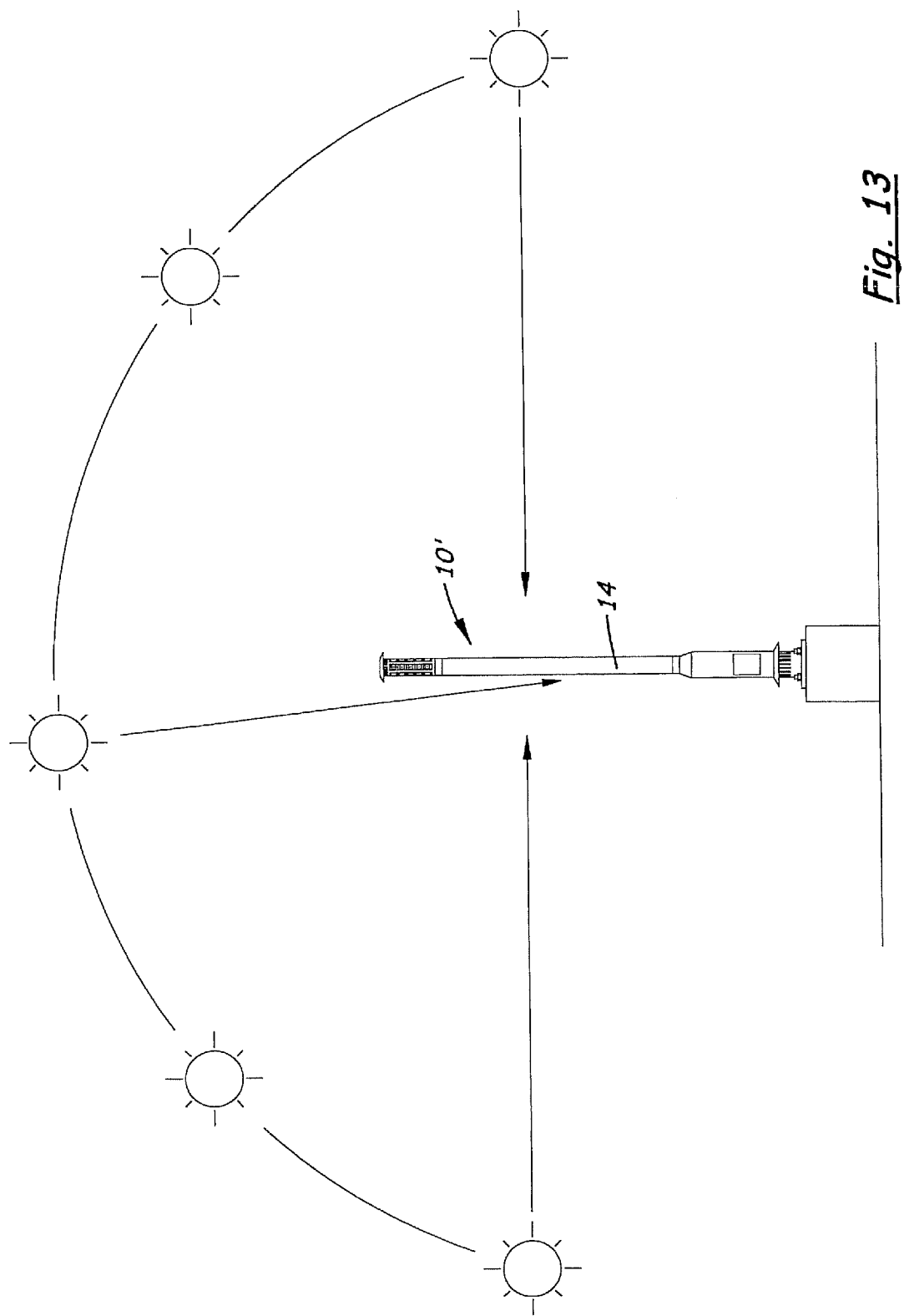
FIG. 13 is a schematic illustration of sunlight hitting the preferred vertical photovoltaic panel adhered to the light pole, wherein morning and evening light hit the sheet at close to perpendicular to the sheet surface and the noon sunlight hits the sheet surface at an acute angle.
Figure 14:
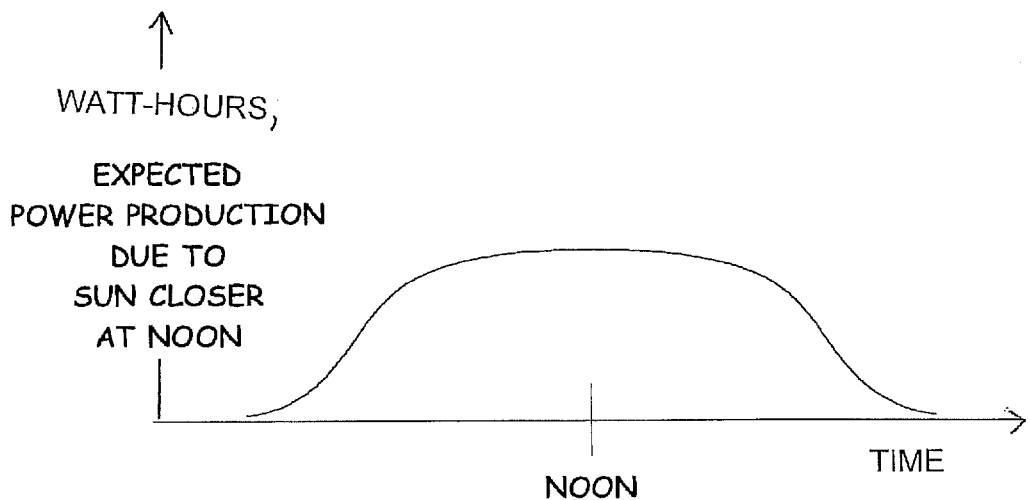
FIG. 14 illustrates the common conception of power production (for example, watt-hours) vs. time that is expected to be produced from a light-active device over a day.
Figure 15:
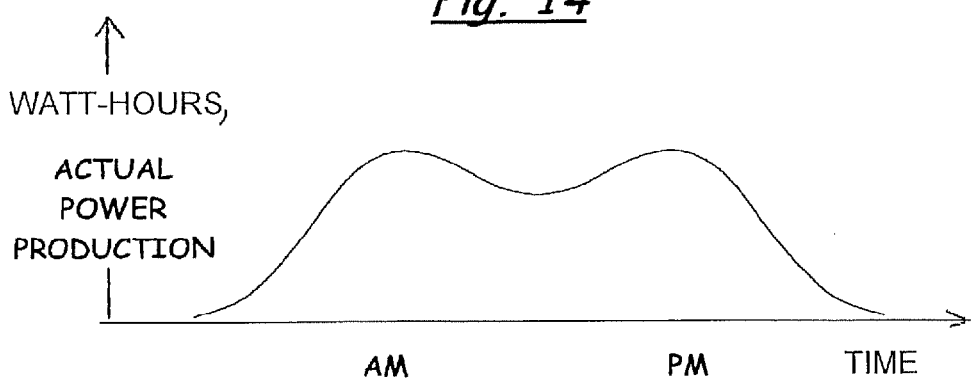
FIG. 15 illustrates the actual power produced (for example, watt-hours) vs. time, by embodiments of the invention, wherein power production from the morning and evening sun is higher than expected. The curve illustrates a power production increase from early morning until mid or late morning, and then a dip in production due top the sharp incident angle of sunlight around noon when the sun rays hit the pole at sharp angles to the photovoltaic panel.
Figure 16:
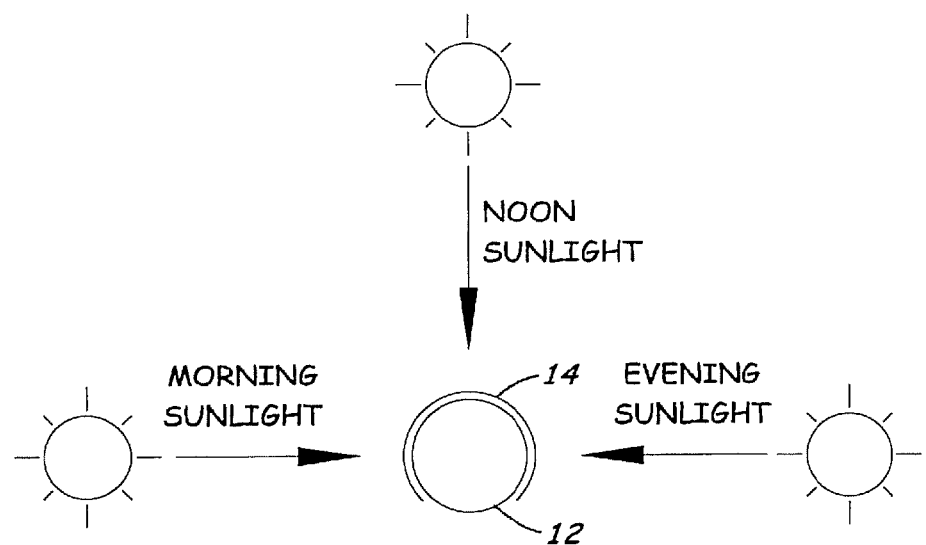
FIG. 16 schematically illustrates that the preferred photovoltaic panel is provided around most of the circumference of the pole, so that said panel is available and catches the suns rays during the entire day.

The decorative light fixture 50 is portrayed in FIG. 1 as a box-style fixture on a horizontal arm, but may be other fixtures The decorative light fixture 50 comprises a housing 52 and connecting arm 54 that are the same or similar to conventional fixtures. The decorative light fixture 50, however, has no internal or external workings to produce light, no bulb and no wiring, as the fixture 50 is merely a "token" or "fake" light fixture simulating the appearance that the public is used to. The decorative light 50 may have a conventional lens that contributes to the fixture looking normal during the day. Alternative decorative light fixtures may be provided, for example, a "gas lamp" glass globe that extends up coaxially from the LED fixture 40, or a curved-arm with conical housing 60 as shown in FIG. 12.

The inclusion of a decorative fixture may make the overall appearance of the street light 10 more desirable for the public or the governmental/transportation agency installing and maintaining the street light 10. This may make the overall appearance of the street light 10 match or complement pre-existing fixtures or the style or desires of a neighborhood. Having a decorative light fixture 50 may be reassuring and comforting to the public, as they will automatically recognize the street light 10 as a light for public safety, rather than worrying that the structure is an antenna or transmitter, surveillance structure, or some other undesirable structure in the their neighborhood, for example.

Alternatively, the decorative light fixture 50 may be adapted to provide some light output, for example, a single LED or other minimal light source to further enhance the aesthetics of the street light 10. Such a minimal light source will light the interior of the housing and/or the fixture lens, to prevent the decorative fixture from appearing to be burnt-out, and to suggest to passers-by that the fixture 50 is indeed providing light as is customary and comfortable for the public. While said decorative light fixture 50 may comprise said minimal light source, it is preferred that the LED light fixture provide at least 80 percent, and preferably at least 90 percent, of the light from the system 10, 10'.

Figure 2:
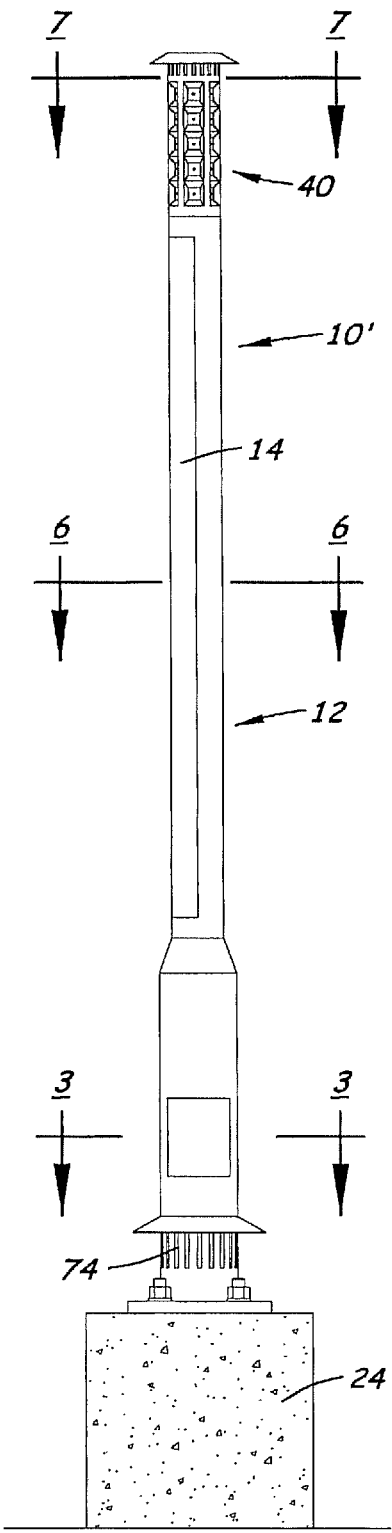
FIG. 2 is a side view of the embodiment in FIG. 1, with the decorative light fixture removed.

FIG. 2 illustrates the light pole in use with the decorative, non-lighting or minimally-lighting fixture 50 removed, in which form the street light 10' is fully functional for providing the desired amount of light for the street or neighborhood by means of the LED fixture 40. This version of street light 10 has, therefore, no significant protrusions from its elongated, vertical structure, and has a slim, sleek appearance that, over time, may become preferred for many settings.

Figure 3:
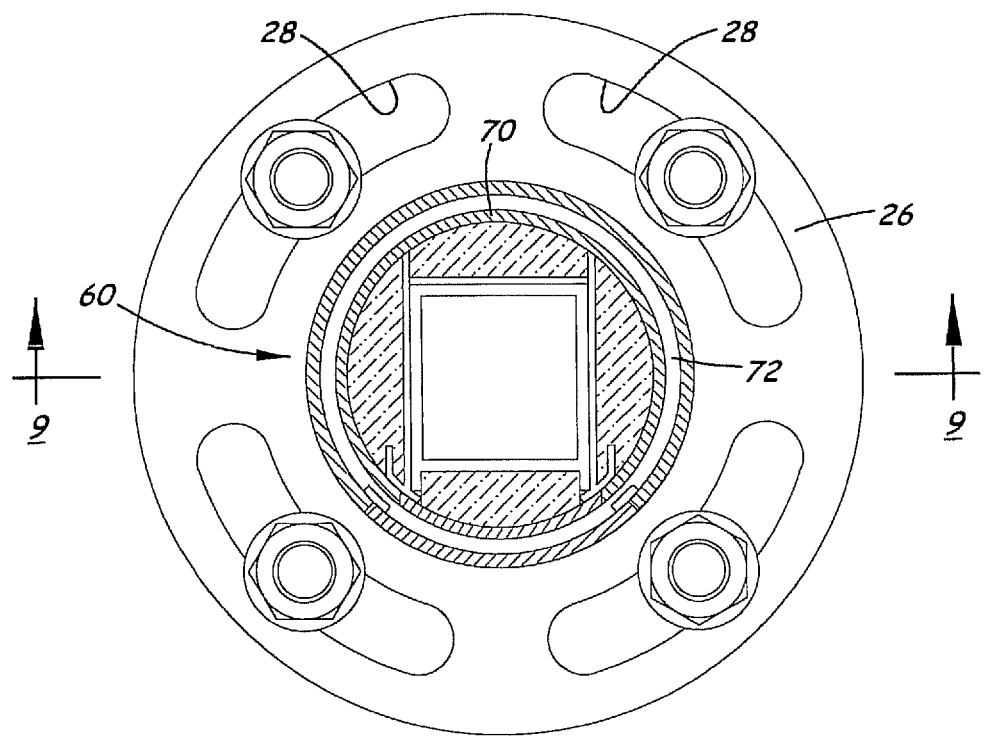
FIG. 3 is top, cross-sectional view of the light pole of FIGS. 1 and 2, viewed along the line 3-3 in FIG. 2, and illustrating to best advantage one embodiment of an adjustable connection between the light pole and the concrete base, and one embodiment of a battery system provided in the lower section of the pole.

FIG. 3 illustrates the adjustable connection of the pole 12 to the base 24, and shows the internals, in cross-section, of the storage system 60 with batteries 62 stored in the lower section 64 of the pole and operatively connected to the panel 14. The batteries 62 store the energy provided by the solar panel during the day or previous days, and power the LED fixture 40 during the night. The battery system is adapted to store enough energy to power, when fully charged, the LED fixture 40 for several nights with little or no additional charging and without any outside energy input. The battery system preferably stores enough energy to power the LED fixture for at least 5 nights and, more preferably, 5-9 nights equating to about 50-100 hours or more depending upon the number of hours in a night. Thus, the street light 10, 10' is capable of autonomously illuminating (that is, with only the energy provided by the stored energy from solar collection) the surroundings for several, and preferably at least 5 nights, even when the light 10, 10' is located in an overcast, inclement, hazy or smoggy location, all of which conditions will diminish the intensity of the daytime sun hitting the panel 14. In other words, the large amount of energy stored in the batteries during days of clearer weather is sufficient to "carry the light through" cloudy and inclement weather for about a week, until improved sunlight conditions return. The preferred amorphous thin-film panel 14 is more shade-tolerant than conventional crystalline solar cells, and is therefore expected to be more efficient and effective than banks or racks of crystalline solar cells.

Figure 18:
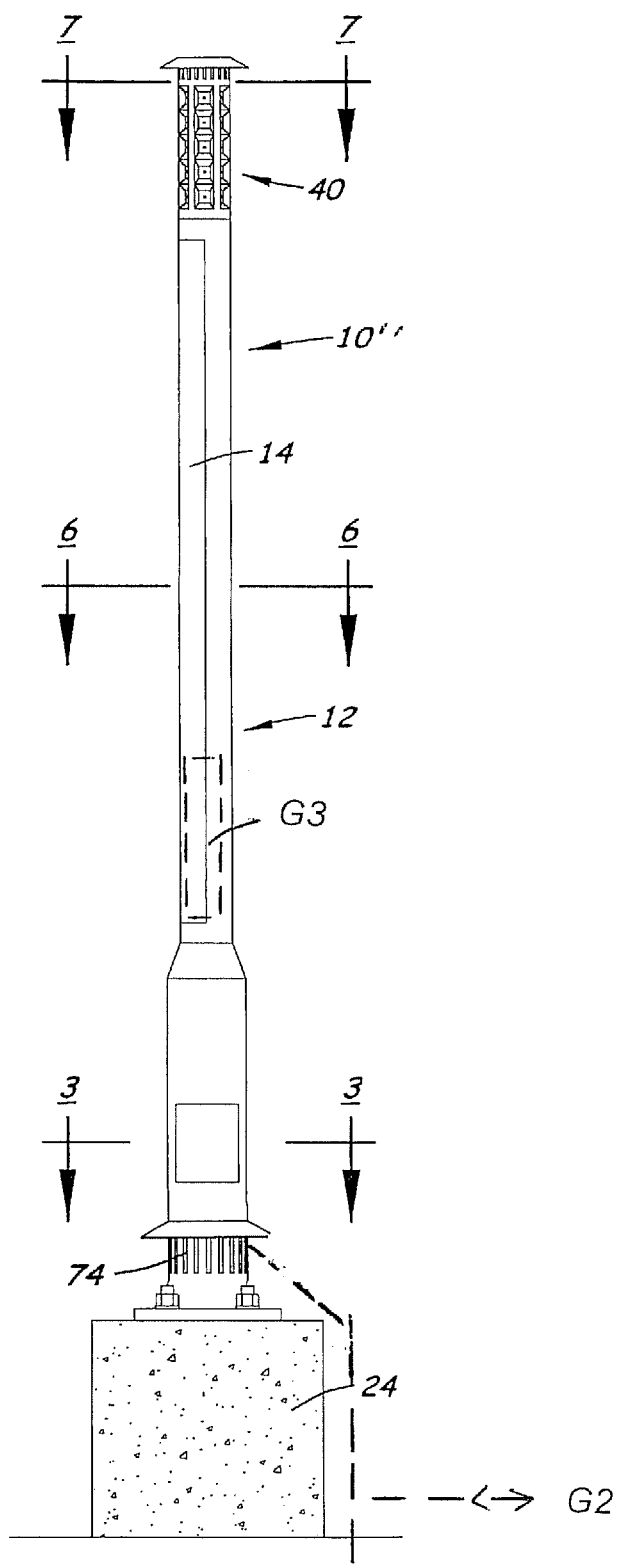
FIG. 18 is a perspective view of an alternative solar-powered light system including a connection (shown schematically) to a utility grid.
Figure 19:
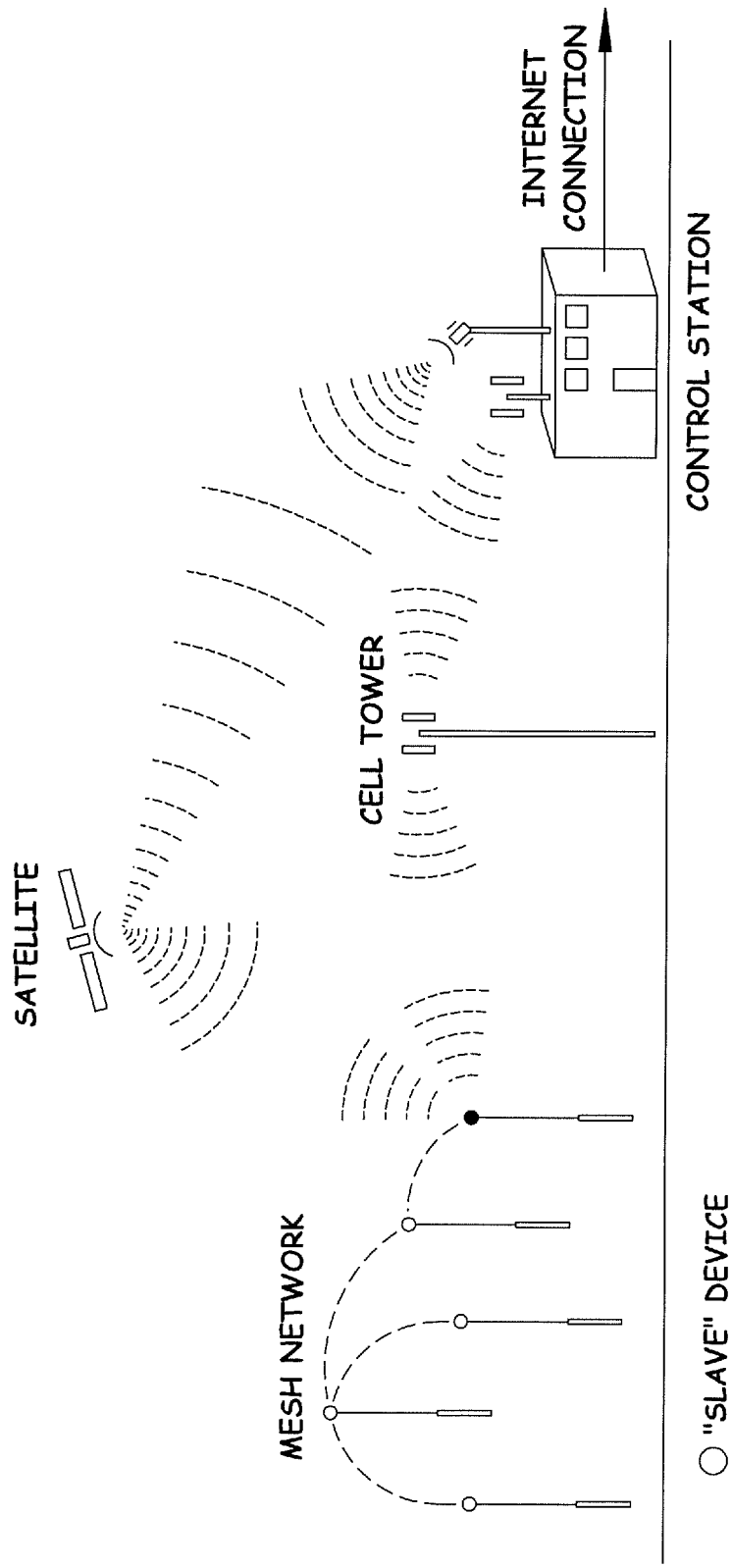
FIG. 19 is a schematic of one embodiment of a wireless mesh network according to the invention.
Figure 20A:
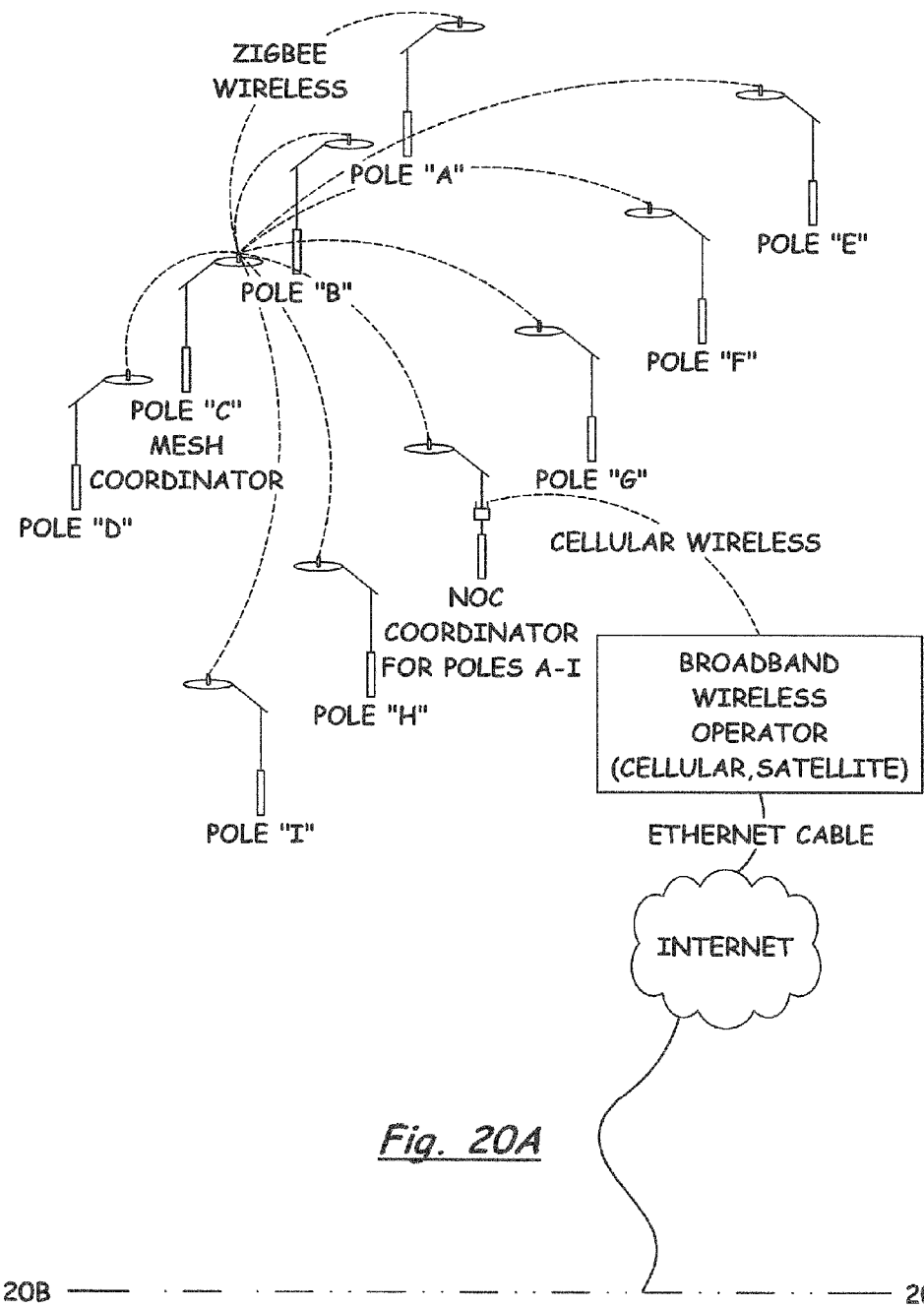
FIGS. 20A and B, 21A and B, 22A and B, 23A and B are schematics of network processes according to embodiments of the invention, wherein an event is raised and subsequently "passed along" to multiple poles that comprise the best connection pathway at the time, until the NOC coordinator pole (also called the "master node" or "coordinator pole/node" communicates the event/information to headquarters ("NOC").
Figure 21A:
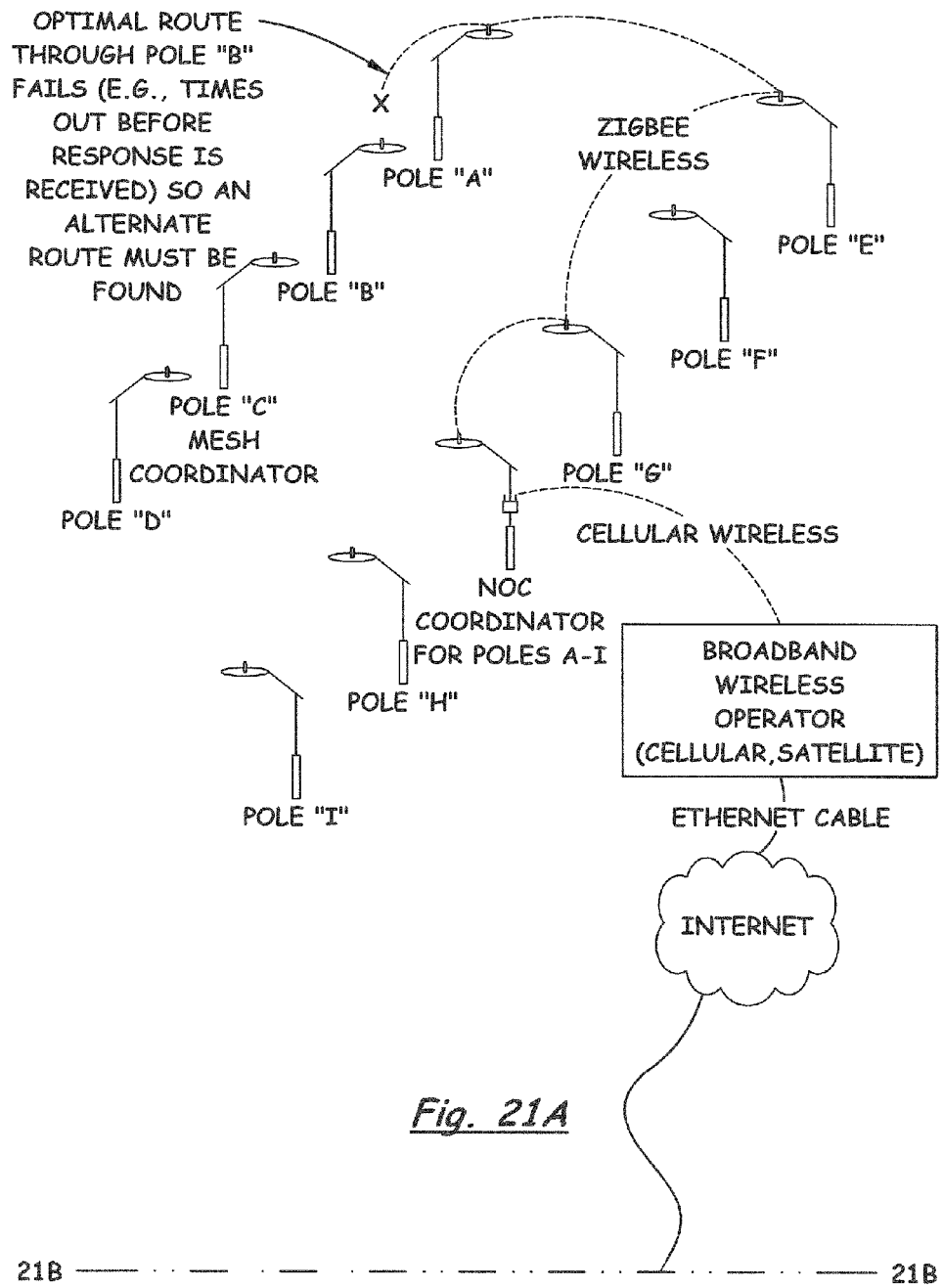
Figure 22A:
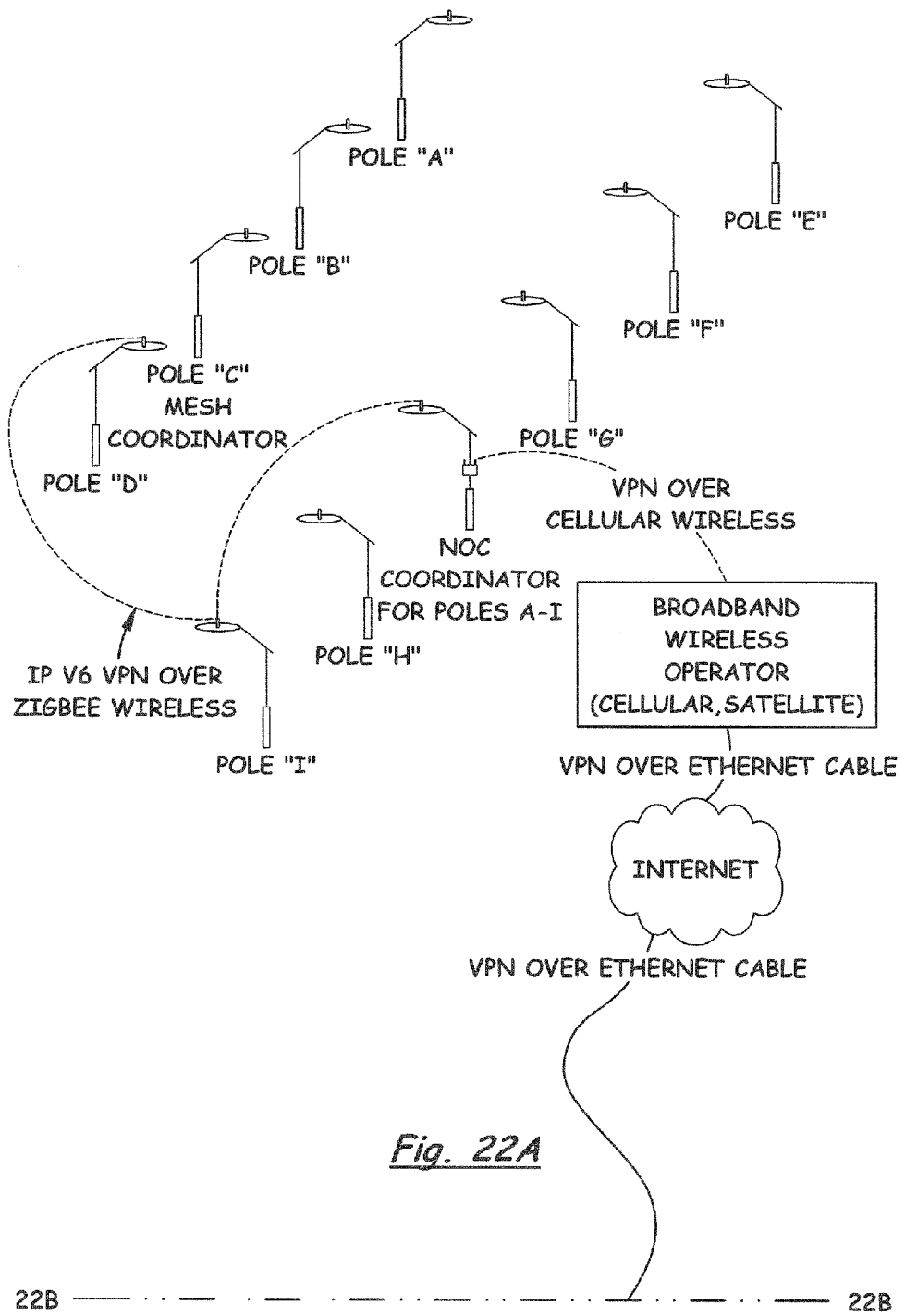
Figure 23A:
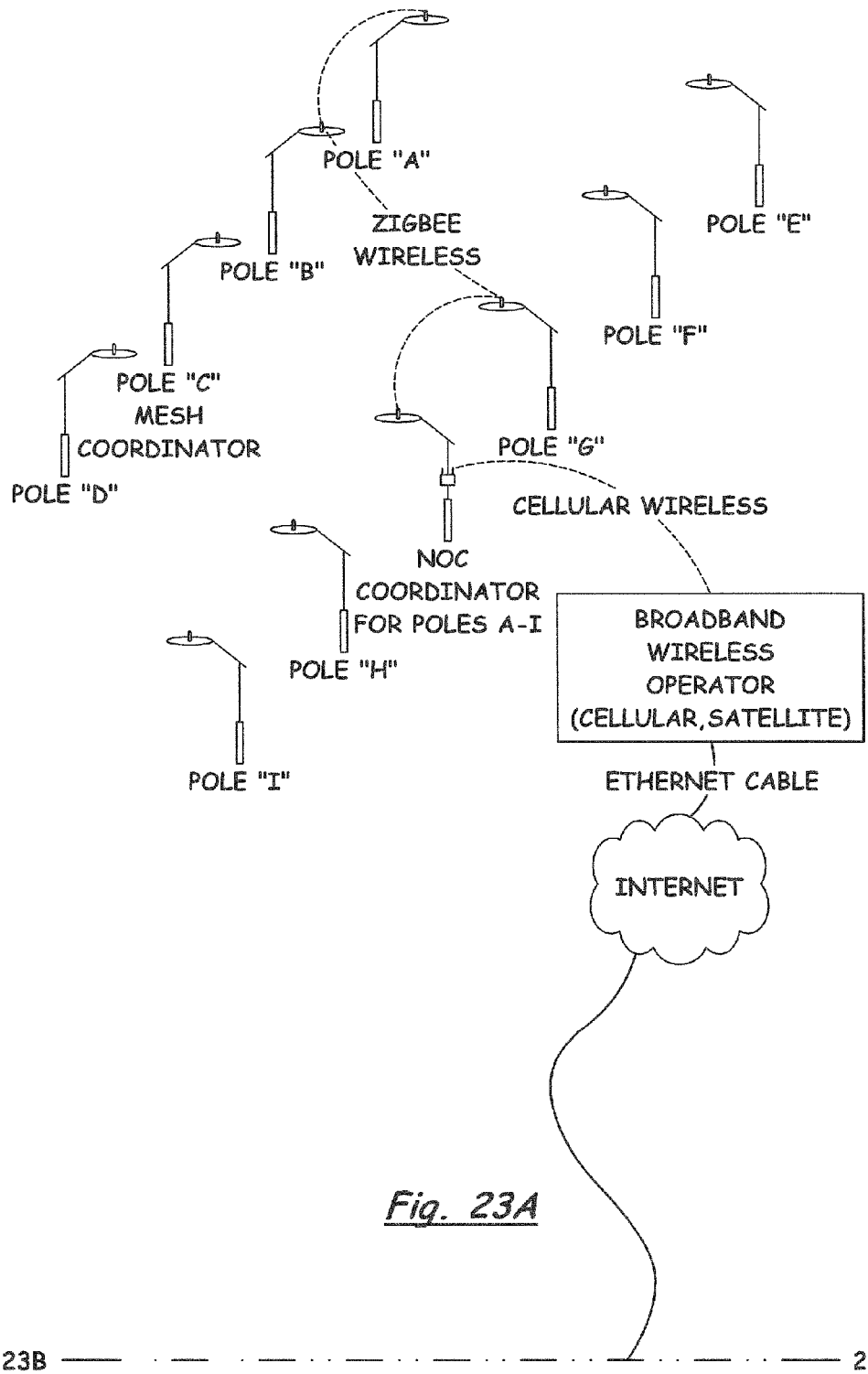

In alternative embodiments, the light 10" (see FIG. 18) may be tied to the utility grid, for example, for providing power to the grid during the day and preferably also charging batteries during the day, and then receiving less expensive power from the grid during the night and/or also receiving power from the batteries as a supplemental/backup power source. In FIG. 18, connection to the grid is shown schematically as G1 (underground) or G2 (above-ground) and one of skill in the art will understand how to build, install, and manage said connections. Especially beneficial management of said connections, preferably of an array of lights/poles, to the grid has been invented and is discussed below.

A grid-tied embodiment that also has battery storage capability may provide the benefit of supplementing the grid during peak electricity-usage hours, while also being capable of being autonomous (independent of the grid) operation in the event of disaster or other grid outage. In such embodiments, an inverter and control and measurement systems (G3 in FIG. 18) will be added, for example, inside the pole, to cooperate with the utility grid and measure and record the system's energy contribution to the grid.

Controllers are provided to manage charging of the batteries and delivery of energy to the lighting system and/or other components. Control of the operative connection between the batteries 62 and panel 14 and the operative connection between the batteries and the LED fixture 40 and other components may be done by electronics, circuitry, and/or semiconductors, for example, control board 80 shown in FIG. 7. The controller(s) preferably continually monitor(s) battery voltage and temperature to determine battery health, to improve both battery performance and life. Said controller(s) preferably control the speed and the amount that the batteries are charged and discharged, which can significantly affect battery life. Combined with the preferred cooling system for managing battery temperature, the batteries of the preferred embodiments are expected to exhibit longer lives, and better performance, than prior art batteries installed in solar-powered light systems.

A first controller delivers a low-current (trickle) charge from the solar collector panel 14 to the batteries. This controller also preferably limits the maximum voltage to a voltage that will not damage or degrade the battery/batteries. A second controller draws current from the battery/batteries and delivers it to the LED fixture and other electric device(s) requiring power from the batteries. The minimum battery voltage is also protected by the controller to prevent excess battery drain. During prolonged periods of inclement weather and low daytime energy generation, the controller(s) may dim the lights during part or all of the night to reduce the amount of energy being consumed while still providing some lighting of the surroundings. The controller(s) may turn the light on based on a signal from a photocell and/or a motion sensor, and off with a timeclock, for example.

The controller system(s) may comprise computer logic, memory, timers, ambient light sensors, transmitters, receivers, and/or data recording and/or output means. Said controller systems may comprise only electronics and apparatus to operate the single light 10, 10' in which it resides, or may additionally comprise electronics and apparatus that communicate with a central control station and/or with other street lights. Said communication is preferably accomplished wirelessly, for example, by means of a "multiple-node" or "mesh" network via cell-phone radio or satellite communication, as will be discussed in more detail later in this document. Such a network of multiple street lights ("multiple poles") and a central control station may allow monitoring, and/or control of, the performance of individual lights and groups of lights, for example, the lights on a particular street or in a particular neighborhood or parking lot. Such performance monitoring and/or control may enhance public safety and improve maintenance and reduce the cost of said maintenance. A central control station may take the form of, or be supplemented by, a server accessible via an internet website, for example.

The entire system for storing and using energy preferably uses only direct current (DC). Benefits of this include that LED lights use DC energy; the DC system is low-voltage, easy to install and maintain, and does not require a licensed electrician; and energy is not lost in conversion from DC to AC.

The preferred batteries are sealed lead-acid AGM-type batteries or gel-cell batteries, nickel metal hydride batteries, or lithium batteries, for example. It is desirable to maintain the batteries 62 within a moderate temperature range, for example, 40-90 degrees F. as exposure of the batteries to temperatures outside that range will tend to degrade battery performance and life. Daily battery performance may be reduced by more than 50 percent by cold weather, and batteries may stop working entirely in very low temperatures. Further, high temperatures tend to also degrade battery performance and life.

Figures 4, 5:
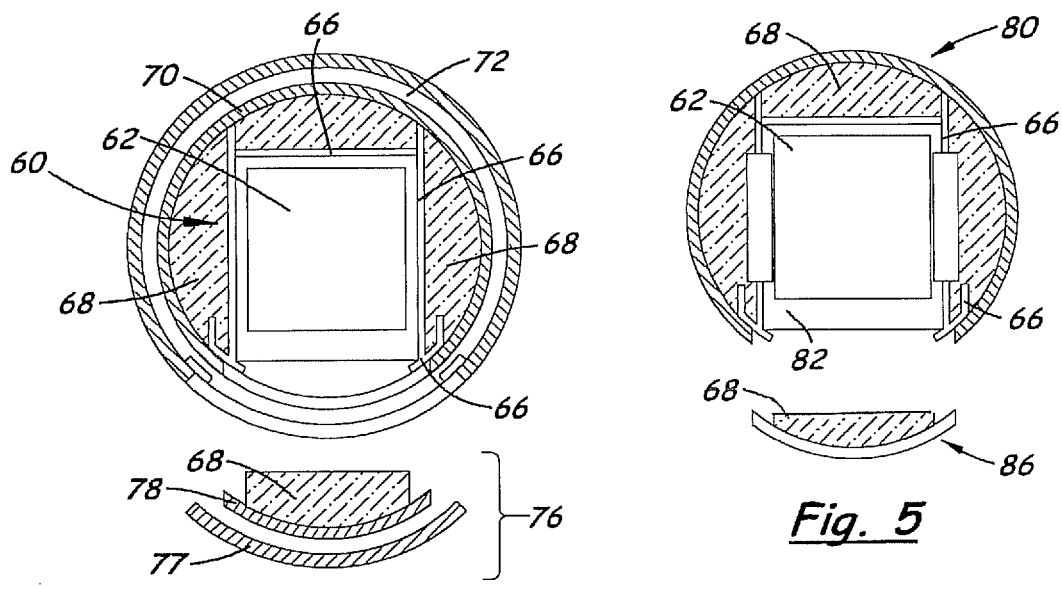
FIG. 4 is a top, cross-sectional view of the battery compartment of FIG. 4, shown with pole and sleeve access doors removed for access to the batteries.
FIG. 5 is a top, cross-sectional view of an alternative battery compartment, without a sleeve and with a single access door through a side of the pole.
Figure 17:
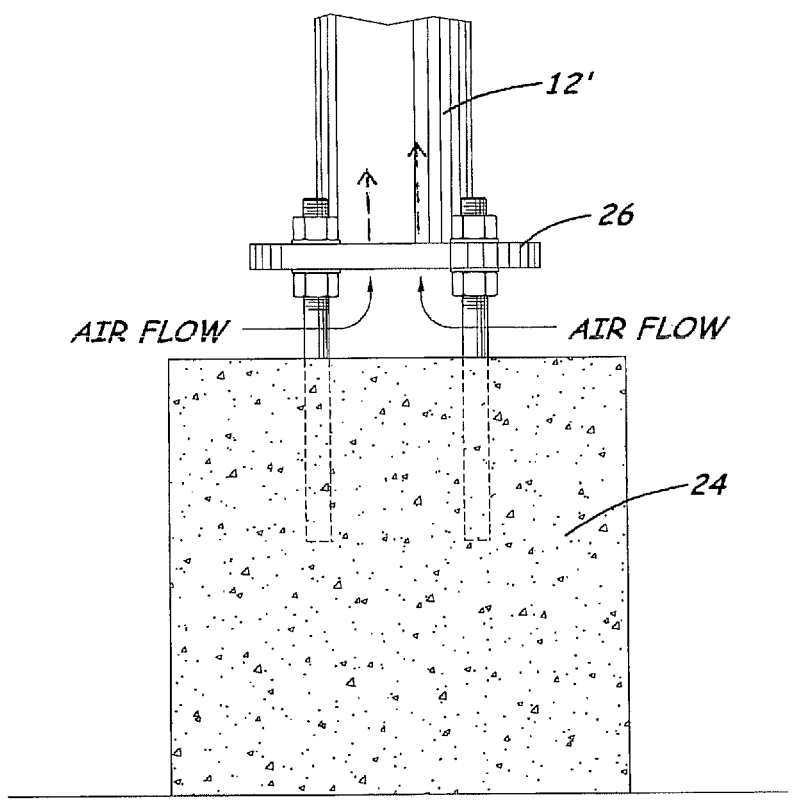
FIG. 17 is a partial detail view of an alternative, especially-preferred lower pole vent, wherein air is taken in between the pole flange and the base, through spaced between bolts that secure and raise the pole slightly above the base.

In the preferred configuration shown in FIG. 4, the batteries 62 are supported in a bracket(s) 66 and surrounded on multiple sides by insulation 68 for protecting the batteries from cold weather, preferably to help keep the batteries above about 40 degrees F. Further, said insulated batteries, and/or the bracket system supporting them, are connected to and contained inside a cooling sleeve 70 that is beneficial in hot weather, preferably to keep the batteries below about 90 degrees F. The cooling sleeve 70 is concentric with, and the same general shape as the wall of the pole 12. The sleeve 70 is of smaller diameter compared to the pole, for example, 2-4 inches smaller diameter, forming an annular air flow space 72 inside the pole along the length of the lower section 64 of the pole. Air enters the intake vents, for example, slits 74 around the pole in FIGS. 1 and 2, and flows up through the annular space 72 past the bracket(s) 66 and batteries 62 to cool said batteries 62. Said vents 74, and the open top of the flow space 72 that preferably communicates with the LED light fixture 40, are examples of at least one lower pole vent and at least one upper pole vent adapted for ventilation of at least a portion of the pole by natural convection up through said at least one portion of the pole. Preferably, the flow space 72, or alternative internal spaces for draft up the pole, communicates with the LED light fixture, but alternative ventilation systems may be independent from the LED light fixture. Referring to FIG. 17, there is shown another, alternative lower pole vent. The lower pole vent of FIG. 17 is provided (instead of vents 74) by providing spaces around the flange of the pole 12' by virtue of the flange being spaced from the base 24 by a bolt system that may be used to level the flange (make the pole vertical) on a base on uneven ground. The bottom end of the pole 12' has a bottom end opening (not shown) into which the air flows (instead of flowing into vents 74), and said bottom end opening is in fluid communication with the annular space 72 or other interior axial spaces inside the pole for creating the ventilation draft described elsewhere in this disclosure.

In FIG. 5, an alternative battery system 80 is shown, wherein no cooling sleeve is provided, but air may flow up through the battery section through axial spaces 82 around the batteries 62. Insulation 68 is preferably provided at and near the pole inner surface and extending most of the way to the batteries 62, however, with the exception of the axial spaces 82 that provide channels for air flow up through the system 80.

One may note that the designs shown in FIGS. 4 and 5 both have access doors systems 76, 86 that allow insertion, maintenance, and removal of the batteries 62 from the lower section 64. The access door system of FIG. 4 comprises both a door 77 in the pole and a door 78 in the sleeve 70. The sleeve door 78 of FIG. 4 may be insulated, so that the batteries are surrounded circumferentially by insulation, or, in alternative embodiments the sleeve door 78 may be un-insulated or even eliminated. The access door system 86 of FIG. 5 comprises only a door in the pole, and is insulated, so that the batteries are surrounded circumferentially by insulation. Other bracket, insulation, and door configurations may be effective, as will be understood by one of skill in the art after reading this disclosure.

Figure 6:
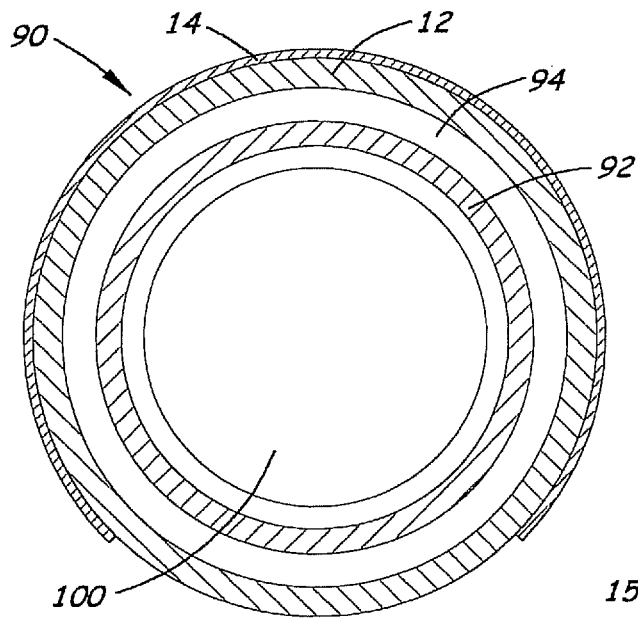
FIG. 6 is a top, cross-sectional view of a middle section of the pole of FIGS. 1 and 2, illustrating the preferred flexible amorphous photovoltaic panel applied to the outside of the pole, and a sleeve system for cooling the photovoltaic panel and allowing air flow to continue up to the LED light fixture.

FIG. 6 illustrates the internal structure of the middle section 90 of the pole 12, wherein the flexible panel 14 is wrapped and adhered to the pole outer surface. It should be noted that the preferred pole is a hollow, straight (or right) cylinder, and the preferred panel 14 is applied continuously around at least 225 degrees of the pole, so that sunlight "collection" is maximized. However, other pole shapes may be effective if the corners are rounded to allow the panel 14 to bend gently around said corners. For example, a square, rectangular, or polygonal pole, with rounded corners, may be effective, with the panel 14 still being provided in a single panel, and not needing to be held in brackets or frames on the various flat sides of the poles.

Inside the middle section 90 of the pole 12 is an axially-extending sleeve 92, which creates an annular space 94 that extends through the entire middle section 90. This annular space 94 fluidly communicates with the annular air flow space 72, or other air flow spaces 82 of the lower section 64, so that air vents from the lower section 64 through space 94 of the middle section 90 and to the LED fixture 40, as further described below. Ventilation by air flow up through the middle section 90 of the pole keeps the inner surface of the panel 14 cooler than the outer surface that is "collecting" the sun light. This may be important for efficient operation of the solar panel 14, to maintain a temperature gradient between the higher temperature outer surface and the cooler inner surface of the panel. Thus, it is not desirable to have insulation between the panel 14 and the pole 12. The pole middle section 90 may be made without a sleeve 92, in which the hollow interior of the pole might serve in place of space 94 as the air vent chimney in fluid communication with spaces 72 or 82 and the LED fixture.

The middle section 90 may house long-term energy storage 100 comprising capacitors, fuel cells and/or a hydrogen storage tank, for example. Capacitors would have the advantage that they would not be as affected by heat and cold as are batteries. Typically, capacitors would have longer lives than batteries, for example, up to about 20 years, compared to 2-5 years for batteries. Fuel cells could be used for applications that require longer autonomy than 5 days. The fuel cell and hydrogen storage tank could be integrated into the middle section 90 or lower section 64 of the pole, or into the base or an underground container. Venting similar to that required for the battery system would be required for off-gassing.

Figure 8:
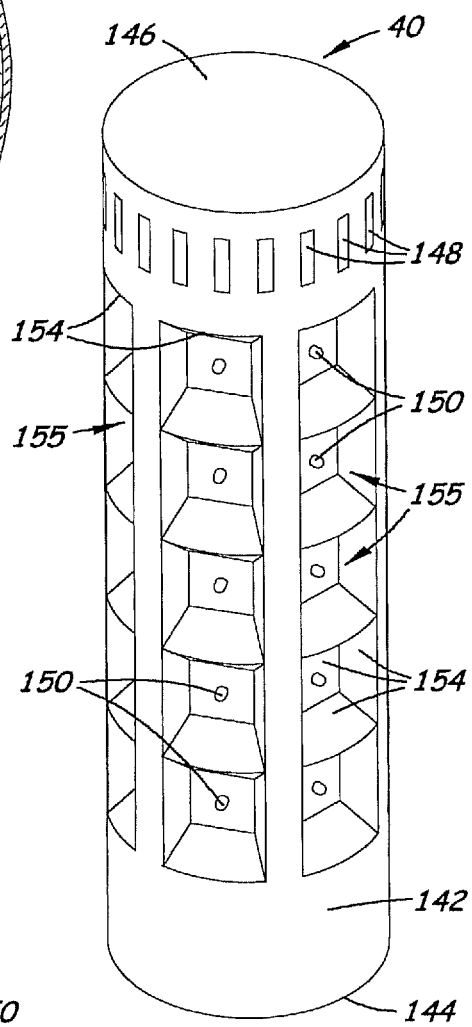
FIG. 8 is a side, perspective view of the LED Fixture of FIGS. 1, 2, and 7.
Figure 7:
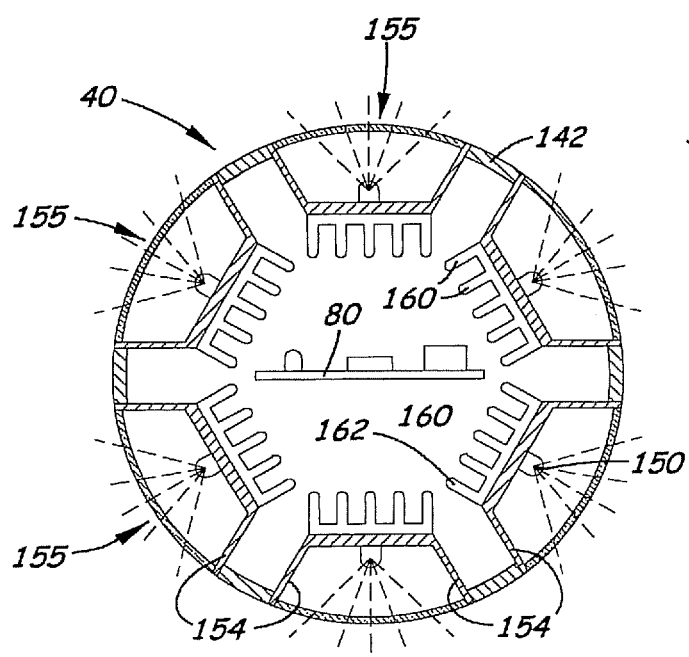
FIG. 7 is a top, cross-sectional view of the LED fixture of the embodiment of FIGS. 1 and 2.

FIGS. 7 and 8 portray transverse cross-section, and side perspective, views, respectively, of the preferred LED fixture 40 positioned above the middle section 90 of the pole. The fixture is preferably cylindrical and longer axially than it is in diameter. The fixture 40 is preferably the same diameter as the pole middle section, and comprises preferably a constant or nearly-constant-diameter housing 142. The housing 142 is substantially hollow with an open bottom end 144 in fluid communication with the middle section 90 and a closed upper end 146. Vents 148 are provided near the upper end 146 to allow air that flows up through the pole 12 to pass through the fixture 40 and then exit at or near the top of the fixture. Open bottom end 144 and vents 148 may be considered examples of a lower vent and an upper vent adapted for ventilation of said light fixture by natural convection up through the light fixture. Other venting systems comprising at least one lower vent and at least one upper vent may be used, including, but not necessary limited to, systems that utilize upwards draft from/through at least portions of the pole to create/enhance ventilation of the LED light fixture. There also may be ventilation systems for the LED light fixture that are independent from pole ventilation.

Compared to other light sources, LEDs are smaller, more efficient, longer-lasting, and less expensive. LEDs use less energy than other light sources to provide the necessary lighting desired for a street light. LED may last up to 100,000 hours, or up to 10 times longer than other lighting sources, which makes LEDs last the life of the pole and the entire light system in general, especially when said LEDs are housing and cooled by the apparatus of the preferred embodiments.

Multiple LED lights 150 are arranged around the entire, or at least a significant portion of the, circumference of fixture 40. LED's are arranged in multiple vertical column units 155, and said column units 155 are spaced around the circumference of the fixture 40 to point LED light out from the fixture 360 degrees around the fixture. In alternative embodiments, LED's may be provided around only part of the circumference of the fixture, for example, only around 180 degrees of the fixture to shine light generally forward and to the sides, but not toward the back. Six of the LED column units 155 are provided, each with five LEDs, but more or fewer units and LEDs may be effective. Reflectors 154 are provided on some or all sides of each LED and may be positioned and slanted to reflect light outward and preferably slightly downward as needed for a particular environment. The preferred arrangement of LEDs results in their being, in effect, columns and rows of LEDs.

At the back of each LED column unit 155 are located cooling fins 160, protruding into the hollow interior space 162 of the housing 142 for exposure to air flowing upward from the middle section. Heat exchange from the fins and adjacent equipment to the flowing air cools each unit 155, to remove much of the heat produced from the LED's. This heat exchange is desired to keep the LED's in the range of about 20-80 degrees, F and, more preferably, in the range of 30-80 degrees F. LED performance and life are typically optimal when operated at approximately 30 degrees F., but a range of operation temperature (for example, 20-80 degrees F.) may be tolerated due to the inherent long lives of LEDs.

In the center of the fixture in FIG. 7, one may see an example control board 80, as discussed previously. Optionally, other equipment may be provided inside the fixture 40, extending through to or on the outside of the fixture 40, or in/on stem 166 or the rain cap C at the top of the fixture 40. Such equipment may include, for example, a camera and/or recorder for a security system, wireless network radio, antenna, motion sensor, and/or photocell. If provided on the outside, it is desirable to have such equipment consistent with the contour/shape of the fixture, for example, to be flush with, or to protrude only slightly from, the housing 142 outer surface. The control boards 80 and other equipment, if any, located inside the fixture 40 may be cooled by the upwardly-flowing air inside the fixture, in some embodiments, or, in other embodiments, may need to be insulated from their surroundings, depending on the heat balance in the LED fixture.

Figures 9, 10:
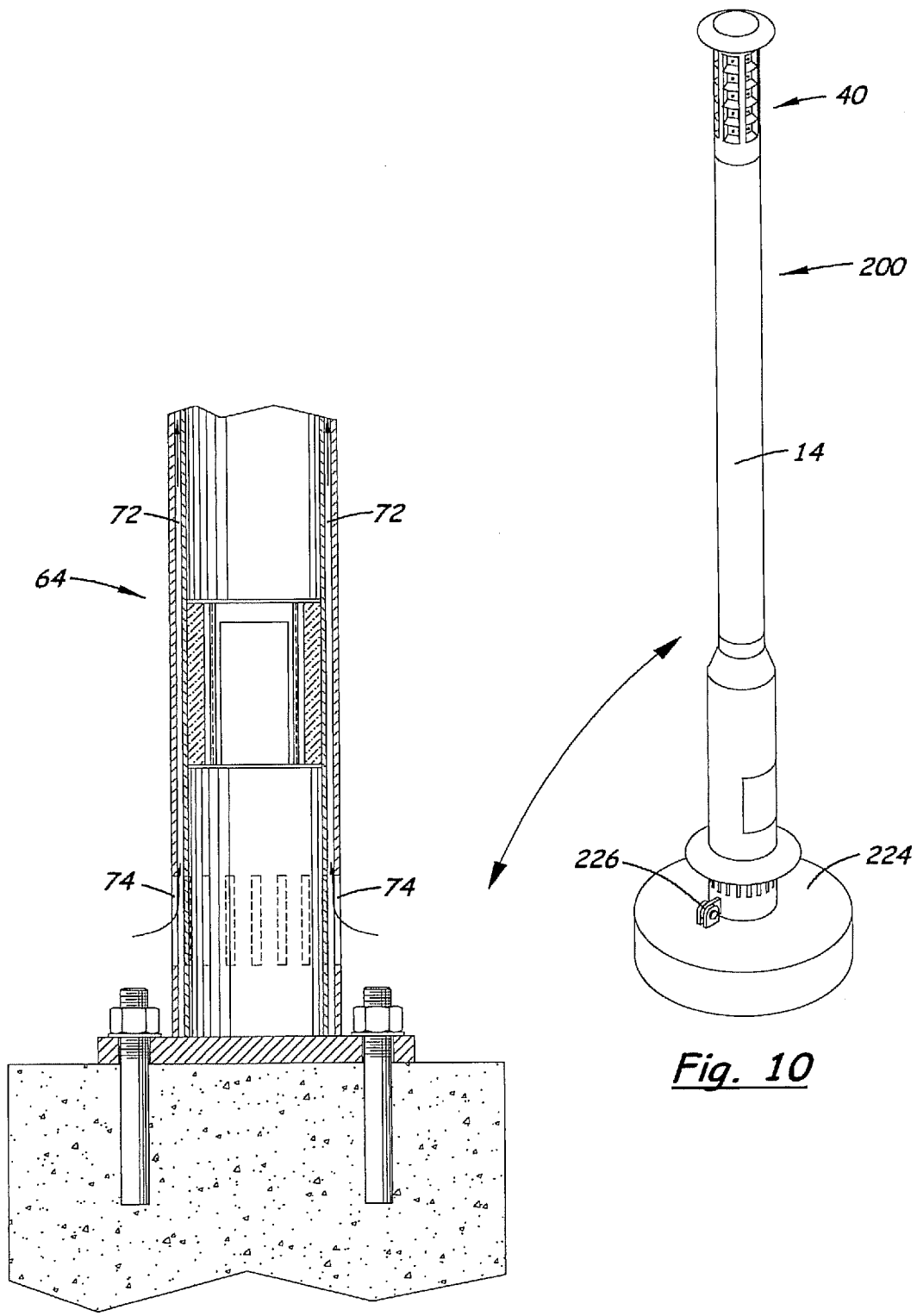
FIG. 9 is a partial, cross-sectional side view of the bottom section of the light pole containing a cooling sleeve and one or more batteries, illustrating natural air flow up through the sleeve. The rain skirt has been removed from this embodiment.
FIG. 10 is a side perspective view of an alternative embodiment of the invention, which comprises a portable light pole with LED fixture, said light pole being hinged to a portable base and so being pivotal from a generally horizontal position for transport or storage to a vertical position for use.

FIG. 9 portrays air being pulled into the lower section of the pole through slits 74 and continuing to flow up past the batteries and up through the pole, by natural convection. As provided by the structure of the pole and pole internals discussed above, the entire pole 12 will preferably be ventilated and designed to create an upward draft of air through the pole 12. This air flow cools the battery section and the LEDs, for improved operation and greater efficiency. The air flow may cool the circuit board and any other equipment that may be provided in LED fixture, depending on the heat balance in the fixture, or said circuit board and other equipment may need to be insulated to keep the LEDs from heating them beyond desirable temperatures. While other solar-powered outdoor lights have been proposed, none to the inventor's knowledge have a cooling feature, and the inventor believes that the preferred embodiments will exhibit increased efficiency and long-life, due to the special combination of LEDs and cooling for batteries and LEDs. Optionally, heating equipment may be provided in one or areas of the pole to protect equipment and/or enhance operation during extreme cold. Cable or film heating means may be effective, and may be controlled by a thermal sensor and controller.

Some, but not all, alternative light fixtures are discussed later in this document. See, for example, FIGS. 25, and 32-47.

FIG. 10 portrays an alternative embodiment of the invention, which is a portable, pivotal outdoor light 200. Light 200 comprises a pole with attached flexible panel 14 of amorphous thin-film photovoltaic material, LED fixture 40 at the top of the pole, and a heavy but portable base 224 that is neither connected to, nor buried in, the ground. The pole is hinged at 226 to the base 224, for tilt-up installation at the use site. A lock (not shown) may secure the pole in the upending position until it is desired to remove and move the portable light 200 to storage or another location. Batteries may be provided in the portable base 224.

Figure 11:
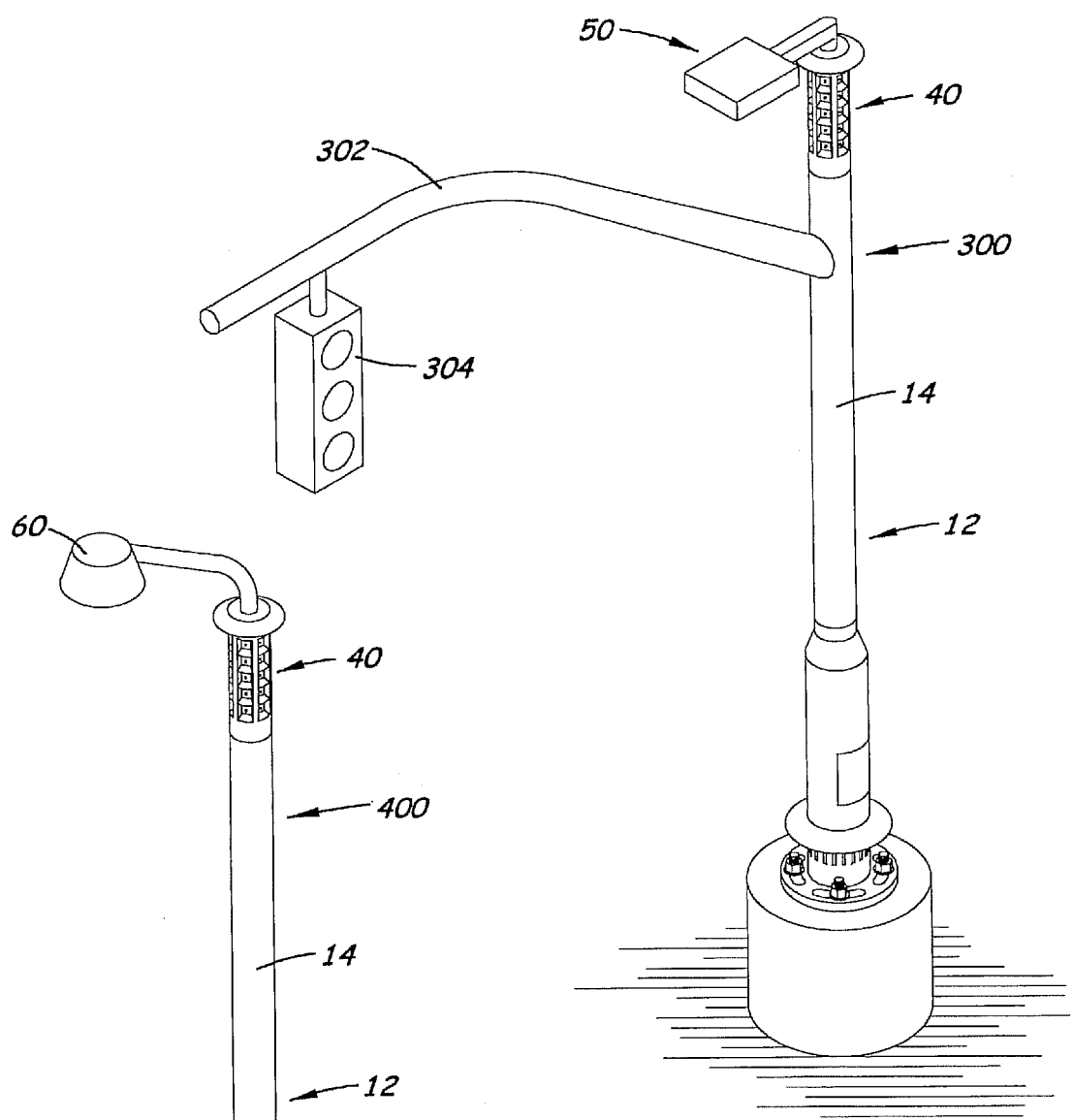
FIG. 11 is a side, perspective view of another embodiment comprising a decorative light fixture at the top of the pole plus an arm and traffic light extending from the pole.

FIG. 11 portrays an alternative embodiment 300 that includes a traffic light as well as a street light. The pole 12, panel 14, base 24, LED fixture 40, and decorative fixture 50 are the same or similar to those described above for the embodiment in FIGS. 1 and 2. An arm 302 extends from the middle section of the pole, to a position over a street intersection, for example. A traffic light 304 hangs from the arm 302, and is powered by the solar-powered system already described for the other embodiments. A control board and/or other apparatus and electronics will be provided to control the traffic light, in accordance with programs and instructions either programmed into the circuitry/memory of the embodiment 300 and/or received from a control network and/or central control station.

FIG. 12 portrays a break-away, road-side outdoor light 400 embodiment, which has its battery system 402 buried in a vault in the ground rather than being in the lower section of the pole. The electrical connection between the batteries and the panel, the batteries and the LED fixture extend underground. The rest of the light 400 is the same or similar as the embodiment in FIGS. 1 and 2, except that the lower section does not contain batteries, and the decorative light is a different one of many possible styles. The lower section of the pole may have a sleeve for encouraging draft and air flow up to the LED fixture, but does not need to contain brackets for batteries. An access door may be provided, for example, to check on or maintain wiring or connections that may be reachable from the lower section. Adaptations, such as break-away bolts, are provided to allow the pole to break-away when hit by a vehicle, as is required for many highway lights. Having the battery system buried in the ground enhances safety because vehicles will not crash into the full mass of the pole plus base plus battery system. Alternatively, batteries could be located in a buried base, to which the pole may be bolted. The pole may be steel or aluminum, and may have rust resistant coatings applied for extending underground.

FIGS. 13-16, as discussed above in the Summary of the Invention, illustrate the improved efficiency and effectiveness of the preferred embodiments of the invention. Sunlight hits the flexible amorphous panel 14 from all directions on its path "across the sky." The preferred continuous panel around at least 225 degrees of the pole circumference and along a substantial amount of the length of the pole, provides a large target that the sunlight hits "straight on" as much as is possible. The preferred cylindrical shape of the pole, and, hence, of the panel, provides a curved target that catches light from dawn to dusk.

The preferred outdoor light embodiments are what may be called "visually integrated," as they contain a great amount of operational capability inside and on a sleek, slim, and generally conventional-looking pole and installation. The preferred outdoor light embodiments do not include any flat-panel or framed solar cells. The pole has few if any protrusions, except for the optional rain shirt S which may be designed in many non-obtrusive ways, and an optional rain cap C that also may be designed in non-obtrusive ways. In embodiments having a decorative light fixture, said decorative light fixture may be considered a protrusion, but one that is expected and conventional-appearing. Most or all of the pole and its associated equipment, except for the decorative light, preferably varies only about 20 or less percent from the constant or substantially-constant diameter of the main (middle) section of the pole.

Particularly, the attachment of the preferred flexible amorphous light-active panel, or light-active materials of the future, is done simply and without racks, brackets, frames, and other complex or protruding material. Thus, the panel appears to simply be the side of the pole, for example, a painted or coated section of the pole wall. The preferred pole is a straight cylinder (with a constant diameter all along the middle section of the pole) that may be painted a dark color like black to match or blend with the dark color of the panel. The panel is not an ugly or strange-looking structure that would irritate the public, customers, or property owners who desire an aesthetically pleasing lighting system, and the panel does not have a high-tech appearance that might attract vandals or pranksters.

Some embodiments of the invented apparatus may be described as a light comprising:
  a pole having a cylindrical section with an outer surface having a circumference;
  a flexible panel of photovoltaic material adhesively connected to said outer surface so that the flexible panel curves at least 225 degrees around the cylindrical section;
  a light fixture comprising a plurality of light-emitting-diodes (LEDs), wherein the light fixture extends from an upper region of said pole; and an energy storage device operatively connected to said flexible panel so that, when sunlight hits said flexible panel, resulting electrical energy is stored in said storage device; and wherein said light fixture comprises at least one lower vent and at least one upper vent adapted for ventilation of said light fixture by natural convection up through the light fixture. Note that the flexible panel, as discussed previously in this disclosure may be various photovoltaic materials and not necessarily limited to amorphous photovoltaic panels. The pole may comprise an internal space and at least one lower pole vent and at least one upper pole vent adapted for ventilation of at least a portion of the pole by natural convection up through said at least portion of the pole. The light may further comprise at least one battery contained within said at least a portion of the pole, so that said at least one battery is cooled by said ventilation of said at least one portion of the pole. The light fixture may be a generally cylindrical fixture connected to a top end of the pole and wherein the light fixture has central axis that is coaxial with the pole and a circumference. The light fixture may comprise columns of LEDs arranged around at least 180 degrees of the circumference of the light fixture. The light fixture may comprise columns of LEDs arranged around 360 degrees of the circumference of the light fixture. The light may comprise, in addition to said cylindrical light fixture, a decorative light fixture that comprises no light source. The light may comprise, in addition to said cylindrical light fixture, a decorative light fixture that comprises only a single LED. The decorative light fixture may extend generally horizontally from the pole to extend over a street. The at least one battery may store energy from said flexible panel sufficient to power said light fixture for at least 50 hours. The light may comprise a connection to a utility power grid to provide electricity to said power grid during daylight hours.

In other embodiments, an outdoor light may comprise:
a pole having an outer surface;
a flexible panel of photovoltaic material adhesively connected to said outer surface, wherein the flexible panel may be amorphous or other photovoltaic materials;
a light fixture comprising a plurality of light-emitting-diodes (LEDs), wherein the light fixture extends from an upper region of said pole; and
an energy storage device operatively connected to said flexible panel so that, when sunlight hits said flexible panel, resulting electrical energy is stored in said storage device, wherein said energy storage device is located inside the pole; and
wherein said pole comprises at least one lower pole vent, at least one upper pole vent, and an interior air flow space in fluid communication with said at least one lower pole vent and said at least one upper pole vent, so that a draft is created up through said interior air flow space to cool the pole. Said light fixture may comprise at least one lower vent in fluid communication with the interior air flow space of the pole, at least one upper vent, and an internal space in fluid communication with said at least one lower vent and said at least one upper vent, so air flow from the pole continues up through said light fixture by natural convection. The light fixture may comprise column units each comprising multiple of said plurality of LEDs arranged in a column, and each column unit having cooling fins extending into the internal space of the light fixture for cooling the LEDs. The outdoor light may comprise a control board located in the internal space of the light fixture, wherein the control board may comprise electronics adapted to control charging of said storage device by the flexible panel, and also to control discharging of said storage device to light said light fixture. The storage device may comprise at least one battery, and the pole may comprise a pole wall and an axial sleeve between the pole wall and the at least one battery, there being an annular space between said pole wall and the axial sleeve wherein said annular space is said interior air flow space of the pole. The outdoor light may comprise a decorative light fixture comprising no light source. The outdoor light may comprise a decorative light fixture comprising only a single LED powered by energy from said storage device. The pole may comprise a lower section and a middle section, wherein the storage device is contained within the lower section of the pole, said light fixture is connected to a top end of the middle section, and wherein the light fixture is generally cylindrical and coaxial with, and of the same diameter as, the middle section of the pole. Said lower section may have a larger diameter than the diameter of the middle section and said lower section contains the storage device. The outdoor light may comprise a connection to a utility power grid for providing electricity to said power grid during daylight hours.

Some embodiments of the invention may be described as an outdoor light comprising:
a pole having a right cylindrical section with an outer surface having a circumference;
a flexible panel of photovoltaic material adhesively connected to said outer surface so that the flexible panel curves at least 225 degrees around the cylindrical section, wherein the photovoltaic material may or may not be amorphous material;
a cylindrical light fixture comprising a plurality of light-emitting-diodes (LEDs), wherein the light fixture extends coaxially from a top end of said pole; and
an energy storage device operatively connected to said flexible panel so that, when sunlight hits said flexible panel, resulting electrical energy is stored in said storage device; and
wherein said pole comprises at least one lower pole vent and said light fixture comprises at least one upper vent, and said pole and said light fixture comprise internal air flow passages in fluid communication with said at least one lower pole vent and said at least one upper vent, so that the pole and the light fixture are ventilated by a natural updraft of air flow through the internal air flow passages. The cylindrical light fixture may have a fixture circumference and comprises at least two columns of LEDs spaced around the fixture circumference, wherein each of said at least two columns each may comprise at least four LEDs.

Also, embodiments of one, but not the only, LED light fixture that may be adapted for use in embodiments of the invented outdoor lighting systems, may comprise:
a generally cylindrical housing;
a plurality of axial column units connected to said housing and having a plurality of light-emitting diodes (LEDs) arranged axially in each column unit; and
said housing having an interior space; and
cooling fins extending from each of said axial column units into the interior space for cooling said plurality of LEDs. The LED light fixture may comprise an electronics control board received in said interior space of the housing. Said housing may have at least one lower vent into the housing and at least one upper vent into the housing, said at least one lower vent and at least one upper vent being in fluid communication with said interior space of the housing, so that the housing is adapted for air flow up through the interior space to cool said LEDs.

Embodiments of the invention may comprise a solar-powered pole comprising:
a pole wall having an outer surface and a circumference;
a flexible panel of amorphous photovoltaic material adhesively connected to said outer surface;
an energy storage device operatively connected to said flexible panel so that, when sunlight hits said flexible panel, resulting electrical energy is stored in said storage device, wherein said energy storage device is located inside the pole; and
wherein said pole comprises at least one lower pole vent, at least one upper pole vent, and an interior air flow space in fluid communication with said at least one lower pole vent and said at least one upper pole vent, so that a draft is created up through said interior air flow space to cool the pole. The pole may comprise an axial sleeve within at least a portion of the pole creating an annular air flow space that is said interior air flow space. The storage device may be a battery that is contained inside said sleeve.

It should be noted that, while the preferred embodiments are outdoor lighting systems, that some embodiments of the invention may comprise the preferred LED fixture by itself and/or the preferred LED fixture in use with supports and equipment other than those shown herein. Also, some embodiments of the invention may comprise the preferred solar-powered pole by itself and/or connected to and powering equipment not comprising any light source, powering non-LED lights, and/or powering equipment other than is shown herein.

Wireless Intelligent Outdoor Lighting System (WIOLS):

Preferred embodiments preferably comprise at least one, and preferably multiple, separate wireless independent networks, which each preferably comprise multiple "slave" devices and at least one "master" (also called "coordinating" device). Each wireless independent network comprises individual slave devices at a plurality of node locations that "talk" to each other via a mesh network. The preferred slave devices of the network are primarily outdoor lighting devices with wireless communication capability, although other wireless and electrical devices may be included in the network. Each of the slave devices is equipped with a wireless modem that communicates with adjacent nodes/slave devices. The range of each device reaches nodes at least two devices away in order to allow for the system to remain operational even if one node is lost or otherwise fails in any way. Each of these devices is called a "slave" device, because each depends on other nodes/devices to pass information back & forth.

The preferred single master (coordinating) device of each mesh network communicates via wireless modem to all of its "slave" devices. The mesh network allows for both self-discovery and bridging the gap when any given node is "lost" for any reason. The master device has a radio in it (either cell or satellite), which communicates the monitoring and control information to the control station. The master device may comprise an outdoor lighting device and/or other wireless and electrical devices. See, for example, FIGS. 19-23B that illustrate multiple, but by no means all, of possible arrangements for a master-slave mesh network for wireless, preferably autonomous light systems, which lighting systems may also comprise additional powered equipment, such as alarms public service displays, WI-FI hot-spots, etc., as discussed elsewhere in this document.

The control station has a connection to the internet so that the system can be both monitored and controlled from anywhere with internet access. The control station is connected to a main server that contains the web site for connection to the internet. If any given node fails, that information (a "trouble" signal) is passed on thru the network to the control station so that it can be addressed. There may be more than one master device connected to a main server, each master device acting as the primary control interface between the main server (typically at the control station) and its respective separate wireless independent network (typically, the array of components/nodes).

The wireless network can be simplified by use of LED's or lasers that can be modulated for communication. Simple photodetectors can be used in conjunction with the LED's or lasers for purposes of detecting an object in the area that interrupts the communication (via LED's or lasers) between adjacent nodes or devices, that is, typically between adjacent poles.

Figure 24:
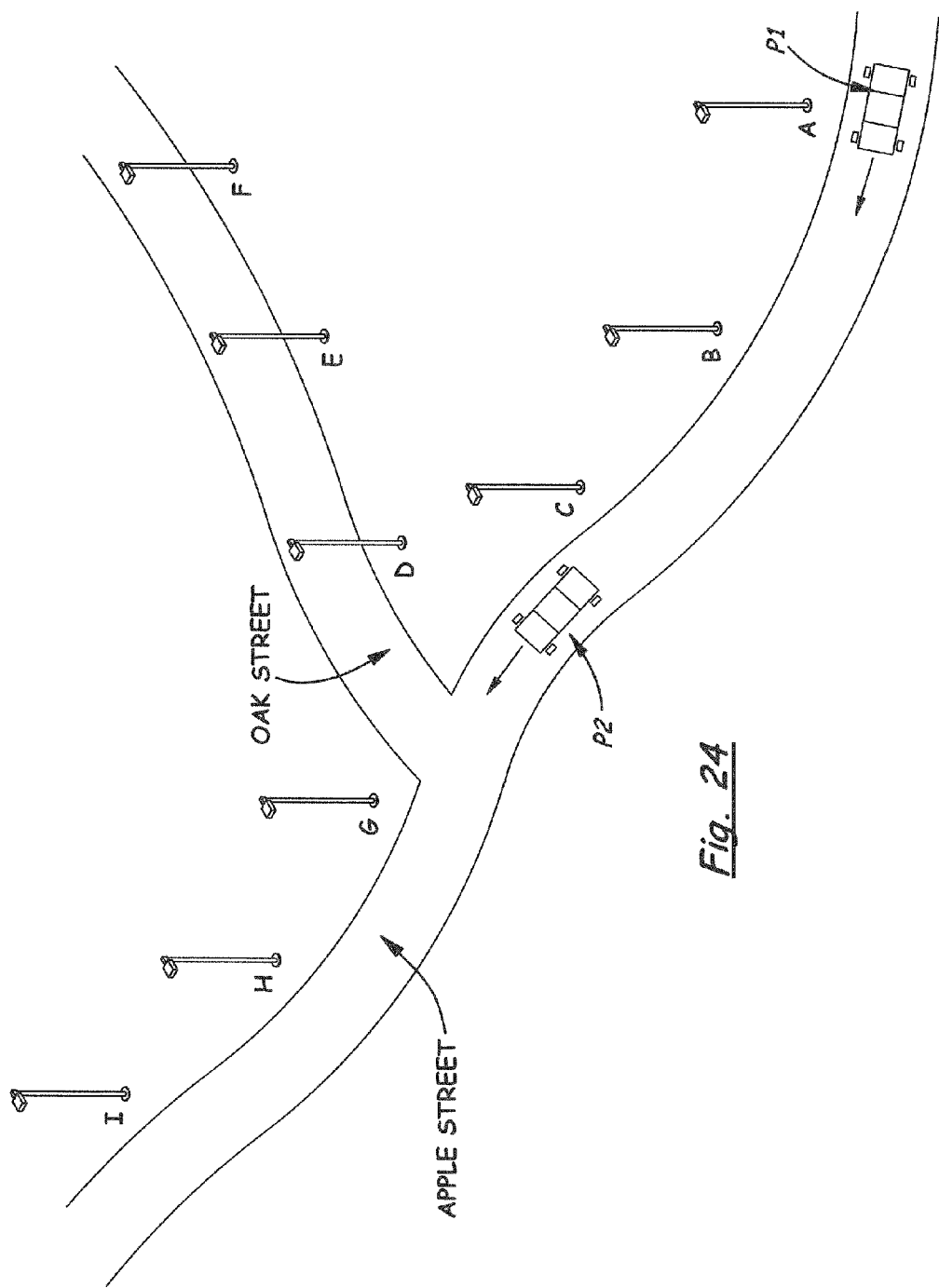
FIG. 24 is a schematic of a "look-ahead" traffic lighting system according to one embodiment of the invention.

One of many applications for a wireless independent and intelligent network according to the invention is illustrated in FIG. 24, wherein the network and its devices are used for anticipatory control of lighting. For example, the wireless intelligent outdoor lighting system (WIOLS) may comprise anticipating the direction to be traveled by an object or human. Motion sensors on the WIOLS along a road can detect the direction that a vehicle is traveling and light the next few neighboring lights in the direction of the traveling vehicle (while leaving other light off or dimmed). At intersections, lights in any viable direction for travel are lit until the vehicle has begun travel along a particular route from that intersection, at which time the lights ahead of that vehicle light up while the other routes dim or are turned off. Similarly, in a parking lot or a park, motion sensors on the WIOLS can detect the direction that a person is traveling and light the poles in the direction that the person is moving, or create some other illumination pattern that promotes safety, alertness, or other desirable goals.

Referring specifically to FIG. 24, when a vehicle is in Position P1 traveling along the street, the motion sensors in/on poles A and B allow the intelligent network to determine the direction and speed of travel. Lights A and B are immediately illuminated. Lights C and G are illuminated ahead of the vehicle, lighting its way ahead of its path of travel. As the vehicle approaches the intersection (Position P2), lights D and G are illuminated, anticipating the direction of travel along one of the two streets. If the vehicle turns and begins to travel along "Oak Street", then poles E and F are illuminated. If the vehicle continues to travel along "Apple Street", then poles H and I are illuminated. Once the vehicle has traveled beyond the lighted path of travel, the poles are dimmed down to the low light level or turned off until the next event sensed by the motion sensor. In this scenario, poles/lights A-I may be considered individual nodes in a wireless mess network, wherein typically all but one are slave poles/nodes, and said one is a master. Thus, poles/lights A-I will preferably all be part of a single mesh network and the network may communicate with a control station via the master pole/light, as schematically portrayed in FIGS. 19-23B. The selection of which poles/nodes are adapted to be the slaves and which is adapted to be the master may be done according to various criteria, including optimal location for the master pole/nodes cell or satellite communication with the internet, and/or proximity to support and maintenance structure, for example. It may be noted that "on-pole" refers to actions that are specific to one pole (the pole itself) that do not relate to other poles. For example, motion sensed at a single pole in a parking lot will increase the light level for just that pole, and does not involve other poles. It may be noted that "across-poles" means that a series or group of poles are involved, for example, a series of poles along a street. As a car passes at least two poles, the motion information (speed, direction of travel) must be communicated to the other poles along the street in order to 'light the way' ahead of the cars travel path.

In an outdoor public lighting system, it can be desirable for individual outdoor lighting nodes to behave in an interdependent manner. A damaged or missing light needs to have that status communicated to a central control, so that repairs can be made or adjacent lights can temporarily compensate for the missing/damaged light. For security reasons, a specific activity in a certain location within the array may cause a particular node to change it parameters (i.e. adjusting luminosity or sending out some sort of communication) triggered by motion sensors, etc. Also during times of transition between light and dark (i.e. dawn and dusk), it is desirable to control of the array of lights as a group to adjusts the luminosity with respect to the ambient lighting conditions. In addition, public outdoor lighting arrays, such as in preferred embodiments of the WIOLS, form a ready-made wireless infrastructure, and are ideally suited to wireless communication for public safety, or with the proper protocols and security, for public access to the internet. Such adaptations, for example, public safety communication for alarms and/or signaling to the public, and/or public access to the internet, may be provided by fitting one of more nodes/devices/poles of the WIOLS with supplemental equipment, such as alarm speakers, electronic signage, and/or internet "Wi-Fi hot spot" hardware and software.

When combined with an energy storage device, a wireless intelligent outdoor lighting system (WIOLS) can also respond to power outages when connected on the grid to create an uninterruptible power supply (called herein "UPS"). The WIOLS detects the loss of grid power and communicates with the utility company to determine how to place power from the energy storage device back onto the grid. The WIOLS can also act as a UPS in a small localized energy grid, eliminating or supplementing backup power generators. The behaviors would be similar to that on the larger power grid.

Therefore, the preferred embodiments comprise adaptations for independent processes, such as independent monitoring, control, and output (light, alarms or other communication, etc.), which independent comprise sensing, communication and control only between the nodes/devices/poles of an individual WIOLS. When adapted and operating in this independent mode, the preferred array may be considered an independent array and/or an independent network of nodes.

In addition, the preferred embodiments comprise adaptation for non-independent processes, such as communication between the master node/device/pole of the WIOLS and a control station. Preferably each of the preferred light poles employs batteries, recharged by solar panels, that may be used to transmit signals to multiple of the other slaves, and the master preferably also employs a battery(ies) to transmit signals to a remote location. Thus, an important and novel features of the preferred embodiments is that multiple poles of a single network comprise equipment and programming on or in the pole that adapts said multiple poles of a particular WIOLS to communicate with each other. This independent communication between the light poles of each WIOLS create the "independent" feature of each WIOLS, in that at least one, and preferably several, sensing and control tasks are handle between the multiple poles without requiring control from the control station. The preferred WIOLS each also have a self-discovery feature for self-identification of new nodes and integration of the new nodes onto the network. The especially-preferred nodes/devices/poles of each WIOLS are each powered by a battery and can use solar panels to recharge the battery. Preferably, each outdoor light of the WIOLS has a wireless modem and controller forming a wireless network, for monitoring and control of its devices to allow for adjustment for low battery conditions and the ability to measure excess power generated by the devices to be placed back on the grid, for example, for being applied for a credit to the account. Optionally, the master node/device/pole, as described above, may also communicate to, or receive from, the control station information and instructions about said low battery conditions and/or excess power. Outdoor lighting arrays, particularly in public settings provide a ready made wireless infrastructure, since nearly all municipalities and many public roadways utilize light poles. In such settings, it is desirable for individual outdoor lighting nodes, within an array of outdoor lighting, to behave in an interdependent manner. It is also desirable for the lighting fixtures and/or devices connected to these outdoor light poles to behave in an intelligent manner to enhance security and safety, while minimizing energy costs. In addition, because public outdoor lighting arrays form a ready-made wireless infrastructure, they are ideally suited to wireless communication for public safety, or with the proper protocols and security, for public access to the internet.

The main components of the preferred WIOLS are the master and slave outdoor lighting devices and the server at the control station. The slave device consists of a outdoor lighting structure with lighting fixture, network board with a micro controller, power supply, electronics as required for the mesh network, and zero, one or more devices that act as sensors or active devices. There is also a wireless modem "on-board" each slave device. An AC to DC power supply connects it to an AC system if available. If no power is available, a wind generator and/or a solar collector powers the system. Power can be stored to an energy storage device, such as a battery, capacitors, fuel cells, or devices that store and release hydrogen.

The master wireless outdoor lighting device has all of the same components as the slave device with the addition of a cell or satellite radio. The cell or satellite network is already in place, which provides the wireless communication to the control station.

The outline below lists some, but not all, of the preferred features/options that may be included in various embodiments of the WIOLS invention. Following are preferred "supportability" features:

1.1 It is preferred to include, in the WIOLS wireless controller/programming, a method for separation of operational parameters from code, with the following preferred features:

1.1.1 All operational parameters that affect how the systems and algorithms behave are abstracted out of the code, leaving behind variables in the code that are evaluated at system start;

1.1.2 Operational parameters are stored separately from code in a profile that is easily read and processed by the code;

1.1.2.1 Said profile should be easy to replace in its entirety;

1.1.2.2 Individual values for operational parameters in said profile should be easy to replace;

1.1.3 On system restart or reset, all systems and algorithms flush their values for operational parameters then re-read and re-process operational parameters from the profile;

1.2 A method for an operator or maintenance personnel to reset the device at ground level (i.e. standing on the street), like a reset button. Pushing this button is the equivalent to power cycling the system, which causes all hardware, firmware and software to re-initialize, re-read and re-process all operational parameters;

1.3 A method for indicating device system status, like a 3-color light or set of lights (e.g., green, yellow, red) at ground level that conveys one of three states: operating properly, operating but there is an issue needing attention, and not operating. This provides ground level feedback regarding whether to push the reset button as well as whether or not pushing the reset button resolved the issue.

1.4 As another example, the processor may blink and/or strobe an error code via the primary illumination device of the lighting system to indicate the determined error condition. In an environment where the lighting system is employed as a street light or other lighting pole, a passing pedestrian and/or motorist may notice the error code and notify the relevant lighting system operator. The operator may then dispatch maintenance and/or repair persons to correct the error condition. In addition, by employing the primary illumination device of the lighting system to indicate the determined error condition, error conditions signaling capability may be provided without additional components and only minimal increase in system complexity.

1.5 A method for providing a ground-level memory card reader (e.g., CompactFlash™, SmartMedia™):

1.5.1 Memory card reader is bootable, meaning that, on reset, the card reader is checked for a set of operational parameters and if they exist, these operational parameters are used instead of any others that may be onboard;

1.5.2 System logging persists on a memory card in the ground level slot so that the card can easily be replaced, with logging data taking back for more thorough analysis than can reasonably occur in the field; and 1.5.3 Amount of memory for operational parameters and logging is easily increased by replacing lower capacity card with higher capacity card over time.

1.6 Methods and algorithms are used that create modularity of systems on the device in order to:

1.6.1 Facilitate unit testing as the number of components increases;

1.6.2 More easily enable in-field, black-box replacing as a cost-effective support strategy in the field; and 1.6.3 So that replaced modules are sent back to the manufacturer or certified service representative for troubleshooting, repair and recirculation.

1.7 Methods and algorithms are used to enabling an expandable bus architecture on the device to enable in-field hardware feature expandability over time (e.g., new sensor, high bandwidth radio, video camera).

Following are "Wireless Networking & Control" features that are preferably included in various embodiments of the WIOLS invention:

2.1 The following features are preferred "on-pole", that is, on EACH individual POLE or on a plurality of poles in the wireless network:

2.1.1 Algorithms to perform all functions in above through a wireless network and set of commands and protocols.

2.1.2 Preferably included "on-pole" for event management:

2.1.2.1 Algorithms for monitoring and storing discrete and continuous triggers, interpreting triggers and translating them into events to be published;

2.1.2.3 Algorithms for subscribing to and receiving events with specified attributes as a way of performing a task in response to a published event;

2.1.2.4 Algorithms for interpreting one or a collection of conditions, assessing their severity and then determining whether a warning or error condition exists;

2.1.2.5 Algorithms around scheduling jobs at predefined times and/or with predefined frequencies to perform tasks; and 2.1.2.6 Algorithms enabling the way an event is treated throughout the system to be dictated by the classification and characteristics of the event itself.

2.1.3 For joining a network and self-organizing:

2.1.3.1 Algorithms for initialization processes that include broadcasting across frequencies and channels to find other devices within range; and 2.1.3.2 Algorithms surrounding whether to join an existing network versus creating a new network in response to other devices located within range, their functions within the network, their capabilities and the breadth of the networks they share.

2.2 The following features are preferred to be "Across-Poles" (that is, between multiple poles):

2.2.1 Algorithms around how, where, and how redundantly to register a device's capabilities on a network;

2.2.2 Algorithms for determining connectivity issues on the network, routing around issues, repairing issues and reestablishing routes once repaired;

2.2.3 Algorithms for favoring efficient routing, penalizing inefficient routing and adjusting both over time based on changeable definitions of efficiency;

2.2.4 Algorithms for locating and sharing resources on the network as resource availability and location changes over time;

2.2.5 Algorithms for securing the network against unauthorized "network joins" and ensuring intra-network communications cannot easily be intercepted and interpreted;

2.2.6 Algorithms for using monitoring events across a population of devices to determine a coordinated action to take like lighting the way ahead of a walker along a pathway or turning on a video camera based on triangulation of multiple device motion sensors, such as:

2.2.6.1 Algorithms that detect motion (direction and velocity) and estimate the future direction and location of the moving object as a function of time; and 2.2.6.2 Algorithms that activate devices based on the anticipated location of the moving object per the algorithms in (i.e. turning on or brightening lights or turning on/waking up security cameras ahead of a moving car or moving person).

2.2.7 Algorithms for aggregating events over populations of devices, rolling up event information based on criteria, interpreting low-level event information and using it to create new higher-order events;

2.2.8 Algorithms for determining the location of a device based on known fixed locations and triangulation of multiple device radio signals;

2.2.9 Algorithms that allow poles in a network to look for and sense different sensors that come into range of the wireless sensor(s) on the poles;

2.2.10 Algorithms that allow poles in a network to identify and categorize the different types of sensors that come into range of the wireless sensor(s) on the poles;

2.2.11 Algorithms that allow poles in a network to communicate with the different types of sensors that come into range of the wireless sensor(s) on the poles; and 2.2.12 Algorithms that allow poles in a network to activate certain function on the different types of sensors that come into range of the wireless sensor(s) on the poles.

2.3 Regarding Content and Information Delivery (for example, gathering of weather or other information from networked devices by communication from one of more nodes/poles of a WIOLS to the control station, and/or providing messages, advertising, and public information that may be communicated from the control station to one of more nodes/poles of a WIOLS and then to the public):

2.3.1 Algorithms involving securely bridging a low-power, low-bandwidth network and a medium-power, high-bandwidth network, or providing secure gateway capabilities between the two networks;

2.3.2 Algorithms for aggregating information across populations of devices and securely delivering this information through a broadband wireless infrastructure to a WIOLS-manufacturer-operated network operations center; and 2.3.3 Algorithms for guaranteed or best-efforts delivery of information to the network operations center based on the classification of the information.

2.4 Regarding Management that may be preferred and/or necessary for the business of operating and maintaining a WIOLS:

2.4.1 Algorithms around creating and managing user/customer accounts and passwords with associated roles and permissions that span different kinds of customers as well as the needs of the WIOLS manufacturer itself;

2.4.2 Algorithms that enable authentication of individual users to specific accounts and roles with associated permissions, and that track failed authentication attempts for intrusion detection security;

2.4.3 Algorithms for authorizing individual users/customers to access and use only their devices and associated data;

2.4.4 Algorithms for detecting when security might be compromised anywhere in the system and taking action once security is believed to be compromised such as locking out a user or customer, denying access to devices or data, locking out parts of the system globally or by customer and flushing all security keys requiring re-initialization throughout the system of all security subsystems;

2.4.5 Algorithms for creating sets of devices that meet pre-defined conditions then proactively and remotely managing these devices including resetting, updating firmware, updating operational parameters, triggering on-demand information delivery, troubleshooting issues, overriding operation for prescribed periods of time, etc.;

2.4.6 Analytical algorithms that operated on aggregated information at the WIOLS manufacturer's network operations center and provide customers with all manner of operational and environmental insights;

2.4.7 Algorithms that allow a network of poles to manage power being pulled from the power grid or placed back onto the power grid, such as:

2.4.7.1 Algorithms that allow a network of poles on the grid to put power onto the grid a desired times, either as certain criteria are sensed and met on the grid, or via a command from a central command center or a Network Operation Center (NOC); and 2.4.7.2 Algorithms to draw power from the grid at desired times, as certain criteria are sensed and met on the grid, or via a command from a NOC.

2.4.8 Algorithms to vary the control signal to the load(s) to test its operation (i.e. to test the ability of the light to run full brightness and dim down to various dimming levels).

2.5 Regarding community assistance and relations, or advertising to the community:

2.5.1 Algorithms relating to advertising and other information that may be announced and/or displayed on one or more of the nodes/poles of a WIOLS, preferably powered by renewable systems and energy storage systems that are also powering lights for the community:

2.5.1.1 Methods for leveraging the convenient locations of street lighting and the surface area provided to offer advertising inventory;

2.5.1.2 Methods and algorithms for providing programmable inventory on a pole that includes advertising inventory and time-based rotation of ad inventory;

2.5.1.3 Methods and algorithms for selecting collections of poles that meet various criteria (e.g., location, amount of foot traffic based on motion triggers, average monthly temperature) and then delivering programmable ad inventory to poles meeting the criteria;

2.5.1.4 Methods and algorithms for wirelessly determining additional context from a passerby (e.g., mobile device brand and service provider) and enabling more targeted advertising based on this additional context; and 2.5.1.5 Algorithms for determining the direction a passerby is heading, identifying poles in that direction and then streaming advertising across poles along the passerby's path to overcome bandwidth limitations, provider a longer and richer ad experience or both.

2.5.2 Algorithms regarding/providing Wi-Fi hotspots:

2.5.2.1 Methods for including mobile broadband routers on poles in order to offer community Wi-Fi hotspots;

2.5.2.2 Algorithms for leveraging sensor information (e.g., motion) and system parameters (e.g., time of day, available battery energy) to enable or disable Wi-Fi hotspot capability; and 2.5.2.3 Methods for enabling/disabling and changing the behavior of Wi-Fi hotspots remotely, from a network operations center.

2.5.3 Algorithms regarding/providing financial transactions:

2.5.3.1 Methods and algorithms for securely receiving, aggregating, uploading and reconciling financial transactions from RF devices within range.

Peak Load Delay Energy Conservation System:

The main objective of one group of preferred embodiments is to provide a system to delay or off-load electrical energy usage to hours of the day when load on the utility grid is lower. Specifically, these preferred embodiments have an integral battery or other energy storage system that is recharged by the electrical grid during off-peak load times of the day. The stored energy in the batteries or other energy storage system can be utilized to provide power to the grid during peak load periods and/or to provide power to a light or other electrical device on or near the preferred embodiment during peak load periods. The stored energy in the batteries or other energy storage system may optionally provide power to said light or other electrical device during power outages.

Optionally, the system/device may be "autonomous" in that it may be powered by an integral renewable energy collection system such as a solar collector and/or wind energy device. The integral solar collector, wind energy and/or stored energy in the batteries or other energy storage system may be utilized to provide power to the grid during periods. Also, in such autonomous embodiments, the device may then be "self-powered" during prolonged periods of power outage.

These preferred embodiments may be accomplished by integrating the battery or other energy storage device and other necessary system components (described below) into the light fixture itself so that it can be installed as a complete unit to an existing or new pole. Alternatively, some or all of said battery or other storage device and/or other necessary system components may be manufactured and installed separate and/or distanced from the light fixture, for example, when a new pole is provided with some or all of this equipment inside the pole or inside the base below the pole.

Some, but not all, of the modes of operation of these preferred embodiments may be described as follows. Each night during peak load periods, when it first starts to get dark outside, a photocell turns on the light, which is powered by the energy storage pack (including said battery(s) and/or other storage system), so that no electrical load is added to the grid during peak load periods. Once the peak loading time period has passed, the light will then continue to be powered by the energy storage pack, however, the batteries will then be charged by the line voltage (grid) during the time period when peak loading is no longer an issue (in the early morning hours, for example) via the energy storage pack charger. The LEDs, control board and all other system components are operated on DC voltage. The energy storage pack preferably only needs enough power to carry the light thru the peak loading period for one night (typically only 3-4 hours post dusk), but, optionally, may be designed for enough power to provide power to the grid during said peak loading period. The energy storage pack will then be charged in the morning for later use that evening or night.

Additional features may be added, for example, dimming capability to reduce the light output after the first hour. Such a dimming capability, for example, may allow the light to have a much higher lumen output when it first turns on & then dims it down as the night progresses and less light is needed. Another option is to include a motion sensor over-ride that will immediately turn the light back up to full brightness when motion is detected near the pole, for example, motion of a person, a bicycle, or a vehicle. Both of these features allow the light to be "tuned" to the specific application requirements and to conserve as much energy as possible. This will allow the energy storage pack to be as small as possible to reduce costs and to reduce the size and weight of the fixture.

The additional feature of having a wireless control board, for example as described earlier in this document, allows the settings on the light to be changed remotely and allows for the fixture system performance to be monitored remotely. For example, the power company may check to see how each of the lights are performing and confirm that the light is running off of battery power for the full amount of time required for the peak loading period. The owner of the light may check the status of all system features, the battery health, and whether any maintenance items need attention, for example, LEDs that need to be replaced and battery chargers that are not working properly, etc.

Solar powered light poles and/or specially-adapted LED light fixtures, as described earlier in this document, and/or other solar collector light systems, may be used in embodiments of the WIOLS described herein. Major energy contribution is provided by said solar collectors, and therefore typically such poles/lights need only be connected to the grid and controlled/monitored remotely so as to properly manage the luminosity and power during the peak load hours and then to ensure that the energy storage pack is recharged during off-peak hours. This "insurance", of being connected to the grid, may be particularly beneficial in cloudy climates, during inclement months, or where the grid needs can benefit from the solar-collected power during peak load times.

When the energy storage device holds a sufficient amount of energy, this system can also respond to power outages when connected on the grid to create an Uninterruptible Power Supply (UPS). The intelligent outdoor lighting system detects the loss of grid power and communicates with the utility company to determine how to place power from the energy storage device back onto the grid. The preferred intelligent outdoor lighting system can also act as a UPS in a small localized energy grid, eliminating or supplementing backup power generators. The behaviors of the intelligent outdoor lighting system for a small localized energy grid would be similar to those for the larger power grid.

Figure 25:
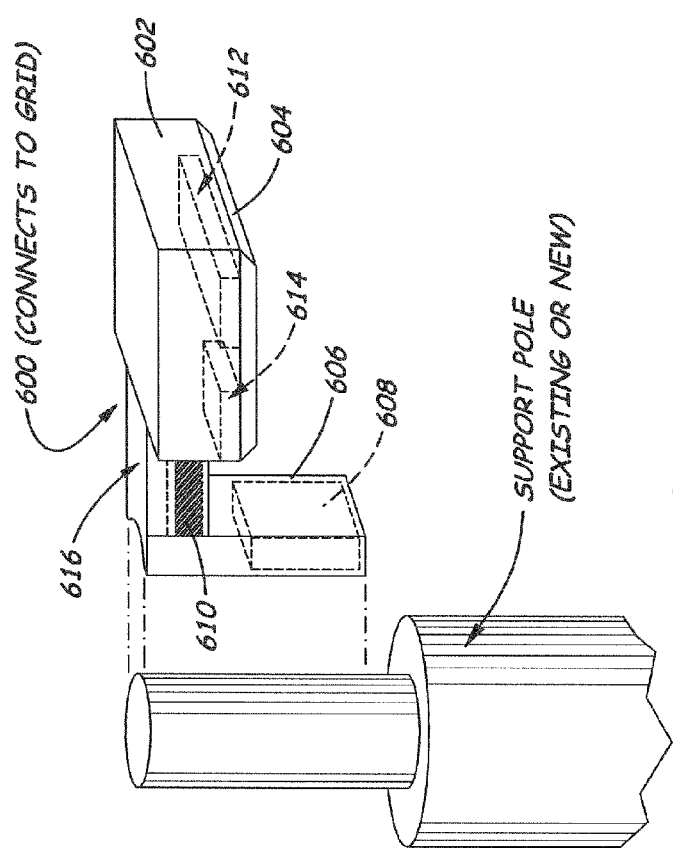
FIG. 25 is a schematic of one lighting unit that may be installed on a pole for one, but not the only, embodiment of a peak load delay energy conservation system, wherein said lighting unit does not comprise a solar panel due to the pole/unit's cooperative connection to the electric grid. In alternative embodiment, as discussed later in this document, such pole/units may also comprise a solar panel or other renewable energy source for generating energy but wherein said pole/unit may also cooperate with the grid.

An example of one peak load delay conservation system that uses an integral light, storage and control unit 600 is schematically portrayed in FIG. 25, wherein said integral unit 600 comprises the following elements listed by call-out number: fixture box 602, such as "shoebox" or "cobrahead" or other standard or custom light fixture housing or body; lens 604 connected to said box 602; fixture arm and/or bracket 606 to mount fixture to pole; energy storage pack 608, which may comprise batteries or other energy storage apparatus; energy storage pack charger 610; LED light engine 612, which may be of various designs, but is preferably the modular LED system described elsewhere in this document; motion sensor & photocell 614; and control board w/wireless modem and/or cell phone radio 616. While such integral units are preferred, it will be understood by those in skill in the art reading and viewing this document and its figures, that peak load delay conservation systems according to embodiments of the invention could also be installed on existing or new light/equipment poles with the elements called-out for FIG. 25 being provided in separated housings and/or in spaced-apart locations on the pole.

Those of skill in the field of electrical grid management will be able to construct systems that detect peak load periods on the grid and/or that detect when loads exceed a predetermined level in smaller power grids such as a residence, that control electrical devices to reduce power demand and/or that use power from stored power sources (such as batteries) to supplement power demand during periods of peak loads. After reading this disclosure, those of skill in the art will understand how to recharge, during off-peak hours, the energy storage devices (preferably batteries) of the preferred outdoor lighting systems of the invention, and how to monitor power being fed back to the grid from autonomous lighting systems according to embodiments of the invention, so as to bill energy credits to the utility company.

A particularly important feature of the preferred embodiments that may be autonomous (that may be powered by a source other than the grid) and that may also cooperate with the grid, is that the preferred embodiments provide power from their energy storage devices to the local electrical device (light or other local component) specifically during times of peak load on the grid and also manage the power between the energy storage device and the local electrical device (light or other local component) to ensure adequate power to that local electrical device during said peak load hours. The management system is adapted to store energy when possible and use the stored energy in an efficient and controlled manner during peak load hours. This way, demand on the grid during those peak hours is reduced, and local devices (lights, alarms, and/or security cameras) that must be turned on for public safety and security are indeed turned on and adequately powered. This management of power to the local electrical device (light or other local component) during the grid's peak load hours enhances the autonomous characteristics of the preferred embodiments. These management features may be included in systems that do not have self-power capability, that is, wherein the energy storage devices are charged by the grid during non-peak-load hours. These management features may be included in systems that are self-powered (i.e. through solar and/or wind), wherein the energy storage device is charged by the solar and/or wind systems (and optionally by the grid only during non-peak hours), with the added features that the self-powered systems may feed power back to the grid during peak-load hours and/or assuming there is sufficient self-power production for powering the public-safety- and security-related local devices.

Autonomous Connected Devices:

Many of the invented lighting networks, with or without additional or alternative powered equipment (such as alarms, Wi-Fi hotspots, advertising or public information dissemination, for example) are autonomous, in that they may be powered by preferably renewable energy sources and, therefore, may be separate from and not dependent or co-operational with the electric grid, or they may be self-powered during at least part of the time but may also cooperate with the grid to provide energy to the grid and/or accept energy from the grid only at certain times. Such Autonomous Connected Devices (ACD) combine a solar engine, for example as described elsewhere in this document, with a smart wireless mesh, such as described elsewhere in this document, for example, in the section Wireless Intelligent Outdoor Lighting System (WIOLS). Much of the apparatus shown in previously-discussed figures of this document may be used in the ACD's, for example, FIGS. 1-17 and 19-24, as will understood from the descriptions and discussions of those figures; additional apparatus and methods are discussed below.

ACDs may be especially beneficial in remote areas and rural settlements, municipalities, housing associations, industrial complexes, developing countries, or other entities or regions that have no option to connect to a grid, want/need to have no connection to the grid, or want substantial autonomy but are willing to cooperate with the grid by supplying the grid with energy some times and accepting energy from the grid at other times. One group of embodiments of the latter category (self-powering combined with cooperation with the grid) is described in the section "Peak Load Delay Energy Conservation System" earlier in this document. While the preferred ADC's are powered by solar engines (solar panels and/or other solar devices), wind-powered engines may be used instead or in addition to the solar engines.

It will be understood that many features of the ADCs overlap with the features of the WIOLS, as a WIOLS is the preferred form of monitoring and controlling a ADC network but WIOLS technology may be applied in either ADC's or grid-dependent devices. In addition to providing lighting to entities or regions such as are listed above, ACD's, and their WIOLS, may provide one or more of said powered equipment, including devices to provide "content services" such as information gathering (or weather conditions, fire or floor conditions, etc., or information dissemination such as advertising or warnings in the form of digital or other visual displays or audible announcements. Thus, Autonomous Connected Devices (ACD) combine a solar engine providing self-contained power with as smart wireless mesh for connectivity and content services to enable new social and business models to be built from populations of devices.

The preferred solar engine collects solar energy using photovoltaics, controls the flow of solar energy, stores solar energy for optimal use, and delivers energy at the right voltage and current to devices. The smart wireless mesh that is preferably used to connect said ACD organizes itself, repairs connectivity issues automatically, communicates data seamlessly, and cooperates in group activities.

An ADC network may be used to aggregate information widely, monitor issues remotely, manage operational excellence, and analyze behavioral & environmental trends over large geographies, so that said analysis may be shared with customers and/or the public.

ACD devices benefit from being autonomous yet connected. For example, a population of remotely managed street and area lights according to ACD embodiments, may be economical and effective where the cost of trenching to deliver power is cost-prohibitive. Grid-neutral outdoor lighting may be installed, according to embodiments of the invented ACD networks, that offsets wired energy usage by collecting, metering and returning solar energy to the grid, for example according to the Peak Load Delay systems described earlier in this document.

Examples of ACD applications, features, and benefits may include:

1. Remotely monitored & managed, grid-tied LED retrofits that may provide a remote physical security installation with light, video, security gate and sensor fencing.
2. Ubiquitous broadband internet access provided preferably by multiple of the poles in an ACD network.
3. Power, light and internet access for third world village libraries.
4. Lighting, Wi-Fi hotspots, and video cameras on poles of a single ACD network;
5. Monitoring & management allowing operational and environmental data gathering over wide areas of network apparatus and/or wide areas of land, therefore allowing alerts, inventory control, and information dissemination not previously possible in such an efficient and accurate manner.
6. New social & business models possible by using the invented ACD, as information gathering, information dissemination, and energy and internet access may be available to more people and more efficiently and accurately.
7. Simplicity and adaptations that allow off-the-shelf components to be used in the ACD.
8. Employing of "smart" data and "dumb" code.
9. Keeping components separate, loosely bound and stateless.
10. Comprising a secure, low-power backhaul for monitoring & management of diverse populations of devices.

11. Aggregates operational & environmental content across wide geographic areas using ubiquitous infrastructure elements like light poles.
12. The preferred solar engine employed in ACD networks generalizes solar collection, power management, energy storage and power delivery.
13. Manufacture and install-time power delivery configuration (e.g., voltage, current, wiring harnesses).
14. Maximize energy budget over time by optimizing solar collection via optimizing the PV "skin" plus charge controller, and by smart usage profiles via optimizing sensors plus control board plus algorithms.
15. Granular operational data, including PV, charge controller and battery metrics, and consumption metering of device activities, including dumping energy back onto the grid.
16. Remotely updatable firmware & profiles.

Figure 26:
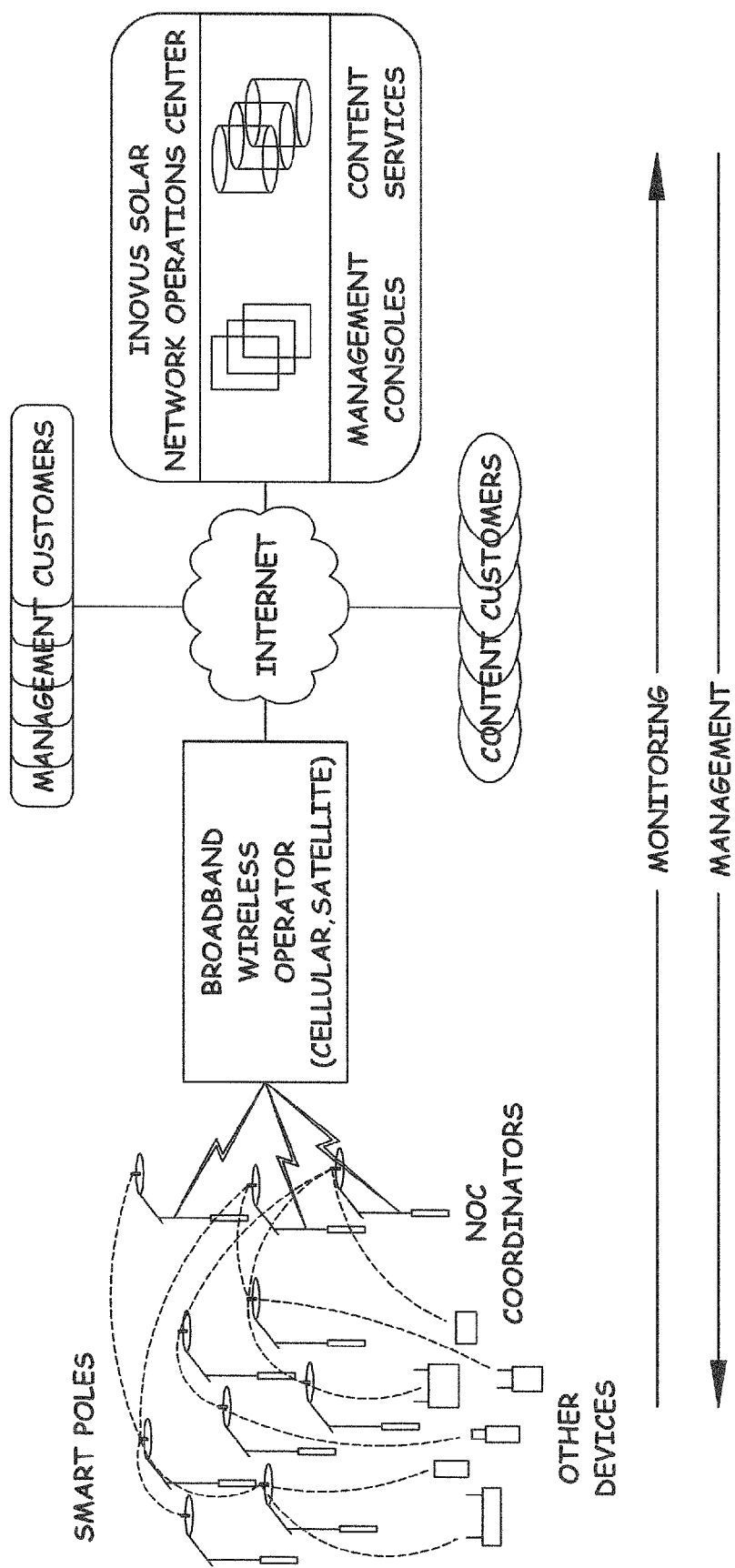
FIG. 26 is a schematic that portrays the general architecture of the preferred population of light poles and other device on or near the light poles and the preferred network according to one embodiment of the invention. The devices at the far left of the figure are devices powered by the solar engine; secure two-way communication is provided by the smart mesh from the far left of the figure to the far right of the figures; and wide-area aggregation of data/information is performed by content services and provided to customers by the Network Operations Center (NOC) at the far right of the figure.
Figure 27A:
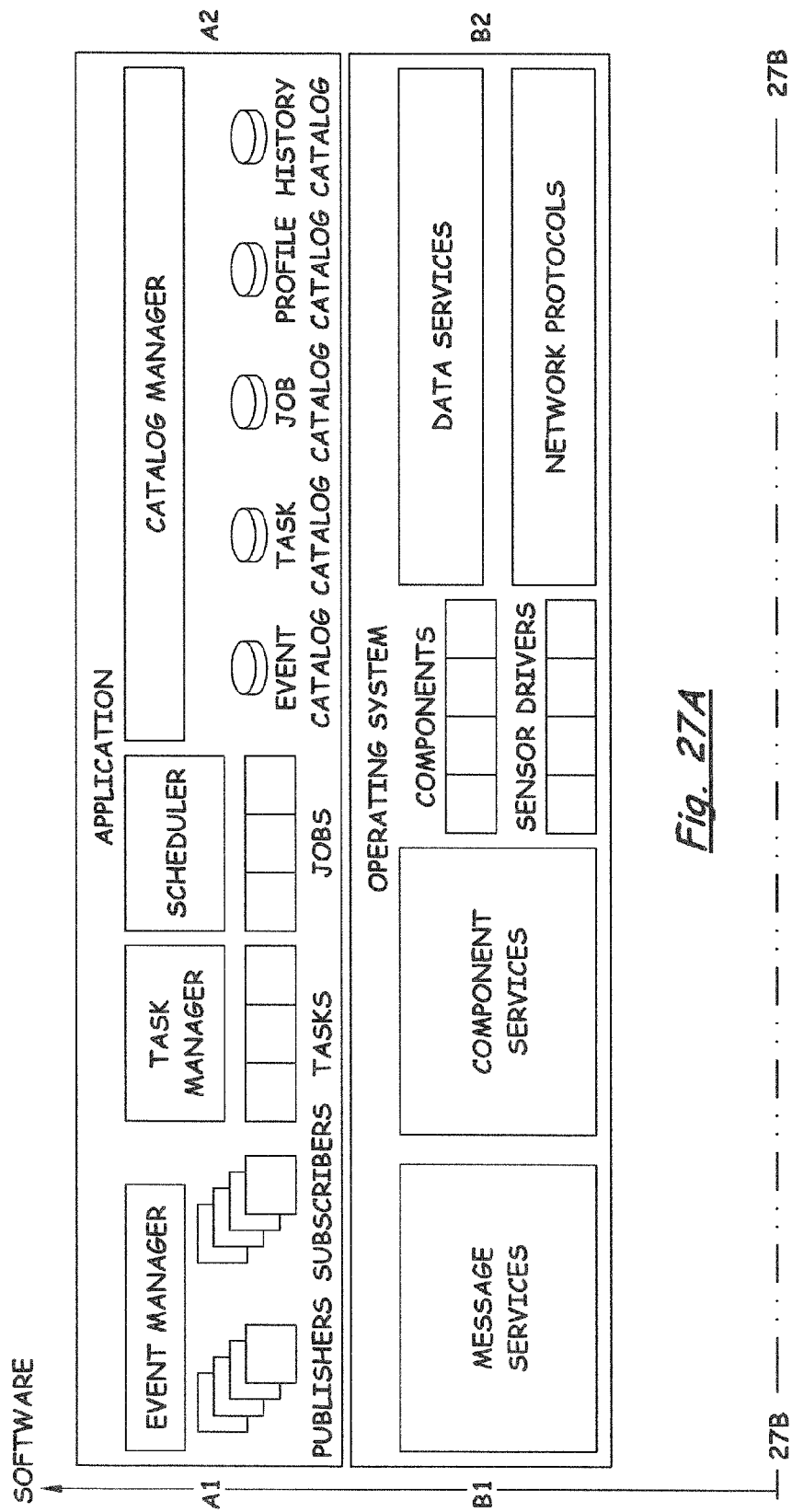
FIGS. 27A and B are a schematic that portrays various "layers" of the preferred embodiments of the invented array and network systems.
Figure 27B:
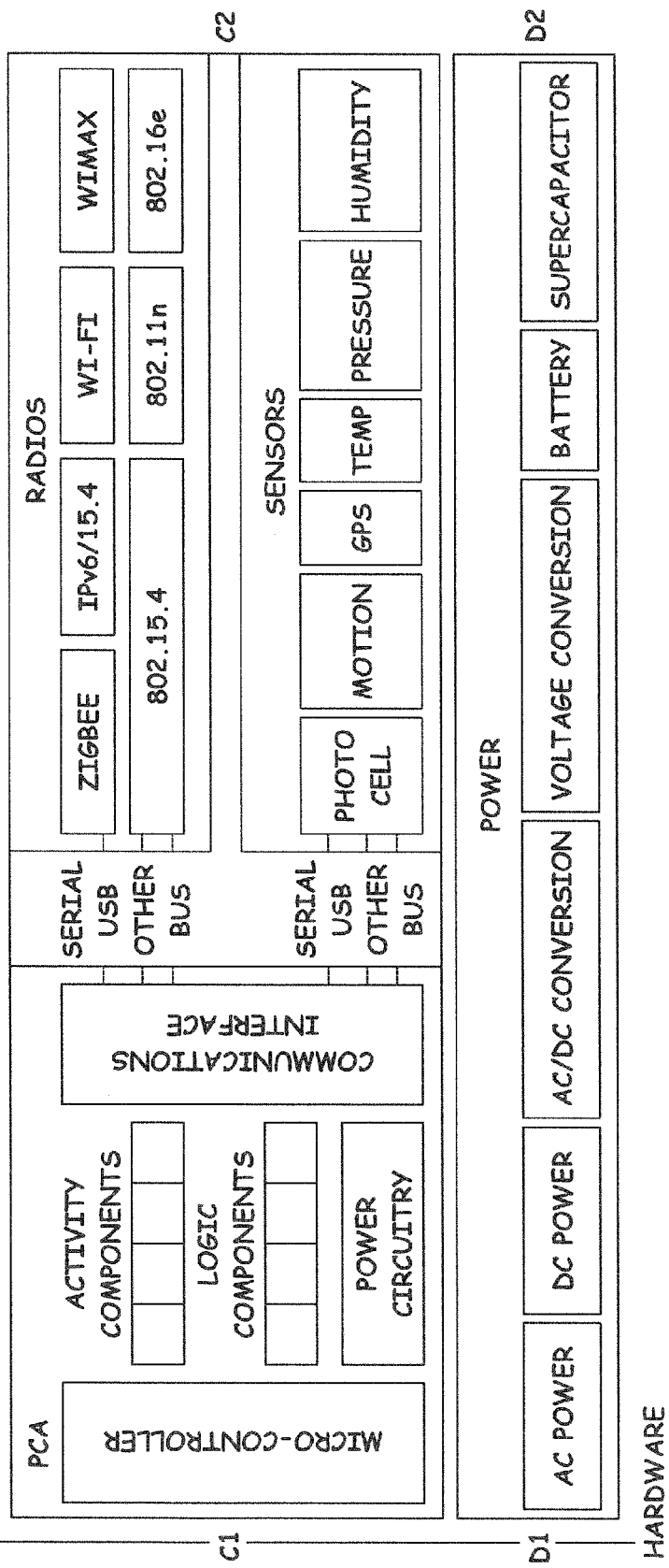
Figure 28:
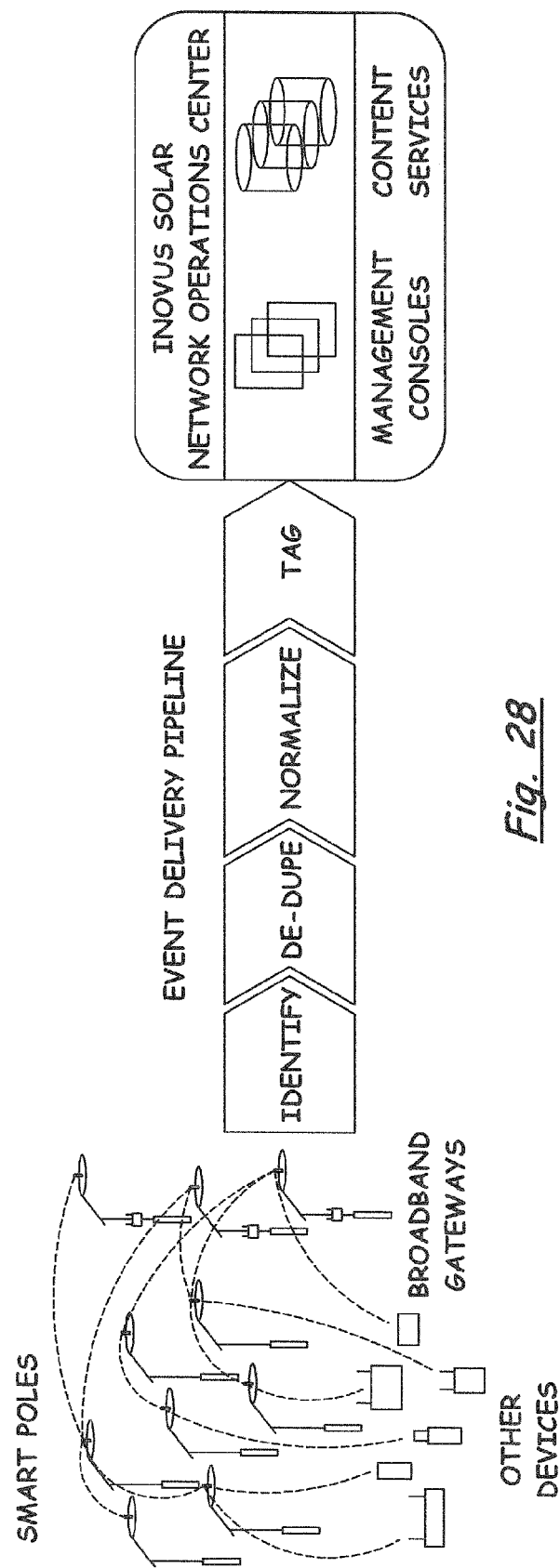
FIG. 28 is a schematic that portrays an "Event Delivery Pipeline" according to one embodiment of the invention.

As portrayed in FIG. 26, the preferred ACD system architecture comprises devices that are powered by the solar engine, either on-pole, near-pole, and/or in the general vicinity of the preferred wireless communication from the pole. Secure two-way communications between the poles and the NOC coordinator poles (for example, master poles) and the Internet and/or headquarters (for example, control station) are accomplished by a "smart" mesh network. Both content customers (such as weather service or traffic planners, for example) and management customers may receive content via the Internet.

An ACD needs power, performs activities (e.g., lighting, Wi-Fi, video) makes decisions, monitors operational and environmental data and participates in collective behavior. As portrayed in FIG. 27A and B, the preferred ACD system may be described as having an Application Layer (A1) (e.g., power profile applications, light-the-way applications, grid neutral metering, which utilize on-device and collective intelligence algorithms (A2). Also, the preferred ACD system has event Driven OS w/Driver Abstraction (e.g., TinyOS) (B1), which utilizes unique event-driven device drivers for device capabilities (B2). Also, the preferred ACD system comprises hardware (chipsets, sensors, radios, etc) (C1), preferably utilizing a system that is flexible and expandable as the hardware evolves (C2), for example, as protocols, radios and sensors evolve. The Power Abstraction Layer (D1) of the preferred ACD system utilizes standardized and normalized power delivery (D2).

The preferred smart wireless mesh connects ACDs into a self-organizing, self-repairing mesh that enables low-power, two-way communications; remote troubleshooting and repair; system monitoring and management; environmental sensing; collective intelligence; and wide area content aggregation and analytics. Smart Wireless Mesh—Topology The "Smart Wireless Mesh Network" of the preferred ACD comprises each "population" (each networked group, each wirelessly-connected plurality of ACDs) having a Gateway Node, which performs low to high bandwidth mapping as "NOC coordinator" (the NOC being the content aggregation point across all ACDs), initiates mesh forming as "mesh coordinator", and oversees mesh healing. Each population of ACDs also has Router Nodes that aid in locating other nodes, cache data for "sleeping children" poles (hibernating or unused at the time), and that reinforce "good" paths. Each population of ACDs also has End Nodes, which feature minimal energy use, wake to connect on demand, and are activity & connection independent. Then device functionality is overlaid atop the mesh topology of Isolated Devices needing slow uni-cast connectivity for monitoring and maintenance (e.g., environmental sensors); Collective Devices needing slow multi-cast connectivity for group behavior (e.g., "light the way"); and Streaming Devices need fast uni-cast connectivity for real-time throughput (e.g., contextual advertising).

The supportability of the preferred Smart Wireless Mesh may be illustrated by response to an event such as device connectivity loss, whereafter:
1. Scheduled report-back job flags a customer's non-reporting node;
2. Service sends a device down alert to device manager's mobile phone;
3. Device ping confirms-no connectivity;
4. In-field support tech dispatched;
5. Ground-level panel opened;
6. Reset button pushed; and
7. After a short time, status lights indicate all systems are operational!

Or, after mesh connectivity lost, the response may be:
1. Report-back job indicates a mesh coordinator node is down;
2. Device in adjacent mesh is remotely repurposed;
3. End node program replaced with mesh coordinator program—OTA;
4. Device remotely reset;
5. New mesh coordinator finds orphaned nodes, reforms mesh; and
6. Support tech dispatched, resets old mesh coordinator, rejoins as end node.

The preferred smart wireless mesh is "open" yet secure, for example, the smart wireless mesh is open in that it adheres to the ZigBee protocol (i.e., IEEE 802.15.4-2006 standard for wireless personal area networks) and allows any device supporting ZigBee to join the mesh at anytime.

The smart wireless mesh is secure in that it features a quarantine (a period of time with limited connectivity while behavior is watched and deemed proper for device type, or not), for example, verified, then isolated, then meshed, then monitored, then managed. The wireless mesh comprises selectable paths, whereby the connectivity path is selected based on sensitivity of data being moved, for example, unprotected data is moved by unencrypted ZigBee over 802.15.4 (mesh forming and healing, collective behavior, for example); protected date is moved by E2E tunnel-mode VPN using IPv6 over 802.15.4 (remotely updating security keys over-the-air, change operating profile, for example).

The preferred ACDs are widely distributed and therefore, event driven. Events connect sub-systems within a single device, devices within a smart wireless mesh, the mesh network with content services in the Network Operations Center (control station). Events have triggers that percolate up through HW & OS abstractions; that are discrete (single-instance, occurring once—e.g., motion detector registers a change) or are continuous (multi-instance, streaming over time—e.g., battery current). Events are classified along three dimensions, specifically, type (info|warning|error|monitor|manage); scope (device|mesh|service|customer); and risk (low|medium|high).

The monitoring processes of the ACD network delivers service and customer scoped events from the field to the Network Operations Center as they occur, enabling alerts when predefined conditions are met to facilitate cost-effective maintenance and aggregation of operational and environmental data over large populations of devices to facilitate troubleshooting and value-added content. See the Event Delivery Pipeline in FIG. 28, wherein the box "Identify" refers to a unique device|D (identification) resolved to assembly IDs, manufacturer, installer, support, service log and customer; wherein "De-Dupe" refers to multi-path routing with delivery delays can cause duplications that get collapsed using unique identifiers; wherein "Normalize" refers to device and subsystem version differences being normalized on the way in, to maintain consistency at the NOC; and wherein "Tag" refers to metadata derived from context and route being added to events on the way in (duplicate plus alternate routes).

The management processes of the ACD network operate on sets of devices, selected at the Network Operations Center, then targeted with events delivered using the smart wireless mesh to enable remote device reset (like CTRL+ALT+DEL), whole system inventory (e.g., assembly ids, HW/SW/FW versions); data, profile & SW/FW updates over the air; and programmed tasks (e.g., stream video every night at 10 PM for 5 minutes). See the Device Management Pipeline of FIG. 29, wherein the box "Query" refers to leveraging of internet search technology to query populations of devices that meet specific characteristics; wherein "Select" refers to sorting and sifting to further refine the set of devices and creating a narrowly targeted set to select and operate on; wherein "Apply" refers to defining a task, scheduling a job containing one or more tasks then applying the job to the set of selected devices; and wherein "Verify" refers to leveraging monitoring, verifying the job and tasks were executed, events were delivered to devices, actions performed and results achieved.

As discussed briefly elsewhere in this document, "content services" may be a feature of the preferred ACD and/or other wireless network. Content aggregated across wide populations of devices, combined with the ability to reach out a touch an individual device remotely, enables services such as customer account creation, user identification, and authorization; device identification and provisioning; and account and device disablement. Also, content services are enabled that comprise management such as troubleshooting and repair, inventory control w/updatable code, profiles and data, and scheduled device or population jobs/tasks. Also, content services are enabled that comprise "visualization" features, such as overlays (Google maps, insolation, energy costs), customer dashboards w/KPIs for devices, and redistributable "widgets" for partner networks. Also, content services are enabled that comprise monitoring such as granular event logging over time, predefined thresholds with actions, and automatic actions or email/text alerts. Also, content services are enabled that comprise analytics, such as searching, sorting and refining devices by attributes, and correlating operational with environmental and location to feed back into optimizations and roadmap.

Enabling new social & business models from populations of devices requires a services system with redundant, commodity HW paradigm (like Google—i.e., 5×9's of reliability via quick healing), real-time and batch inbound processing pipeline to maintain data integrity, a presentation layer rich with visualization and Web 2.0 sharing (e.g., widgets), and data interfaces/schema for converting and then delivering data to customers in any format (e.g., XML schema and connectors for SOAP). Preferably, these services comprise location-based visualization with overlays and real-time search engine based filtering; auto and manual metadata tagging to support powerful analytics; and creating jobs w/tasks then targeting devices for delivery and execution.

ACD services are connected to the Internet, so they must be designed securely by employing a Threat Model. Such a Threat Model will comprise Assets & Risks analysis and Vulnerabilities and Safeguards analysis. Periodic Security Assessments should also be made, including intrusion detection, DoS; and independent security certification, if required by customers.

The outline below lists some, but not all, of the preferred features/options that may be included in various embodiments of the ACD invention. This outline is organized into the following three categories: features provided and/or programmed mainly, or entirely, "on device," that is, on the pole and/or the lighting or equipment unit on the pole; features of the preferred smart wireless mesh for the ACD's; and content services.

1. On Device

There is a collection of structural elements, methods, and algorithms that reside on preferably each device.

1.1 Solar Device 1.1.1 Device design elements and algorithms for maximizing solar collection capabilities:
   1.1.1.1 Relationship between pole height, location on solar isolation map and amp-hours;
   1.1.1.2 Relationship between pole diameter, location & amp-hours; and
   1.1.1.3 Relationship between PV efficiency and 1.1.5.1 or 1.1.5.2.

1.1.2 Hardware and interfaces for configuring power delivery options like voltage and current during manufacturing and/or installation to support multiple different device activities (e.g., lighting, security gate, broadband wireless.)

1.1.3 Configurable wiring harness(es) and routing to support multiple device activities powered on-device (e.g., lighting, video and broadband wireless at the top of the device, USB attachments at ground level) and off-device (e.g., security gate and sensor fence.)

1.1.4 Granular operational and environmental data logging to correlate solar collection and charge characteristics as a function of location and environmental information (e.g., average daily sunshine, temperature, pressure, humidity.)

1.1.5 Algorithms for determining when and how much energy to invert back onto the grid as a function of device operational and environmental parameters.

1.1.6 Algorithms for minimizing energy consumption as a function of device operational and environmental parameters as well as sensor triggers like photo cell and motion.

1.1.7 A separable solar engine kit that includes solar collector, charge controller, energy storage, delivery and wireless monitoring backhaul; along with all the connectors—mechanical, electrical & software/firmware interface—to enable third parties to install our solar engine on other types of devices.

Figure 30:
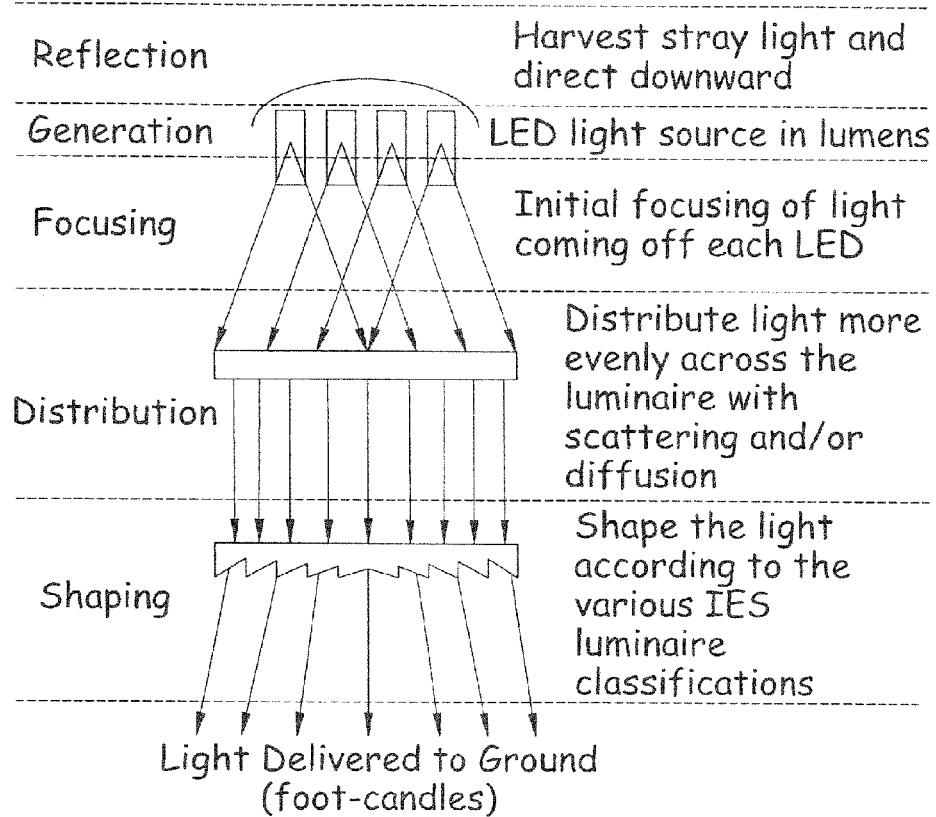
FIG. 30 is a schematic portrayal of a "Light Delivery Stack" comprising reflection, generation, focusing, distribution, and shaping, with the result being light delivered "to the ground".

1.2 Light Delivery Stack (See FIG. 30)

1.2.1 Delineate light delivery into distinct layers with unique parameters that can be independently adjusted to meet overall intensity and shape requirements cost effectively.

1.2.2 A whole-luminaire, high efficiency lens that integrates diffusion technology for smoothing light distribution where there are hotspots with Fresnel lens technology to direct light at precise wide angles to achieve standard IES luminaire distribution types I thru V and sufficient environmental protection to achieve IP65/66 approval.

1.2.3 A luminaire mounting plate with highly adjustable LED module mounts that enable cost effective, highly variable lighting patterns outside of the standard IES types I thru V, along with algorithms for how to adjust modules to achieve a given light distribution.

Figure 31:
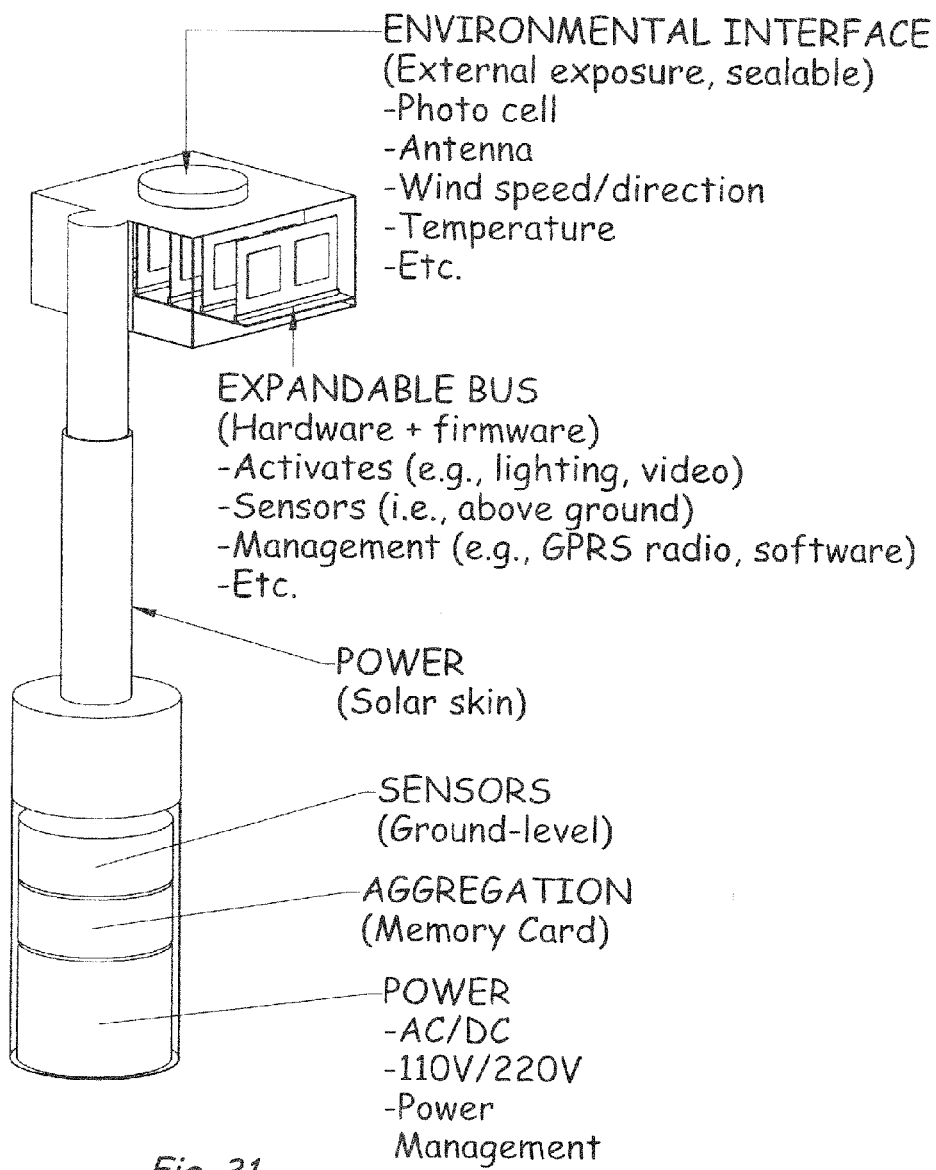
FIG. 31 is a schematic portrayal of modular approached to solar-based electricity generation in embodiments of the invention.

1.3 Modularity (SEE FIG. 31)

1.3.1 Mechanical modularity of devices that allows different activities to be attached and configured easily at manufacturing time, installation time or even in the field post install (e.g., Inovus Solar LED shoebox, Lithonia LED shoebox, shoebox lighting plus Sony internet video camera and PowerFence high-voltage sensor fence.)

1.3.2 Harness, conduit and wiring that enables batteries to be located off-board, meaning off the device yet wired into the device.
1.3.3 Well defined abstractions with interfaces to allow wireless connectivity hardware and protocols to evolve over time and be upgraded without affecting the architecture or higher-level applications relying upon this connectivity.

1.4 Diagnostics & Repair 1.4.1 Algorithms to diagnose which Energy Storage Unit pack(s) has a bad or failing Energy Storage Unit.
1.4.2 Algorithms to determine whether the Light Sensitive Device is failing or failed.
1.4.3 Algorithms to determine whether any of the Motion Sensing or Occupancy Sensing devices are failing or failed.
1.4.4 Algorithms to determine whether any of the Light Emitting Devices (i.e. LED modules) are failing or failed.
1.4.5 Algorithms to determine whether the AC/DC power converter is failing or failed.
    1.4.5.1 Algorithms to reset AC/DC power converter (either wirelessly or via hardwire connection)
1.4.6 Algorithms to determine whether the Charge Controller (device converting energy from the Power Generator to energy to be stored or consumed) is failing or failed.
    1.4.6.1 Algorithms to reset Charge Controller (either wirelessly or via hardwire connection)
1.4.7 Algorithms to determine whether the Power Generator (i.e. Solar Panel) is failing or failed.
1.4.8 Algorithms to determine whether the power inverter is failing or failed.
    1.4.8.1 Algorithms to reset power inverter (either wirelessly or via hardwire connection)
1.4.9 Algorithms to determine whether the Control Board is failing or failed.
    1.4.9.1 Algorithms to reset Control Board (either wirelessly or via hardwire connection);
    1.4.9.2 Algorithms to test various subsystems and/or subroutines on the Control Board (either wirelessly or via hardwire connection);
    1.4.9.3 Algorithms to put selected subsystems and/or subroutines in selected states (either wirelessly or via hardwire connection); and
    1.4.9.4 Algorithms to reset various subsystems and/or subroutines on the Control Board, including entire Control Board (either wirelessly or via hardwire connection)
1.4.10 Algorithms to determine whether other devices (such as a security camera) are failing or failed.
1.4.11 Algorithms to reset those other devices (either wirelessly or via hardwire connection)

1.5 Supportability 1.5.1 All operational parameters that affect how the systems and algorithms behave are abstracted out of the code, leaving behind variables in the code that are evaluated at system start
1.5.2 Operational parameters are stored separately from code in a profile that is easily read and processed by the code
    1.5.3.1 The profile should be easy to replace in its entirety
    1.5.3.2 Individual values for operational parameters in the profile should be easy to replace
1.5.3 On system restart or reset, all systems and algorithms flush their values for operational parameters then re-read and re-process operational parameters from the profile
1.5.4 A method for resetting the device at ground level (i.e. standing on the street), like a reset button. Pushing this button is the equivalent to power cycling the system, which causes all hardware, firmware and software to re-initialize, re-read and re-process all operational parameters
1.5.5 A method for indicating device system status, like a 3-color light or set of lights (e.g., green, yellow, red) at ground level that conveys one of three states: operating properly, operating but there is an issue needing attention, and not operating. This provides ground level feedback regarding whether to push the reset button as well as whether or not pushing the reset button resolved the issue.
1.5.6 A method for providing a ground-level memory card reader (e.g., CompactFlash, SmartMedia)
1.5.7 Memory card reader is bootable, meaning on reset the card reader is checked for a set of operational parameters and if exists, these operational parameters are used instead of any others that may be onboard
1.5.8 System logging persists on a memory card in the ground level slot so that the card can easily be replaced, with logging data taking back for more thorough analysis than can reasonably occur in the field
1.5.9 Amount of memory for operational parameters and logging is easily increased by replacing lower capacity card with higher capacity card over time
1.5.10 Methods and algorithms for creating modularity of systems on the device
1.5.11 Facilitate unit testing as the number of components increases
1.5.12 More easily enable in-field, black-box replacing as a cost effective support strategy in the field
1.5.13 Replaced modules are sent back to Inovus Solar or certified service rep for troubleshooting, repair and recirculation
1.5.14 Methods and algorithms for enabling an expandable bus architecture on the device to enable in-field hardware feature expandability over time (e.g., new sensor, high bandwidth radio, video camera)

1.6 Environmental Sensing 1.6.1 Methods for collecting and logging environmental data (e.g., luminosity, temperature, humidity, pressure, wind speed) for later use and correlation with other information like device operational parameters.
1.6.2 Methods for adding, configuring and enabling sensors on a device during manufacturing, installation and/or in the field.

2. Smart Wireless Mesh

The basics of mesh networks are known by mesh providers, such as self-organizing, repairing, route optimization via feedback, etc. However, some unique innovations occur in how mesh networking is used to meet the goals of ACDs, for example, the following features.

2.1 Mesh 2.1.1 Methods for providing different backhaul channels to meet the characteristics of different types of device data (e.g., low bandwidth, best efforts, open channel; high bandwidth, guaranteed delivery, VPN channel)
2.1.2 Algorithm for selecting a backhaul channel based on the characteristics of a specific type of device data, that is, data-driven backhaul channels (e.g., for small size, non-critical, insensitive data, use low bandwidth, best efforts, open channel; for streaming, real-time sensitive data, use high bandwidth, guaranteed delivery, VPN channel)
2.1.3 Method and algorithms for periodically polling the mesh, checking differences in the responses, using these differences to determine when individual devices are unresponsive and then taking action: sending alerts, repurposing a nearby functioning device to assume unresponsive device's role, dispatching field support to reset or troubleshoot if necessary, etc.

2.2 Quarantine
2.2.1 A method for allowing formerly unknown devices to join a mesh, but to limit the functionality of the device—and therefore its risk to the overall system—until the device successfully passes several well defined phases of quarantine.
2.2.2 Algorithms for describing what behavior and conditions must be met for each phase of quarantine and then determining when a specific unknown device successfully meets these conditions.
2.3 Collective Intelligence
2.3.1 A method for sharing information wirelessly with a collection of devices, having each device in the collection perform tasks to make one or more determinations, and then sharing these determinations with other devices in the collection yielding a result that causes a change in the behavior of a collection (e.g., two or more lighting devices determine a walker's direction and speed and then light the way ahead of the walker.)
2.3.2 An algorithm for lighting the way ahead of a moving object (e.g., walker, automobile.)
2.3.3 An algorithm for pointing a POV video camera in the direction of meaningful activity and following that activity as it moves.
2.3.4 An algorithm for using motion triggered lighting across a large collection of lighting devices as a way of indicating where potentially meaningful activity is occurring (e.g., border crossing, college campus.)
2.3.5 An algorithm for targeting advertisements to devices that follow an individual user as they move.
2.3.6 Algorithms around how, where and how redundantly to register a device's capabilities on a network
2.3.7 Algorithms for determining connectivity issues on the network, routing around issues, repairing issues and reestablishing routes once repaired
2.3.8 Algorithms for favoring efficient routing, penalizing inefficient routing and adjusting both over time based on changeable definitions of efficiency
2.3.9 Algorithms for locating and sharing resources on the network as resource availability and location changes over time
2.3.10 Algorithms for securing the network against unauthorized network joins and ensuring intra-network communications cannot easily be intercepted and interpreted
2.3.11 Algorithms for using monitoring events across a population of devices to determine a coordinated action to take like lighting the way ahead of a walker along a pathway or turning on a video camera based on triangulation of multiple device motion sensors
　2.3.11.1 Algorithms that detect motion (direction and velocity) and estimate the future direction and location of the moving object as a function of time.
　2.3.11.2 Algorithms that activate devices based on the anticipated location of the moving object per the algorithms in 5.2.3.1. (i.e. turning on or brightening lights or turning on/waking up security cameras ahead of a moving car or moving person.)
2.3.12 Algorithms for determining the location of a device based on known fixed locations and triangulation of multiple device radio signals
2.3.13 Algorithms that allow devices in a network to look for and sense different sensors that come into range of the wireless sensor(s) on the devices.
2.3.14 Algorithms that allow devices in a network to identify and categorize the different types of sensors that come into range of the wireless sensor(s) on the devices.

2.4 Remote Troubleshooting
2.4.1 A method and algorithms for periodically querying a population of devices for connectivity, comparing these snapshots differentially and determining when individual devices have lost connectivity
2.4.3 A method for remotely resetting a device, which has the effect of cycling the power on the device, flushing all runtime memory and then reloading and restarting all systems on the device.
2.5 Event Management
2.5.1 Algorithms for monitoring and storing discrete and continuous triggers, interpreting triggers and translating them into events to be published
2.5.2 Algorithms for subscribing to and receiving events with specified attributes as a way of performing a task in response to a published event
2.5.3 Algorithms for interpreting one or a collection of conditions, assessing their severity and then determining whether a warning or error condition exists.
2.5.4 Algorithms around scheduling jobs at predefined times and/or with predefined frequencies to perform tasks
2.5.5 Algorithms enabling the way an event gets treated throughout the system to be dictated by the classification and characteristics of the event itself
2.5.6 Algorithms for aggregating events over populations of devices, rolling up event information based on criteria, interpreting low-level event information and using it to create new higher-order events
2.5.7 Algorithms involving securely bridging a low-power, low-bandwidth network and a medium-power, high-bandwidth network, or providing secure gateway capabilities between the two networks.
2.5.8 Algorithms for aggregating information across populations of devices and securely delivering this information through a broadband wireless infrastructure to an Inovus operated network operations center.
2.5.9 Algorithms for guaranteed or best-efforts delivery of information to the network operations center based on the classification of the information.
3. Content Services
　Methods and elements for delivering content services via ACD's are described below, which content services may be delivered by a single ACD but more preferably are delivered by a network of multiple ACD's. Delivering said content services may be in one or more directions, for example, gathering of information from a population (multiple) networked poles for transmittal preferably to a master pole and then to a control station for processing and/or use, or (in the opposite direction) dissemination of information, advertising, alarms, or other content by the control station to the master pole and then to one or more of the slave poles in the network.
3.1 Monitoring
3.1.1 Methods for setting thresholds for values generated by devices or populations of devices that when met, cause actions to be taken like sending an email or text alert, raising other events, etc.
3.2 Management
3.2.1 Methods for defining a task or set of dependent tasks to be delivered to populations of devices and then executed.
3.2.2 Methods for defining jobs, comprised of a task or group of dependent tasks, that can be scheduled for delivery and execution to a population of devices.
3.2.3 Algorithms around creating and managing user/customer accounts and passwords with associated roles and permissions that span different kinds of customers as well as the needs of Inovus itself 3.2.4 Algorithms that enable authentication of individual users to specific accounts and roles with associated permissions, and tracks failed authentication attempts for intrusion detection security
3.2.5 Algorithms for authorizing individual users/customers to access and use only their devices and associated data
3.2.6 Algorithms for detecting when security might be compromised anywhere in the system and taking action once security is believed to be compromised such as locking out a user or customer, denying access to devices or data, locking out parts of the system globally or by customer and flushing all security keys requiring re-initialization throughout the system of all security subsystems.
3.2.7 Algorithms for creating sets of devices that meet predefined conditions then proactively and remotely managing these devices including resetting, updating firmware, updating operational parameters, triggering on-demand information delivery, troubleshooting issues, overriding operation for prescribed periods of time, etc.
3.2.8 Analytical algorithms that operated on aggregated information at the Inovus network operations center and provide customers with all manner of operational and environmental insights.
3.2.9 Algorithms that allow a network of devices to manage power being pulled from the power grid or placed back onto the power grid.
   3.2.9.1 Algorithms that allow a network of devices on the grid to put power onto the grid a desired times, either as certain criteria are sensed and met on the grid, or via a command from a central command center or a Network Operation Center (NOC)—hereinafter referred to as a NOC.
   3.2.9.2 Algorithms to draw power from the grid at desired times, as certain criteria are sensed and met on the grid, or via a command from a NOC.
3.2.10 Algorithms to vary the control signal to the load(s) to test its operation (i.e. to test the ability of the light to run full brightness and dim down to various dimming levels).
3.3 Visualization
3.3.1 Algorithms for placing devices on a map based on precise location, and then overlaying weather, insolation, energy cost, other meaningful data. over these mapped devices.
3.3.2 Methods for graphically illustrating key monitoring metrics for devices (e.g., KPI, ROI) in a dashboard.
3.3.3 Methods for enabling the distribution of summary monitoring information on populations of devices to other websites as widgets.
3.4 Analytics
3.4.1 Methods and algorithms for quickly searching, refining and sorting sets of devices based on device attributes.
3.4.2 Methods for correlating attributes across large populations of devices and then deriving insights based on the correlations.

Retrofit Solar-Powered Outdoor Lighting System:

Solar-powered retrofit outdoor lighting system may be provided according to some embodiments of the invention, which retrofit systems may be attached to an existing pole, for example a conventional street light pole, conventional public safety alarm pole, or conventional security camera pole, to convert the existing pole to a solar-powered system. Alternatively, while the following description focuses on retrofit of existing poles that may already be erected and may already be in conventional service, said "retrofit" systems may also be attached to new poles that are not erected or in service, for example, if the community/industry desires the modular approach of attaching embodiments of the invented autonomous and/or wireless to poles that they already own and have stockpiled, or that they want to purchase because such conventional poles are "known commodities." The main objective is to make such existing and/or new poles "autonomous" in that it/they can be powered by an integral renewable energy collection system such as a solar collector. The energy storage system preferably provides enough stored energy to keep the system running for at least 5 days of low-to-limited solar radiation (for example during a week-long-spell of cloudy weather).

The solar-retrofit poles will be self-powered during the day to power the electrical device if needed during the day, and, as existing poles are typically already tied to the grid, to provide solar power to the grid during the day (during peak load periods). Then, at night, when the demands on the grid are less, such retrofit poles will be powered by grid. Thus, energy storage devices, such as batteries, are typically not needed for these retrofit poles, but energy storage devices (in the form of retrofit modules) may be included for emergency back-up during power outages. Such emergency back-up energy storage devices would not require as much energy storage as the autonomous system, as one would expect such a storage device to be required to power the pole for at most a few hours during grid repair.

The solar-retrofit system is preferably adapted so that the retrofit system is visually integrated with the existing pole/system to minimize the "modified appearance" of the retrofitted system. The retrofitted system preferably looks similar to a standard pole after the modification has been made. This may accomplish two things, specifically, public acceptance and vandalism-resistance. The finished retrofit pole product looks similar to a standard light pole and therefore is more readily accepted by the public. Also, because the retrofit pole looks like a standard pole, it is less likely to be targeted by vandals; if there were obvious equipment and protrusions mounted to the pole, vandals might be tempted to steal the solar collector or otherwise tamper with or destroy said equipment/protrusions.

In addition to saving grid energy compared to conventional poles, the retrofit systems provide an important public safety benefit. During periods of a power outage (grid or utility power), a retrofit light, public alarm, and/or security camera will still be able to operate, thus providing a safer environment at night.

Figure 29:
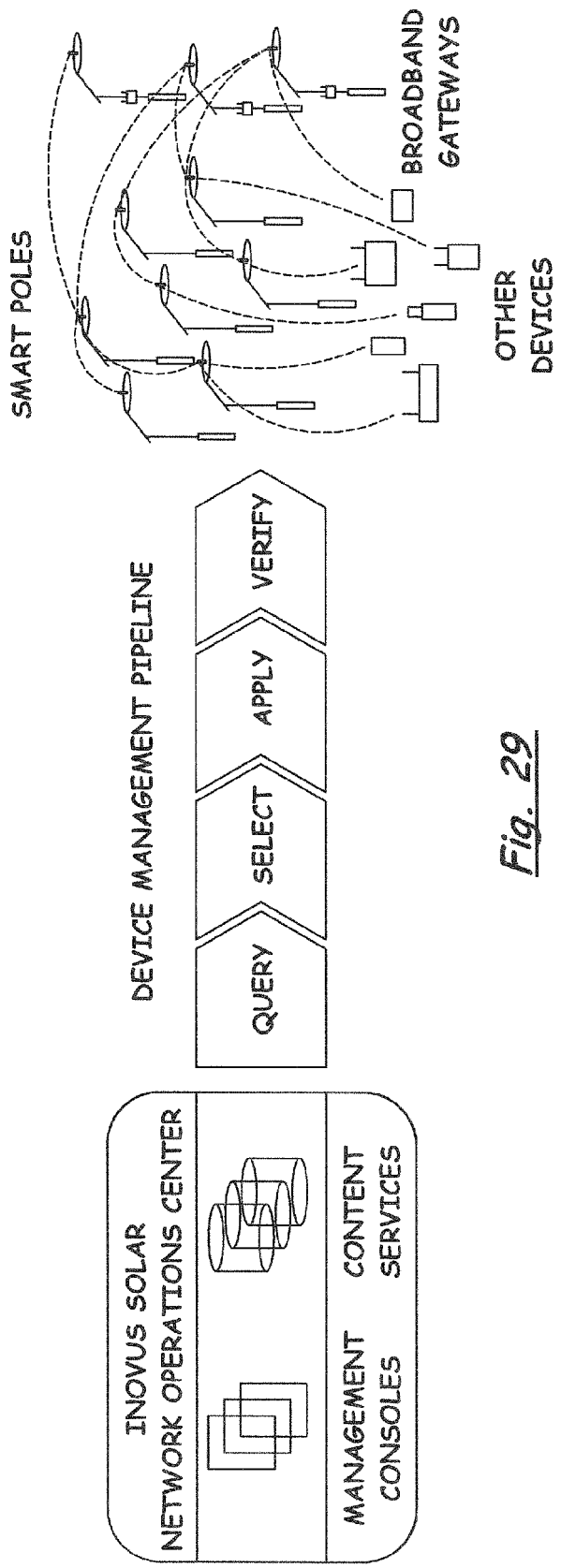
FIG. 29 is a schematic that portrays a "Device Management Pipeline" according to one embodiment of the invention.

The retrofit system comprises the integration of a solar collector and other necessary system components (described below), and preferably an emergency energy storage module, into a retrofit "package" so that it can be retrofitted & installed as an independent self-supported system onto an existing or new pole. As illustrated in FIGS. 29 A-C, in a preferred retrofit embodiment, a solar collector is attached to the outside surface of a collar 700. The collector can be a flexible photovoltaic layer 710 that is attached, grown, or woven onto the surface of the collar. The collar subtends an arc of at least 180 degrees. Preferably embedded in the collar are energy storage devices 720, which may be sized and designed for emergency use as described above. Such devices may be batteries, capacitors, fuel cells, or devices that store and release hydrogen. The collar is then mounted or otherwise attached onto an existing utility or light pole, with wiring extending from the solar collar to the light fixture. In this manner, replacing installing the collar would also install an autonomous power system for the light pole, and/or at least (depending on the size and capability of said energy storage devices) an energy storage device for emergency grid outages, as described above.

Another embodiment of a retrofit solar-powered outdoor lighting system is to include the solar collector and the energy storage device, preferably with control hardware/firmware/software, in the body of, or integrally connected to the light fixture, such as the integral unit 800 portrayed in FIG. 35 (described below in more detail). The preferred embodiment would have a lightweight PV layer/panel on the top of the replacement light fixture. The light fixture itself would contain a lightweight energy storage device, which in its preferred embodiment, is a high energy density ultra or super capacitor. In this manner, replacing the light fixture would also install an autonomous power system for the light pole and/or at least (depending on the size and capability of said energy storage devices) an energy storage device for emergency grid outages, as described above.

The solar collectors charge the energy storage devices during daylight hours, then the energy storage devices supply power to the light fixture at night or (depending on the size and capability of said energy storage devices) during the night only if there is a grid-outage.

There are different ways this invention may be used. For example, the a retrofit solar-powered pole may power systems other than lighting, such as stand-alone radio and antenna equipment at remote sites, or any other application that requires a self-powered source for support of the equipment. The retrofit solar-powered pole may comprise additional or alternative features to achieve various objectives. For example, the lighting control system may consist of motion sensors, photocells, time-clocks, or any other type of control to turn the light (or other powered equipment) on and off or to provide any other control required for the specific application.

The preferred methods and apparatus for retrofitting existing light poles with solar panels and batteries comprises the solar panels and batteries being integral parts of a unit that is applied to the existing pole, so that the solar panels and batteries are not installed separately. The benefits are ease of installation, better reliability (separate components are more subject to damage or improper installation), and overall lower cost compared to the conventional installation of separate solar panel and battery components on an existing pole. Multiple retrofit options are possible, with the two preferred options being a combined solar-panel and battery unit applied to the generally cylindrical side surface of an existing pole (separate from the light or other powered equipment), or a combined solar-panel, battery, and light/powered-equipment unit connected to the existing pole in locations where a conventional light might be connected. These two options are discussed in more detail as follows.

As schematically portrayed in FIGS. 32-34, a collar may comprise the preferred flexible solar panel on a flexible or semi-rigid frame that is adapted to be snapped/installed around a pole. Said collar may comprise pockets/receiving spaces for batteries or other energy-storage devices. The preferably-flexible solar panel or solar "fabric" may be installed on or incorporated into a variety of flexible or rigid panel, layered composites, or other solar-panel structure with regions or pockets for receiving battery/storage apparatus, wherein said solar-panel structure is mounted onto, flexed or bent around, or otherwise attached to an existing pole. Thus, said collar that incorporates an outer layer of a solar collector material and an inner layer of batteries may be used as the retrofit solar collection and energy storage system that generally mimics or takes the outer generally cylindrical form of the existing pole, to power outdoor light(s) or other powered equipment that is already connected to, or that is retrofit to, the pole. Said outdoor light(s) typically are separate piece(s) that are installed separate from the collar, for example, a conventional light, an embodiment of an invented LED light engine, or other light fixture at or near the top of the pole. Said other powered equipment is typically separate pieces(s) that are installed separate from the collar, also typically at or near the top of the pole. Thus, said fabric, flexible or rigid panel, layered composite, or other layered material combines a solar collector and energy storage device into a single integrated unit, which is installed separate from but is operatively connected to the light or other powered equipment.

Figure 35:
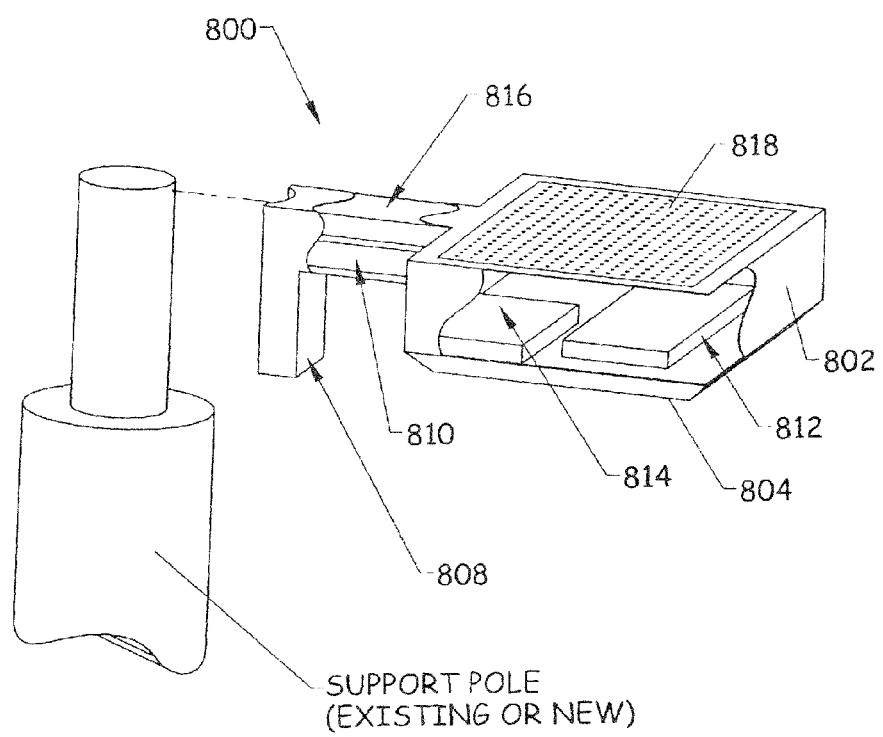
FIG. 35 is a portrayal of one embodiment of an integral light unit, comprising solar collector fabric panel, LED light engine, battery pack and charger, controller/code unit(s) and modem, so that the entirely or substantially-self-contained ("integral") unit may be attached to a pole without modification of the pole or insertion of apparatus into the pole.

As schematically portrayed in FIG. 35, an integrated unit 800 comprising preferably all of the solar panel, batteries, and LED light engine, may be attached to the existing pole preferably at or near the top of the pole. This integrated unit therefore, is positioned where one would expect a conventional outdoor light to be placed on the pole, with no need for a solar-collector and/or battery collar on the generally cylindrical side surface of the pole. The integral unit 800 in FIG. 35 represents one embodiment of retrofit solar-powered outdoor lighting system that comprises preferably all of: fixture box 802, such as a "shoebox" or "cobrahead" or other standard or custom fixture housing or body, wherein the fixture box may have a thin film photovoltaic (PV) layer 818 attached to it to convert light into electrical power, which PV layer is preferably on a generally horizontal top surface of box 802 and which may replace the solar collector mounted on the pole or may augment that PV collector; lens 804 preferably connected to the box 802 and/or to the LED light engine 812; fixture arm and/or bracket 806 to mount fixture to pole; energy storage pack 808, which may comprise a lightweight energy storage pack; such as the preferred high energy density ultra or super capacitor, batteries, or other energy storage apparatus; energy storage pack charger 810; LED light engine 812, which may be of various designs, but is preferably the modular LED system described elsewhere in this document; motion sensor and photocell 814; control board w/wireless modem and/or cell phone radio 816. While such integral units are preferred, it will be understood by those in skill in the art reading and viewing this document and its figures, that peak load delay conservation systems according to embodiments of the invention could also be installed on existing or new light/equipment poles with the elements called-out for FIG. 35 being provided in separated housings and/or in spaced-apart locations on or in the pole.

Modular LED Light Engine:

A modular LED system may be adapted to be part of either new (OEM) or existing (retrofit) outdoor lighting fixtures. The preferred modular LED system will allow any and all required lighting distribution patterns to be emulated, including some lighting distribution patterns that can not typically be achieved by conventional light fixtures. The advantages of the more efficient, and preferably modular, LED lighting systems can be adapted to traditional light fixtures, for example, by being installed in traditional light fixtures that are already in use or are stockpiled, or by being installed in newly-purchased traditional light fixture housings because a community/industry prefers the appearance of the traditional housing and/or wishes to match existing lights.

Figure 36:
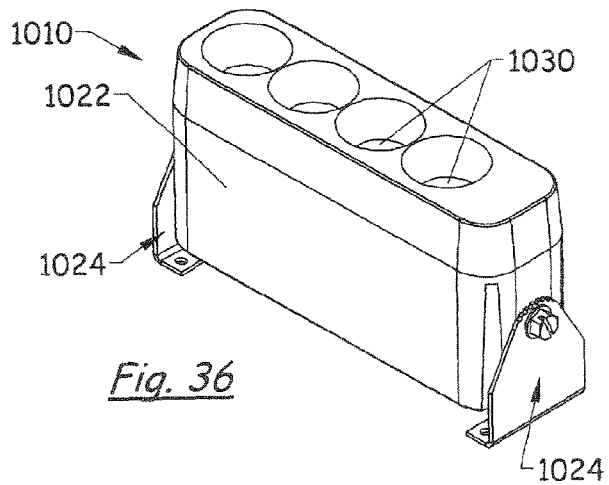
FIGS. 36-38 are views of the preferred, but not the only, invented LED module, shown with mounting bracket, wherein multiple of said modules are used to form an LED engine.
Figure 37:
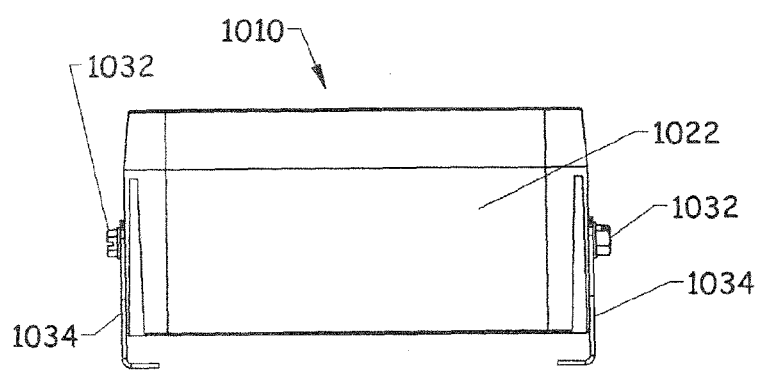
Figure 38:
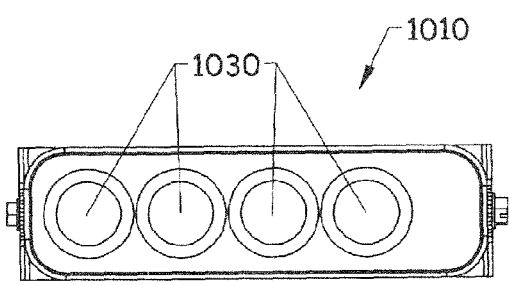
Figure 39:
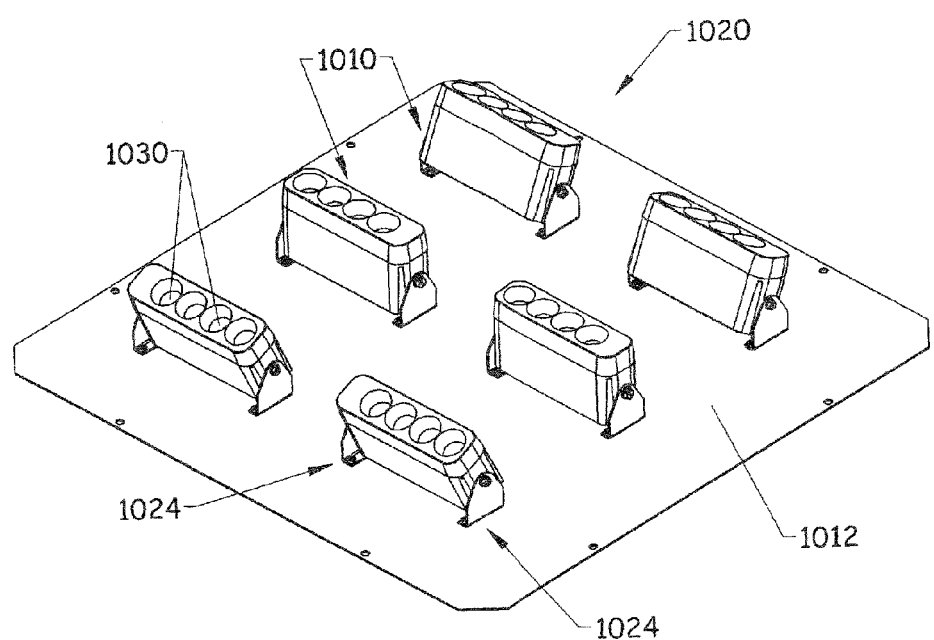
Figure 43:
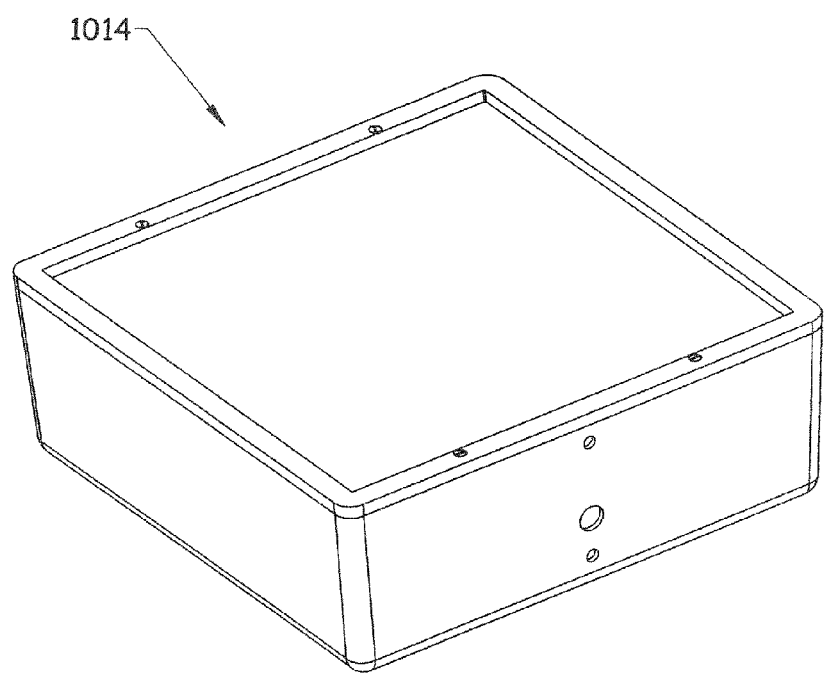
FIGS. 43-47 illustrate the plate with multiple LED modules of FIGS. 39-42 installed into a square light fixture.
Figure 44:
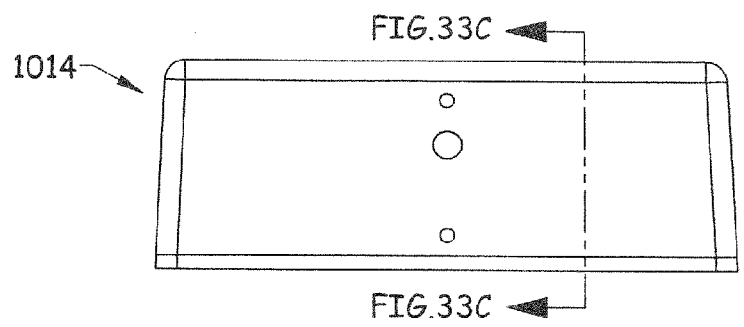
Figure 45:
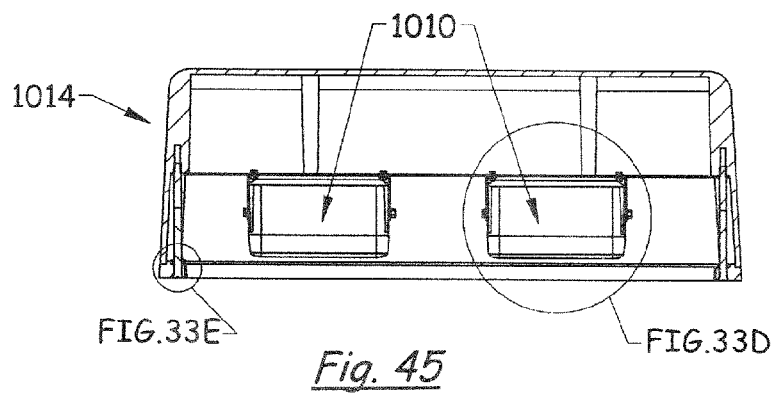
Figure 46:
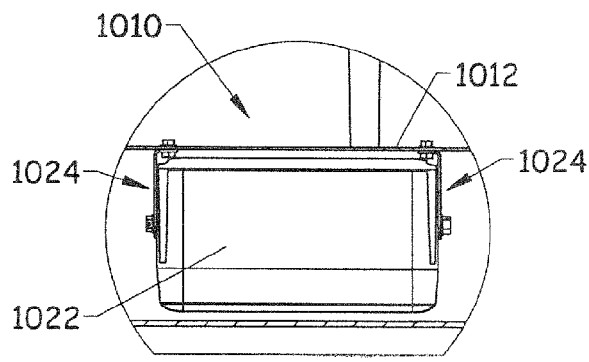
Figure 47:
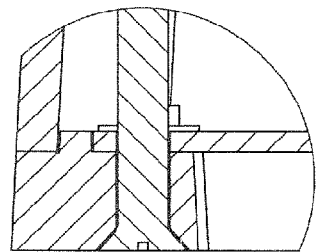

As illustrated by the preferred embodiments in FIGS. 36-38, separate modules 1010, may be provided with each module preferably containing multiple light emitting diodes 1030 (LEDs). Multiple of said modules 1010 are mounted to a sheet metal plate or baffle 1012, as illustrated in FIGS. 39-42, to create a light fixture comprising a modular LED light engine 1020. The baffle is then attached to the interior of a light fixture 1014, as illustrated in FIGS. 43-47. As discussed elsewhere in this document, many different light fixtures may be used, as it is the light engine 1020, and it is the particular the number, arrangement, and directing of modules 1010 that is the major determining factor of the light intensity and light pattern.

The structure and operation of each module 1010 is preferably the same as the others in said light engine 1020, with said multiple modules being arranged on the baffle 1012 and each modules being directed (pointed) in a direction, so that the sum total of the specially-arranged and specially-directed modules is the desired light distribution pattern (or simply "light pattern"). The appropriate modules required to achieve the desired lighting distribution pattern are mounted to the baffle and aimed in the direction needed for the specific pattern. Thus, several modules can be combined in different configurations as required, with the "adaptation" or "adjustment" to obtain the desired light pattern preferably consisting of: mounting the modules on the baffle in a particular design arrangement and pivoting the LED housing 1022 of each module relative to its bracket 1024 to direct each module (independently from all the others) as desired.

Each module 1010 preferably has multiple LEDs, for example, four LEDs 1030, in a single row along the length of the module housing 1022. All four LEDs 1030 preferably "pointed" in the same direction inside the LED housing 1022, with "directing" of the module, and, hence, of the light, being done by said pivoting and then locking of the module in the desired orientation relative to the plane of the baffle, and, hence, relative to the surrounding landscape, roads, and/or buildings, etc. The LED housing 1022 may be locked in place by a bolt/screw system 1032 or other lock/latch, preferably at the time of manufacture of the light fixture with light engine (if the desired light pattern is known), at the time of installation of the light engine 1020 in an existing fixture, and/or at the time of installation of the light fixture on the pole, for example. Each bracket 1024 may comprise one or more members that may pivotally receives the LED housing 1022 so that the LEDs may be swung in a direction preferably perpendicular to the length of the LED row for said directing of the LED module. For example, two or more ears 1034 may be fixed to the baffle 1012, and receive the housing 1022 so that is pivots on an axis parallel to the length of the LED row. The ears 1034 may be considered part of the module, and/or may be considered part of the baffle 1012, depending on one's perspective.

In the preferred LED module, the LEDs 1030 are mounted to, or less preferably connected to, a circuit board along with required drivers and circuiting for the LEDs. Said circuit board, drivers, and circuits for the LEDs are not shown in FIGS. 36-38, but may be contained within each module housing 1022. Also contained with the module housing may be heat sink material to draw heat away from the LEDs as required, as will be understood after reading this document and after viewing FIG. 7, which portrays a generally cylindrical light engine as opposed to the generally planar light engine of FIGS. 36-47. It will also be understood that multiple modules 1010 may be arranged on variously-sized and shaped plates, baffles, cylinders, cones, boxes, or other support structures, wherein the light pattern and the outward appearance and aesthetics of the light fixture with light engine will be determined by said support structure, said arrangement of the modules on the support structure, and said directing of each module. In addition, or as a partial or total replacement for said directing of the modules, a lens assembly with reflectors may help achieve the specific distribution (pattern) required.

One main advantage of this system is the ability to achieve improved performance from the LED lighting system within a traditional light fixture. Traditional outdoor light fixtures typically utilize high pressure sodium (HPS) or metal halide (MH) light sources. These traditional light bulbs scatter light in all directions, so the fixture box requires reflector assemblies to collect and re-direct the light in the required direction to achieve the distribution desired. LED's are a highly directional source of lighting and do not scatter their light in all directions like HPS or MH light sources. The preferred modular LED sources utilize the directional lighting characteristics of LEDs to create lighting patterns that are directed and yet still cover the desired area to be lit. This not only optimizes the light pattern, but is more effective in delivering light to only where it is needed and not into unwanted areas. Therefore, this modular lighting system also reduces light pollution.

There are five basic distribution patterns identified for outdoor lighting. These are type I, II, III, IV and IV. Not only will the preferred modular LED system, described above with reference to FIGS. 36-47, allow these distribution patterns to be met, but additional and project specific (site specific) distribution patterns can also be achieved.

Another key feature of this modular LED system relates to light egress. Normal outdoor light fixtures require shielding (in many cases consisting of a sheet metal shroud) to prevent light egress into adjacent areas. For example, if there is parking lot lighting next to a residential area, then often some sort of shielding is required. With this modular system, the shielding capability is built-in to the design of the modules on the side of the fixture that requires the shielding so that no external shielding is required. The shielding is achieved via the highly directional, focused lighting of the modular system, by selecting, placing, and directing the modular LEDs to the provide light of desired coverage in desired directions (desired size, shape, and intensity of lighting pattern). Other advantages include the ability to achieve "Dark Sky" compliance, which requires that no light can project up above the fixture into the sky.

Virtually any shape or size of light fixture box can be retrofitted with embodiments of the invented modular LED system. Because of the small modular size of each modular LED component, even odd sizes and small fixture assemblies can accommodate, and operatively cooperate with, this system. This allows it to be utilized in nearly all types of conventional fixtures and in custom-designed fixtures.

It will be understood after reading and viewing this document that the modular LED system shown in FIGS. 36-47, and other modular LED systems embodiments according to the invention, will have specific advantages compared to conventional lighting. Specifically, the modular LED system allows lighting designers and engineers to design a lighting system that is currently largely unachievable. The challenge with current lighting systems is that they rely on light sources that throw light everywhere (uncontrolled light—throwing light in every direction). Historically, outdoor light fixtures have had an enclosure (with or without a glass lens to enclose the light source) to protect the source and a lamp on the inside of this enclosure. A hundred years ago the light source was a gas lamp or a candle that threw light everywhere. If you wanted to light a larger area you would increase the amount of light produced at the source. The two lighting functions that are difficult to achieve with these traditional light sources are control and uniformity.

Since the gas lamp, lighting fixtures have not improved dramatically. Most current lighting systems still have a single extremely bright light source (HID—Metal Halide or High Pressure Sodium) that throws light everywhere.

To get light somewhat under control, and in order to achieve a few standard distribution patterns (in the lighting world identified as types I thru V), many different and varied reflector configurations have been developed over the years to attempt to "direct" the light in a pattern that is more useable for the specific application, that is, to light the specific area that needs illumination. HID lamps are not directional and so reflectors have been required to attempt control of lighting patterns. Such conventional light plus reflector systems are only somewhat improved from the original way it was done long ago, that is, with no reflector.

Regarding uniformity, it is understood by all lighting designers that the best lighting system is one that provides even illumination across a given area or site. The closer that conventional light poles are placed to each other, the lower maximum to minimum ratios (bright and dark areas) and better or more even illumination can be achieved. This is because the brightest area of the light is close to the source. Additionally, when a unique site or area needs to be illuminated, said illumination is difficult to achieve with a standard HID system. For example, when poles are close to a residential area the light is difficult to control. Typically a sheet metal plate is attached to the side of the fixture to "shield" the light from the residential area.

Regarding standard LED fixtures, the light starts out as a directional source, because each LED is a point source. No reflectors are required and all of the light is utilized to illuminate only the area that is required. Many LED light fixture manufacturers have taken an approach to only consider this natural efficiency of LED's in the design of their fixtures and to assemble them within a light fixture body in the required standard configurations (or "pre-set" configurations) to achieve a specific standard distribution pattern (one of the standard five distribution patterns).

Embodiments of the invented modular LED system, on the other hand, overcome the challenges of both HID lamp sources and the limitations associated with a typical "pre-set" LED system. By pointing each module towards the area that needs to be illuminated, the cooperative efforts of these multiple modules allows a greater overall uniformity to be achieved. The light can actually be focused on the areas that are far away from the pole to achieve lower max to min ratios. This greatly improves uniformity.

The modular system also allows virtually any distribution pattern to be achieved by adjusting the angle and pitch of the modules to achieve the desired lighting. This can be done either by the engineer designing the lighting system, at the factory, or in the field. No shielding is required because the modules can be "aimed" away from the area of light trespass.

Not only does the invented modular LED system allow each fixture to be "customized", the overall lighting system (network of poles) can be designed to work together in a unique or custom way to achieve an overall lighting system for that specific site or area.

Other unique qualities and features, not necessarily represented by the modular LED embodiments of FIGS. 36-47, but preferred in alternative embodiments of the invented modular LED systems include:

1. Multiple or different lenses on a standard lens cover. The LED module is designed in such a way to allow the adaptation of the lensing at the module to change the shape or focus of the light. The lens cover is designed to accommodate standard lenses so that the distribution pattern of an individual module can be changed to allow additional design flexibility. Also, this brings down the cost of manufacturing, as only the lens cover (framework for holding the lenses) is a custom part specific to the module. The lenses are mass produced at a lower price.

2. Individual dimming of modules. Each of the modules has the electronic drivers "on board" with a control wire that allows the adjustment of the light level remotely. This is achieved by sending a signal over the control wire (or wirelessly-see next option). Without the wireless option these settings are changed via an RS232 port (or equivalent) connected to a control board that is in turn connected to the modules and controls the function of the modules. The control board has time clocks and/or other algorithms that control the light output of the modules.

3. Wireless control option. Each module (and/or set of modules) can be controlled wirelessly over a wireless network so that changes to lighting can be done after the fixture has been installed on the pole. This can be done remotely and globally (over a whole network of fixtures/poles). Preferably, as discussed in item 2 immediately above, the individual modules may be controlled in this wireless manner.

4. Pan/tilt option. Each module can be adjusted via the control wire (or wirelessly). Thus, the distribution pattern and direction of illumination can be controlled remotely. This could be achieved with micro controllers or small motors to physically change the direction or "aim" of the modules. It should be noted that the modules in FIGS. 36-47 are well-adapted for independent tilting of each modules and/or for tilting of groups of modules together. Other modules may be designed and adjustably connected to the plate/baffle or other support structure that are even more adjustable, for example, by both pan and tilt adjustments. Again, these adjustments may be individually done and/or done by groups.

5. Pan/tilt Solid State option. The "direction" of the light produced by the modules could be achieved by having multiple LEDs in a wide range of distribution angles and only illuminating those LEDs pointing in the direction of the desired distribution pattern (and leaving the other un-needed LEDs dark). With such a system, if the pattern needs to change, then the control system would "douse" (or turn off) the LEDs not needed and illuminate the ones that are directed in the desired vector(s) for the new pattern.

6. Solid state redundancy option. With the superfluous multiple LED system stated above in item 5, the "unlit" LEDs could alternatively be utilized to turn "on" when an adjacent LED burned out. This would allow the module to last longer (for example the initial LEDs would burn for 50,000 hours. After the performance started to degrade, then the "old" LED would be turned off and the "new" adjacent LED would be turned on to replaced the old one.

7. Color changing. The color of each module and/or each LED could be controlled via the control wire (or wireless control). This could be utilized by a municipality to indicate certain conditions in the city. For example, changing the street lights in the city to a RED color in an area that may be at risk for fire would indicate to the residents that they should leave the area. If there is a condition in a certain part of the city that required police attention, the lights could be green in color. In addition to changing the color of the light, other functions could be achieved. For example the lights could be blinked on and off, or intensified (brighter light) to indicate an emergency situation.

8. Software Design option. The lighting designer or engineer can utilize embodiments of the modular LED software program to design the lighting system to his/her specifications. This software option allows the information relating to each module (the rotation/tilt, etc.) to be easily communicated to the factory so that the specific distribution pattern can be set. This software tool also gives the engineer much greater flexibility in design. If there is a specific site that has unique lighting requirements, each individual fixture can be configured as required.

Some embodiments of the invention, therefore, may be described as autonomous outdoor lighting systems according to any of the features described herein, Energy production (such as solar), storage of energy, and control of the outdoor lighting, its poles, and the mesh network for said poles may be included in the preferred embodiments. Wireless communications channels (WCC) give the ability to provide wireless connection of poles to the internet via wireless modems in each individual pole ("slave" pole), with a "master" or coordinator pole transmitting data via cell phone or satellite radio to master station at connection to internet. The WCC also enables the use of both high bandwidth & low bandwidth capabilities (channels) that can be selected based on individual system/network requirements. High bandwidth speed is preferably greater than or equal to 11,000 kbts (kilobytes per second) and low bandwidth speed is preferably 20-250 kbts (kilobytes per second). For example, under normal conditions, the low bandwidth channel is utilized to conserve energy of the system. Upon the detection of an event (motion sensor activated), the high bandwidth mode is then employed (turn on camera). Also, the preferred embodiments may be self-Acting, with event "awareness", wherein actions of each individual pole are taken based on that pole's "view" of it's local sensor data (solar collection data, motion sensor data, wind or barometric pressure, etc. Cooperative/Community Actions may also be included in the preferred processes of the poles and network, wherein the operation of the pole(s) (and attached devices/systems) change/respond with respect to adjacent poles within the community. This includes small network actions (10-100 poles), city-wide actions, and/or large area networks, and part of this includes the "self-organizing" & "self-recognition" of new poles joining the network characteristic of Mesh or ZigBee networks. Remote Configuration is also preferably included in the processes of the poles/network, wherein changes to the wireless controller can be done remotely via the internet web interface, which this includes new programming, firmware, upgrades, troubleshooting and repair (system reset if required, etc. Pole/Node Management may include actions needed for "light the way", power delivery to/from the grid, and/or content services. The preferred poles and network are made with a large amount of modularity, for example, by using an "open" architecture, which may include the utilization of standard open protocols, hardware and architecture, with universal bussing that allows the implementation of new systems, and/or devices that may be needed on the poles. In some poles/networks, financial transactions may be communicated via RF, security cameras may provide data and video to law enforcement, and WI-FI routers may be provided. Both for "on-pole" devices and "off-pole" devices, the long-term supportability of the system is provided by the control system self-healing and repair functions, together with the capability of ground level access and repair. Security (System/Network protection) s designed to limit connectivity and access based on who is attempting to connect to the network; new devices will immediately connect to the network, but under a systematic quarantine period to determine device type & authorization level.

Other embodiments of the invention will be apparent to one of skill in the art after reading this disclosure and viewing the drawings. Although this invention is described herein and in the drawings with reference to particular means, materials and embodiments, it is to be understood that the invention is not limited to these disclosed particulars, but extends instead to all equivalents within the broad scope of the following claims.

The invention claimed is:

1. An outdoor lighting system controlled by a wireless communications system, the outdoor lighting system comprising:
   a control station in a first geographic region and having an internet connection;
   slave poles installed in a second geographic region, each having an outdoor light;
   a master pole in said second geographic region that is adapted to transmit data to said control station;
   wherein said slave poles are adapted to wirelessly communicate data to said master pole that is then transmitted by said master pole to the control station;
   wherein the outdoor lighting system further comprises flexible solar panels wrapped circumferentially around, and attached to, said slave poles and said master pole, wherein the solar panels attached to said slave poles are adapted to power the outdoor lights and the solar panel attached to the master pole is adapted to power said transmission of data to the control station;
   wherein the outdoor lighting system further comprises a grid-tie and is adapted to supply electrical energy to an electrical grid during at least some peak electricity consumption hours and to receive electrical energy from the grid during at least some non-peak electricity consumption hours; and
   wherein said data wirelessly communicated from the slave poles to said master pole comprises data on energy production of the solar panels and operation of the outdoor lights, and said data transmitted from the master pole to the control station comprises data on energy supplied by the outdoor lighting system to the grid and data on energy received from the grid by the outdoor lighting system.

2. A system as in claim 1, comprising both a high bandwidth channel and a low bandwidth channel of data transmission between slave poles, wherein said low bandwidth channel is used to conserve energy from both said solar panel and from said grid-tie, until an event occurs that switches at least one of said slave poles to communicate in the high bandwidth channel.

3. A system as in claim 2, wherein at least one of said slave poles comprises a motion sensor and a camera, and said event comprises said motion sensor becoming activated and said high bandwidth channel is used in turning on said camera and communicating data from said camera.

4. A system as in claim 1, wherein communication between said master pole and said control station is two-way, and communication between said master pole and said slave poles is also two-way, so that said control station is adapted to transmit data to said master pole, and said master pole is adapted to transmit data to said slave poles, wherein said data transmitted to the master pole from the control station and from the master pole to the slave poles is selected from the group consisting of: new programming, firmware upgrades, troubleshooting, repair and system reset.

5. A system as in claim 1, wherein said slave poles and said master pole further house electrical energy storage systems and the outdoor lighting system is adapted to store energy from said flexible solar panels and from the grid through said grid-tie in said storage systems, and the outdoor lighting system is further adapted to provide power from the storage systems to the grid through said grid-tie during at least some peak electrical consumption periods, and to provide power from the storage systems to said outdoor lights during grid-power-outages.

6. A system as in claim 1, adapted for a light-the-way-mode, wherein the slave poles comprise motion sensors and are adapted to sense movement of an object at or near a first and a second of said slave poles, increase lighting of the outdoor lights on said first and second slave poles from a dimmed or off state, determine speed and direction of travel of the object, and transmit data to a third slave pole in the said direction of travel and ahead of the moving object, to cause said third slave pole to increase lighting of an area around said third slave pole from a dimmed or off state.

7. A system as in claim 6, wherein each slave pole is adapted to transmit data to other of said slave poles in a range of at least two poles away, so that a slave pole two poles away from a data-transmitting slave pole receives the transmitted data even in the event that a slave pole immediately adjacent to a data-transmitting slave pole is malfunctioning.

8. A system as in claim 6, wherein all of said slave poles are adapted for said light-the-way-mode so that motion sensors, sensing movement of an object at or near any of said slave poles, increase lighting of the outdoor lights where the object is moving and also increase lighting in the direction of travel and ahead of the moving object.

9. A system as in claim 6, wherein said slave poles are located in a parking lot.

10. A system as in claim 6, wherein the slave poles are installed along a roadway or walkway comprising an intersection, and the slave poles located at or near said intersection are adapted to sense a vehicle or person traveling at or near the intersection, and to increase lighting of the outdoor lights at or near the intersection from a dimmed or off state until the slave poles at or near said intersection sense the direction the vehicle or person is traveling from the intersection, and to then signal a slave pole on a branch of the roadway or walkway beyond the intersection in the direction the vehicle or person is traveling and ahead of the vehicle or person, to increase lighting of said branch from a dimmed or off state.

11. A system as in claim 1, wherein each slave pole is adapted to transmit data to other of said slave poles in a range of at least two poles away, so that a slave pole two poles away from a data-transmitting slave pole receives the transmitted data even in the event that a slave pole immediately adjacent to a data-transmitting slave pole is malfunctioning.

12. A system as in claim 1, further comprising at least one additional slave pole comprising an electrical device selected from the group consisting of: an alarm, a security camera, Wi-Fi hotspot equipment, advertising display, information dissemination display, audible announcement equipment, a motion sensor, a luminosity sensor, a temperature sensor, a humidity sensor, a barometric pressure sensor, and a wind speed sensor;

wherein said at least one additional slave pole further comprises a flexible solar panel wrapped circumferentially around, and attached to, said at least one additional slave pole and adapted to power said electrical device;

wherein said at least one additional slave pole is adapted to receive electrical energy from the grid through the grid-tie to power said electrical device during at least some non-peak electricity consumption hours, and said additional slave pole is adapted to supply electrical energy to the electrical grid during at least some peak electricity consumption hours.

13. A system as in claim 12, wherein said at least one additional slave pole houses an electrical energy storage system, in which is stored energy from the flexible solar panel of said at least one additional slave pole and from the grid through said grid-tie, and which provides power to the grid during at least some peak-consumption hours, and to power said electrical device during grid-power-outages.

14. A system as in claim 1, wherein multiple of the slave poles comprise a security camera and multiple of the slave poles comprise a motion sensor, wherein the system is adapted to determine direction and velocity of a moving vehicle or moving person by means of triangulation of signals from a plurality of the motion sensors, to estimate future direction and location of the moving vehicle or person, and to turn on or wake up at least one security camera ahead of the moving vehicle or person.

* * * * *